US010128285B2

(12) United States Patent
Ooki et al.

(10) Patent No.: US 10,128,285 B2
(45) Date of Patent: Nov. 13, 2018

(54) IMAGING ELEMENT, ELECTRONIC DEVICE, AND INFORMATION PROCESSING DEVICE

(71) Applicant: SONY CORPORATION, Tokyo (JP)

(72) Inventors: Susumu Ooki, Kumamoto (JP); Masashi Nakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 85 days.

(21) Appl. No.: 15/412,884

(22) Filed: Jan. 23, 2017

(65) Prior Publication Data

US 2017/0162618 A1    Jun. 8, 2017

Related U.S. Application Data

(63) Continuation of application No. 14/415,195, filed as application No. PCT/JP2013/069110 on Jul. 12, 2013, now Pat. No. 9,577,012.

(30) Foreign Application Priority Data

Jul. 24, 2012 (JP) .................................. 2012-163678

(51) Int. Cl.
*H01L 27/146* (2006.01)
*H01L 27/30* (2006.01)
*H01L 25/065* (2006.01)

(52) U.S. Cl.
CPC .... *H01L 27/14605* (2013.01); *H01L 25/0657* (2013.01); *H01L 27/1461* (2013.01); *H01L 27/1464* (2013.01); *H01L 27/14621* (2013.01); *H01L 27/14623* (2013.01); *H01L 27/14627* (2013.01); *H01L 27/14636* (2013.01); *H01L 27/14647* (2013.01); *H01L 27/307* (2013.01)

(58) Field of Classification Search
CPC ........... H01L 27/14605; H01L 25/0657; H01L 27/1464; H01L 27/1461; H01L 27/14627; H01L 27/14621; H01L 27/14636; H01L 27/14647; H01L 27/307; H01L 27/14623
USPC ....................................................... 250/208.1
See application file for complete search history.

(56) References Cited

U.S. PATENT DOCUMENTS

| | | | |
|---|---|---|---|
| 9,054,243 B2* | 6/2015 | Sawayama | ........ H01L 27/14629 |
| 2009/0008532 A1 | 1/2009 | Setoguchi | |
| 2010/0044821 A1* | 2/2010 | Noma | ............... H01L 27/14621 |
| | | | 257/435 |
| 2013/0214160 A1 | 8/2013 | Cazaux et al. | |

FOREIGN PATENT DOCUMENTS

| | | |
|---|---|---|
| CN | 102202185 | 9/2011 |
| CN | 102315234 | 1/2012 |
| FR | 2966977 | 5/2012 |
| JP | 2008-071972 | 3/2008 |
| JP | 2008-227290 | 9/2008 |
| JP | 2010-135700 | 6/2010 |

OTHER PUBLICATIONS

Official Action (with English translation) for Chinese Patent Application No. 201380042909.7 dated Nov. 1, 2016, 28 pages.

* cited by examiner

*Primary Examiner* — Seung C Sohn
(74) *Attorney, Agent, or Firm* — Sheridan Ross P.C.

(57) ABSTRACT

The present disclosure relates to an imaging element, an electronic device, and an information processing device capable of more easily providing a wider variety of photoelectric conversion outputs.

20 Claims, 46 Drawing Sheets

1400

FIG. 46
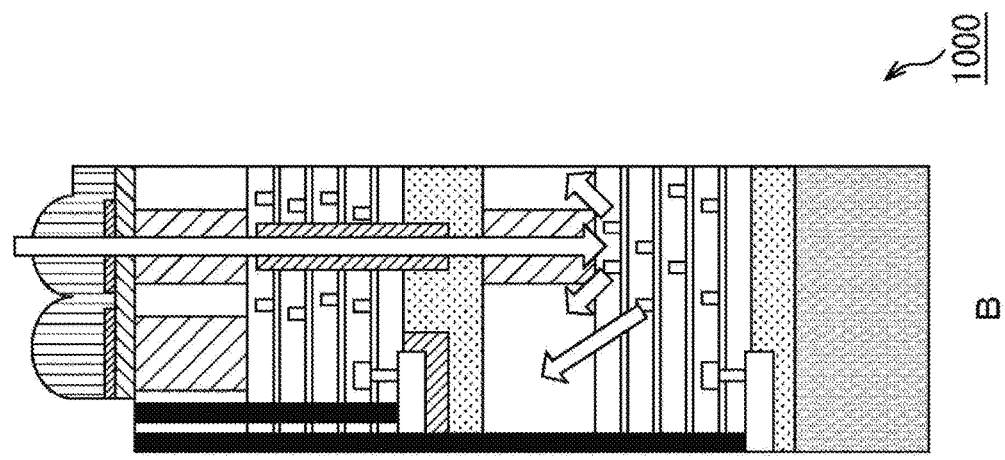
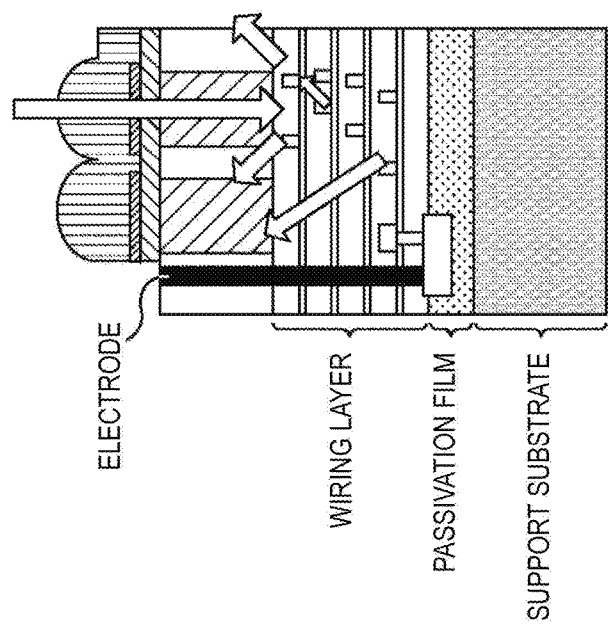
ELECTRODE
WIRING LAYER
PASSIVATION FILM
SUPPORT SUBSTRATE
A
B

IMAGING ELEMENT, ELECTRONIC DEVICE, AND INFORMATION PROCESSING DEVICE

CROSS REFERENCE TO RELATED APPLICATIONS

This application is a continuation of U.S. patent application Ser. No. 14/415,195, filed Jan. 16, 2015, which claims benefit of PCT Application No. PCT/JP2013/069110 having an international filing date of Jul. 12, 2013, which designated the United States, which PCT application claimed the benefit of Japanese Patent Application No. 2012-163678 filed Jul. 24, 2012, the disclosures of which are incorporated herein by reference in their entirety.

TECHNICAL FIELD

The present disclosure relates to an imaging element, an electronic device, and an information processing device, and more particularly to an imaging element, an electronic device, and an information processing device capable of more easily providing a wider variety of photoelectric conversion outputs.

BACKGROUND ART

The penetration length of Infrared light for silicon (Si) is long. Thus, in manufacturing a supersensitive sensor which utilizes near infrared light, a long optical length needs to be formed within silicon. Moreover, photoelectric conversion occurs at a deep position from the silicon surface corresponding to light entrance plane; therefore, a potential for storing electrons needs to be formed at a deep position.

For forming a potential at a deep position, ultra-high energy ion-implantation (ion implantation) is needed according to conventional methods. In this case, development cost and manufacturing cost considerably increase depending on situations. In addition, development of a suitable resist is also demanded, and thus the level of difficult development may further increase.

For overcoming this problem, a method has been developed where ion is implanted from both a front surface and a rear surface of a silicon substrate to form photo diodes located at a deep position and capable of storing sufficient electrons obtained by photoelectric conversion of infrared light (i.e., a method not requiring ultra-high energy ion implantation) (for example, see Patent Document 1).

According to this method, ion is initially implanted from the front surface of the silicon substrate to form a photo diode in the surface of the silicon substrate at a depth equivalent to the depth of an image sensor handling visible light. Then, the silicon substrate is turned over to polish the rear surface of the silicon substrate. Thereafter, ion is implanted from the rear surface of the substrate to form a photo diode at a depth equivalent to the depth of the image sensor handling visible light. This manufacturing method forms a photoelectric conversion area having a doubled depth at the maximum in the depth direction without the necessity of ultra-high energy ion implantation.

The turned over silicon substrate is polished to a necessary film thickness. After ion implantation, the polished silicon substrate is joined with a support substrate for supporting the thickness of the silicon after the polishing. Then, an impurity having been ion-implanted from the rear surface of the silicon substrate is activated by high-temperature activation processing.

CITATION LIST

Patent Document

Patent Document 1: Japanese Patent Application Laid-Open No. 2010-192483

SUMMARY OF THE INVENTION

Problems to be Solved by the Invention

However, the method disclosed in Patent Document 1 only improves the photoelectric conversion efficiency for a long wavelength region. Accordingly, this method does not provide a plurality of photoelectric conversion outputs for one pixel; therefore, it is difficult to be used in a variety of applications. Moreover, in the manufacture using the method described in Patent Document 1, an activation processing needs to be performed for activating the impurity ion-implanted from the rear surface of the silicon substrate so as to avoid breakage of junction between the silicon substrate and the support substrate. This activation processing requires special facilities for performing laser annealing or the like capable of completing thermal processing in a short period and not imposing thermal effect on a junction interface. Accordingly, the manufacturing cost of this method considerably increases.

The present disclosure has been developed to cope with the aforementioned situations. It is an object of the present disclosure to provide a technology capable of offering a result of photoelectric conversion of components in a plurality of different wavelength regions of incident light for one pixel, and more easily providing a wider variety of photoelectric conversion outputs.

Solutions to Problems

An imaging element according to an aspect of the present disclosure includes: a photoelectric conversion element layer containing a photoelectric conversion element that photoelectrically converts incident light; a wiring layer formed in the photoelectric conversion element layer on the side opposite to a light entering plane of the incident light, and containing a wire for reading charges from the photoelectric conversion element; and a support substrate laminated on the photoelectric conversion element layer and the wiring layer, and containing another photoelectric conversion element.

The photoelectric conversion element of the photoelectric conversion element layer, and the photoelectric conversion element of the support substrate may photoelectrically convert components in different wavelength regions of the incident light.

The photoelectric conversion element of the photoelectric conversion element layer may photoelectrically convert components in a visible light wavelength region, and the photoelectric conversion element of the support substrate may photoelectrically convert components in a near infrared light wavelength region.

The thickness of the photoelectric conversion element of the photoelectric conversion element layer may be different from the thickness of the photoelectric conversion element of the support substrate.

The photoelectric conversion element of the photoelectric conversion element layer and the photoelectric conversion element of the support substrate may output charges accumulated by photoelectric conversion of the incident light at the same timing.

The photoelectric conversion element of the photoelectric conversion element layer and the photoelectric conversion element of the support substrate may output charges accumulated by photoelectric conversion of the incident light at different timing.

The photoelectric conversion element of the photoelectric conversion element layer and the photoelectric conversion element of the support substrate may output a synthesis image produced by synthesizing an image obtained in the photoelectric conversion element layer and an image obtained in the support substrate by outputting charges accumulated by photoelectric conversion of the incident light.

The charge accumulation time of the photoelectric conversion element of the photoelectric conversion element layer for accumulating charges produced by photoelectric conversion of the incident light may be different from the corresponding charge accumulation time of the photoelectric conversion element of the support substrate.

The wire of the wiring layer may be disposed in such a position as to secure an optical path of incident light transmitted from one of the sides of the wiring layer to the other side.

A waveguide formed by material having a larger refractive index than the refractive index of the surroundings may be provided on the optical path of the wiring layer.

A light absorber may be provided on the optical path of the wiring layer.

The support substrate may further include a wire formed on the side of the photoelectric conversion element of the support substrate opposite to the light entering plane of the incident light for reading charges from the photoelectric conversion element of the support substrate. An external terminal of the wire of the wiring layer and an external terminal of the wire of the support substrate may be connected with each other by a through via.

When charges read from the photoelectric conversion element of the photoelectric conversion element layer exceed a predetermined threshold, charges may be read from the photoelectric conversion element of the support substrate.

Each of the photoelectric conversion elements may include an organic photoelectric conversion film.

A white color filter may be further included. The photoelectric conversion element of the photoelectric conversion element layer may photoelectrically convert a white component of the incident light having passed through the white color filter. The photoelectric conversion element of the support substrate may photoelectrically convert other color components.

Depth information showing a depth to a target may be obtained using infrared light photoelectrically converted by the photoelectric conversion elements.

It may be controlled whether data on the incident light photoelectrically converted by the photoelectric conversion element of the photoelectric conversion element layer and the photoelectric conversion element of the support substrate is individually output or output after addition of the data.

The support substrate may include: a photoelectric conversion element layer containing the photoelectric conversion element of the support substrate; a wiring layer formed in the photoelectric conversion element layer of the support substrate on the side opposite to a light entering plane of the incident light, and containing a wire for reading charges from the photoelectric conversion element of the support substrate; and a support substrate laminated on the photoelectric conversion element layer and the wiring layer, and containing another photoelectric conversion element.

An electronic device according to another aspect of the present disclosure include: an imaging element that images a subject and includes a photoelectric conversion element layer containing a photoelectric conversion element that photoelectrically converts incident light, a wiring layer formed in the photoelectric conversion element layer on the side opposite to a light entering plane of the incident light, and containing a wire for reading charges from the photoelectric conversion element, and a support substrate laminated on the photoelectric conversion element layer and the wiring layer, and containing another photoelectric conversion element; and an image processing unit that executes image processing using signals generated by the photoelectric conversion elements of the imaging element.

An information processing device according to a further aspect of the present disclosure include: an imaging element that includes a photoelectric conversion element layer containing a photoelectric conversion element that photoelectrically converts incident light, a wiring layer formed in the photoelectric conversion element layer on the side opposite to a light entering plane of the incident light, and containing a wire for reading charges from the photoelectric conversion element, and a support substrate laminated on the photoelectric conversion element layer and the wiring layer, and containing another photoelectric conversion element; and a signal processing unit that executes analysis using signals in a plurality of wavelength bands generated by the photoelectric conversion elements of the imaging element.

According to an aspect of the present disclosure, there are provided a photoelectric conversion element layer containing a photoelectric conversion element that photoelectrically converts incident light, a wiring layer formed in the photoelectric conversion element layer on the side opposite to a light entering plane of the incident light, and containing a wire for reading charges from the photoelectric conversion element, and a support substrate laminated on the photoelectric conversion element layer and the wiring layer, and containing another photoelectric conversion element.

According to another aspect of the present disclosure, there are provided an imaging element that images a subject and includes a photoelectric conversion element layer containing a photoelectric conversion element that photoelectrically converts incident light, a wiring layer formed in the photoelectric conversion element layer on the side opposite to a light entering plane of the incident light, and containing a wire for reading charges from the photoelectric conversion element, and a support substrate laminated on the photoelectric conversion element layer and the wiring layer, and containing another photoelectric conversion element, and an image processing unit that executes image processing using signals generated by the photoelectric conversion elements of the imaging element.

According to a further aspect of the present disclosure, an information processing device includes: an imaging element that includes a photoelectric conversion element layer containing a photoelectric conversion element that photoelectrically converts incident light, a wiring layer formed in the photoelectric conversion element layer on the side opposite to a light entering plane of the incident light, and containing a wire for reading charges from the photoelectric conversion element, and a support substrate laminated on the photoelectric conversion element layer and the wiring layer, and containing another photoelectric conversion element; and a signal processing unit that executes analysis using signals in a plurality of wavelength bands generated by the photoelectric conversion elements of the imaging element.

Effects of the Invention

According to the present disclosure, incident light is photoelectrically converted. Particularly, a wider variety of photoelectric conversion outputs are more easily provided.

BRIEF DESCRIPTION OF DRAWINGS

FIG. 46 is a figure illustrating an example of reflection of incident light.

MODE FOR CARRYING OUT THE INVENTION

Embodiments for carrying out the present technology (hereinafter referred to as embodiments) are hereinafter described. The description will be presented in the following order.

1. First Embodiment (imaging element: rear surface type+ front surface type)

2. Second Embodiment (manufacturing device and method)

3. Third Embodiment (application example 1: waveguide)

4. Fourth Embodiment (application example 2: pupil correction)

5. Fifth Embodiment (application example 3: PD pitch change)

6. Sixth Embodiment (application example 4: visible light+visible light)

7. Seventh Embodiment (application example 5: rear surface type+rear surface type)

8. Eighth Embodiment (imaging device)

9. Ninth Embodiment (various application examples)

1. First Embodiment

[Conventional Imaging Element]

Figure 1:
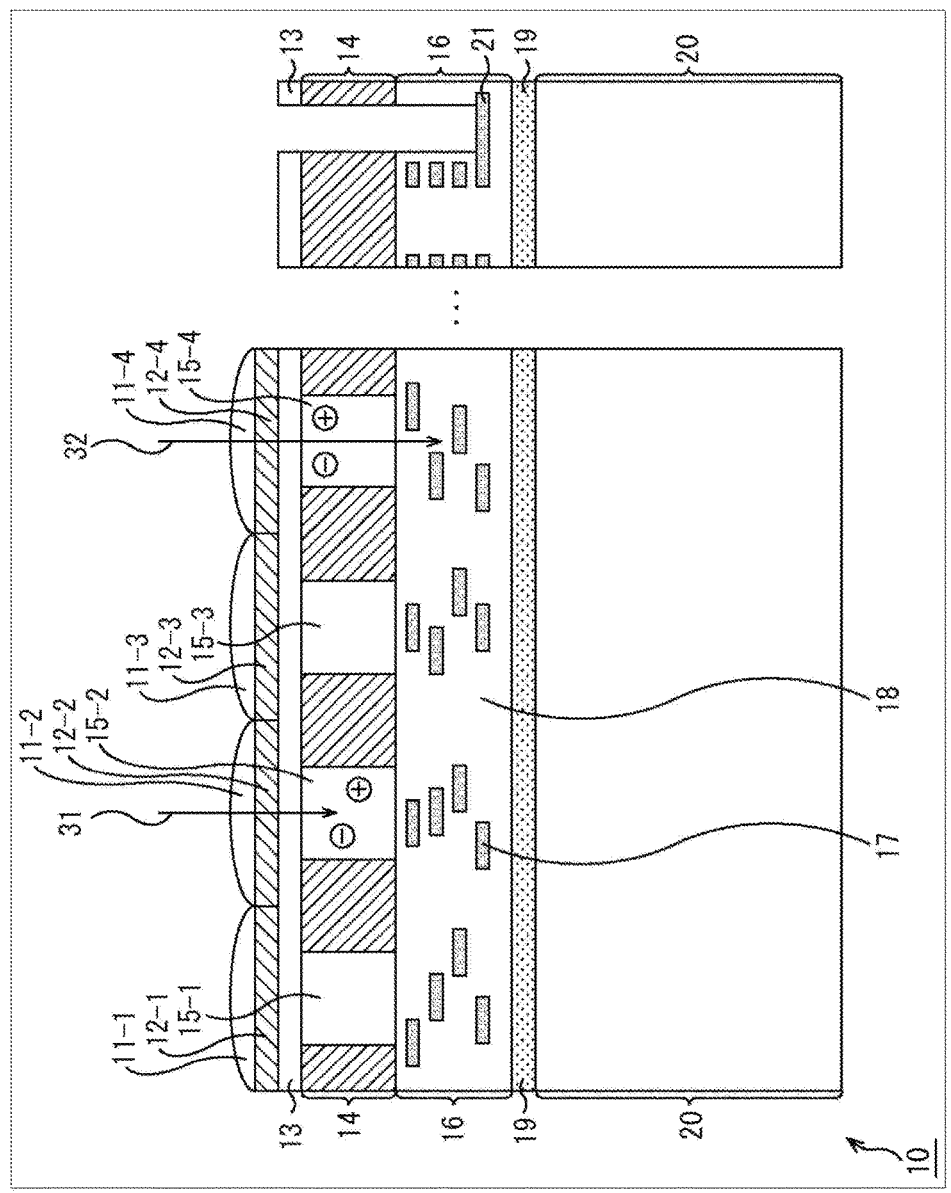
FIG. 1 is a figure illustrating an example of a chief configuration of a conventional CMOS image sensor.

Initially, a configuration example of a conventional imaging element is discussed. FIG. 1 is a figure illustrating an example of a chief configuration of a conventional CMOS (Complementary Metal Oxide Semiconductor) image sensor. A CMOS image sensor 10 illustrated in FIG. 1 is a rear surface irradiation type image sensor including CMOS and provided with an amplifier for each unit cell.

FIG. 1 illustrates a schematic structure of the CMOS image sensor 10 in the vertical direction (lamination direction) (schematic view of cross section). As illustrated in FIG. 1, the CMOS image sensor 10 includes a condensing lens 11, a color filter 12, and a photo diode (Photo Diode) 15 for each pixel.

FIG. 1 shows four pixels as an effective pixel area of the CMOS image sensor 10. Photo diode 15-1 to photo diode 15-4 are provided in a semiconductor substrate 14 as components of the four pixels. The photo diodes 15-1 to 15-4 are collectively referred to as photo diodes 15 when distinction between the respective photo diodes is not needed in this description.

A condensing lens 11-1 and a color filter 12-1 are provided for the photo diode 15-1. A condensing lens 11-2 and a color filter 12-2 are provided for the photo diode 15-2. A condensing lens 11-3 and a color filter 12-3 are provided for the photo diode 15-3. A condensing lens 11-4 and a color filter 12-4 are provided for the photo diode 15-4. The respective condensing lenses are collectively referred to as condensing lenses 11 when distinction between the respective condensing lenses is not needed in this description. The respective color filters are collectively referred to as color filters 12 when distinction between the respective color filters is not needed in this description.

As illustrated in FIG. 1, an insulation film 13 is formed on the rear surface side of the semiconductor substrate 14 corresponding to a light entrance plane of the semiconductor substrate 14. The color filters 12 and the condensing lenses 11 are provided on the insulation film 13.

On the other hand, a wiring layer 16, a passivation film 19, and a support substrate 20 are formed on the front surface side of the semiconductor substrate 14 opposed to the light entrance plane of the semiconductor substrate 14. The wiring layer 16 includes wires 17 and a wire interlayer film 18.

A pad 21 for connecting with a circuit outside the CMOS image sensor 10 is provided in the wiring layer in an area out of the effective pixel area of the CMOS image sensor 10.

When visible light 31 enters the condensing lens 11-2 of the CMOS image sensor 10 thus constructed, for example, the visible light 31 passes through the condensing lens 11-2, the color filter 12-2, and the insulation film 13, and reaches the photo diode 15-2 to be photoelectrically converted with high efficiency by the photo diode 15-2.

On the other hand, near infrared light 32 has a longer wavelength than the wavelength of the visible light 31. In this case, the penetration length of the near infrared light 32 for silicon (semiconductor substrate 14) becomes longer than the penetration length of the visible light 31; therefore, such potential distribution is needed which collects electrons photoelectrically converted at a position deeper than the position of the visible light 31.

However, according to the rear surface irradiation type such as the CMOS image sensor 10 illustrated in FIG. 1, the film thickness of the semiconductor substrate 14 generally needs to decrease to a range from about 2 μm to about 3 μm to reduce generation of color mixture. In this case, it may become difficult for the photo diode 15-4 to achieve efficient photoelectric conversion of the near infrared light 32 having passed through the condensing lens 11-4, the color filter 12-4, and the insulation film 13 and entered the photo diode 15-4. In other words, it may become difficult for the rear surface irradiation type CMOS image sensor 10 to obtain sufficient sensitivity to the near infrared light 32.

For increasing the sensitivity particularly in the long wavelength region, the method described in Patent Document 1 has been developed. According to this method, however, a plurality of photoelectric conversion outputs for one pixel are difficult to obtain; therefore, application of this method to a wide variety of purposes is difficult. In addition, the method described in Patent Document 1 performs ion-implantation (ion implantation) from both surfaces of the semiconductor substrate, and thus requires special facilities for executing laser annealing or other processes capable of completing thermal processing in a short period. Moreover, the possibility of color mixture still exists.

In case of a front surface irradiation type image sensor, the thickness of the silicon substrate may be large. However, for forming a potential at a position sufficiently deep for efficient photoelectric conversion of near infrared light, ultra-high energy ion implantation is required.

[Imaging Element of Present Technology]

Accordingly, discussed in the present disclosure is an imaging element capable of achieving photo-electric conversion of components in a plurality of different wavelength regions of incident light for one pixel, such as visible light and near infrared light discussed above.

Figure 2:
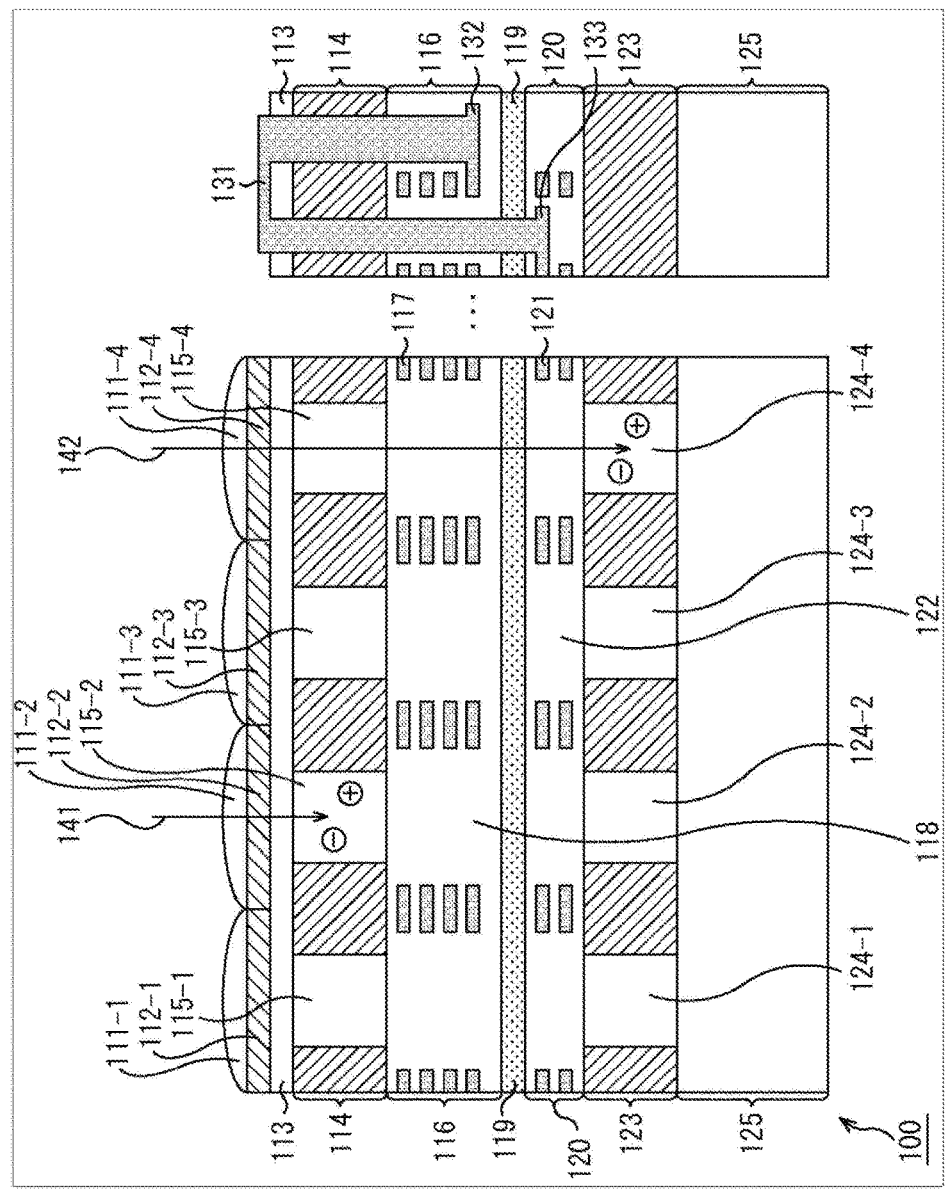
FIG. 2 is a figure illustrating an example of a chief configuration of a CMOS image sensor according to the present technology.

FIG. 2 illustrates a configuration example of a CMOS image sensor to which the present technology is applied. A CMOS image sensor 100 illustrated in FIG. 2 is an image sensor equipped with CMOS similarly to the CMOS image sensor 10 illustrated in FIG. 1.

FIG. 2 shows a schematic structure of the CMOS image sensor 100 in the vertical direction (lamination direction) (schematic view of cross section). As illustrated in FIG. 2, light enters the CMOS image sensor 100 in the direction substantially from above to below in the figure. The CMOS image sensor 100 has multilayer structure in the traveling direction of the incident light. In other words, light having entered the CMOS image sensor 100 passes through the respective layers while traveling.

FIG. 2 shows four pixels corresponding to an effective pixel area of the CMOS image sensor 100. More specifically, photo diodes 115-1 to 115-4 are formed in a semiconductor substrate 114 as components constituting the four pixels. A condensing lens 111-1 and a color filter 112-1 are formed as components constituting the pixel for the photo diode 115-1. A condensing lens 111-2 and a color filter 112-2 are formed as components constituting the pixel for the photo diode 115-2. A condensing lens 111-3 and a color filter 112-3 are formed as components constituting the pixel for the photo diode 115-3. A condensing lens 111-4 and a color filter 112-4 are formed as components constituting the pixel for the photo diode 115-4.

The respective photo diodes are collectively referred to as photo diodes 115 when distinction between the respective photo diodes is not needed. The respective condensing lenses are collectively referred to as condensing lenses 111 when distinction between the respective condensing lenses is not needed. The respective color filters are collectively referred to as color filters 112 when distinction between the respective color filters is not needed.

Layers above a passivation film 119 of the CMOS image sensor 100 in the figure have a configuration similar to the corresponding configuration of the CMOS image sensor 10 illustrated in FIG. 1. More specifically, layers formed on the upper side with respect to the passivation film 119 in the figure are the condensing lens 111, the color filter 112, an insulation film 113, the semiconductor substrate 114 (containing photo diodes 115), a wiring layer 116 (containing wires 117 and the wire interlayer film 118), and the passivation film 119 in this order from above in the figure.

The condensing lenses 111 condense light having entered an imaging surface onto the corresponding photo diodes 115 to increase quantum efficiency of the photo diodes 115.

The color filters 112 transmit the incident light having entered via the corresponding condensing lenses 111 to supply components in predetermined wavelength (color) regions of the incident light to the corresponding photo diodes 115. The wavelength (color) regions transmitted by the respective color filters 112 are arbitrarily determined, such as visible light, infrared light, and ultraviolet light. In addition, the color filters 112 may be filters each transmitting the same wavelength (color) region, or a plurality of types of filters transmitting different wavelength (color) regions such as RGB, and visible light and infrared light.

When the color filters 112 are constituted by the plural types of filters, the filters for the respective wavelength (color) regions may be arranged in a predetermined order such as Bayer array. For example, the color filter 112-1 and the color filter 112-3 in FIG. 2 may be filters transmitting red (R), while the color filter 112-2 and the color filter 112-4 may be filters transmitting green (G (Gr)). Alternatively, the color filter 112-1 and the color filter 112-3 in FIG. 2 may be filters transmitting green (G (Gb)), for example, while the color filter 112-2 and the color filter 112-4 may be filters transmitting blue (B).

The photo diodes 115 formed in the semiconductor substrate 114 chiefly achieve efficient photoelectric conversion of components in the visible light wavelength region similarly to the example shown in FIG. 1. More specifically, each of the photo diodes 115 has potential distribution for storing photoelectrically converted electrons at a depth appropriate for components in the visible light wavelength region contained in the incident light. For example, visible light 141 is transmitted through the condensing lens 111-2, the color filter 112-2, and the insulation film 113, and is photoelectrically converted by the photo diode 115-2 with high efficiency.

The film thickness of the semiconductor substrate 114 is arbitrarily determined. For example, the film thickness of the semiconductor substrate 114 may be in a range from about 2 μm to about 3 μm to avoid generation of color mixture.

The wires 117 of the wiring layer 116 are made of aluminum (AL) or same (Cu), for example. While only a piece is indicated as the wire 117 in FIG. 2, all squares in gray contained in the wiring layer 116 in FIG. 2 are the wires 117. While the wires 117 have four-layer structure in the wiring layer 116 in the example in FIG. 2, the number of layers of the wires may be arbitrarily determined.

Unlike the CMOS image sensor 10 illustrated in FIG. 1, the CMOS image sensor 100 further includes a wiring layer 120, a semiconductor substrate 123, and a support substrate 125 below the passivation film 119 in the figure as illustrated in FIG. 2.

The wiring layer 120 is basically identical to the wiring layer 116. The wiring layer 120 includes wires 121 and a wire interlayer film 122. While only a piece is indicated as the wire 121 in FIG. 2, all squares in gray contained in the wiring layer 120 in FIG. 2 are the wires 121. While the wires 121 have two-layer structure in the wiring layer 120 according to the example in FIG. 2, the number of layers of the wires may be arbitrarily determined.

A pad 132 is provided in an area of the wiring layer 116 out of the effective pixel area of the CMOS image sensor 100. The pad 132 corresponds to an external electrode of a circuit for the wiring layer 116. A pad 133 is provided in an area of the wiring layer 120 out of the effective pixel area of the CMOS image sensor 10. The pad 133 corresponds to an external electrode of a circuit for the wiring layer 120. The pad 132 and the pad 133 are connected with a TSV (Through-Silicon Via) 131 (so-called through via). In other words, the circuit for the wiring layer 116 and the circuit for the wiring layer 120 are connected. The number of TSV 131 may be arbitrarily determined. Though not shown in the figure, pads (external electrodes) connected with circuits outside the CMOS image sensor 100 are provided in the wiring layer 116 and the wiring layer 120 in an area out of the effective pixel area of the CMOS image sensor 100 other than electrodes connected with each other via the TSV 131 such as the pad 132 and the pad 133.

The semiconductor substrate 123 is a layer basically identical to the semiconductor substrate 114. A photo diode 124-1 is formed in the semiconductor substrate 123 as a component constituting the pixel for the photo diode 115-1. A photo diode 124-2 is formed in the semiconductor substrate 123 as a component constituting the pixel for the photo diode 115-2. A photo diode 124-3 is formed in the semiconductor substrate 123 as a component constituting the pixel for the photo diode 115-3. A photo diode 124-4 is formed in the semiconductor substrate 123 as a component constituting the pixel for the photo diode 115-4. The photo diodes 124-1 to 124-4 are collectively referred to as photo diodes 124 when distinction between the respective photo diodes is not needed.

Incident light having passed through the photo diodes 115 (incident light not photoelectrically converted by the photo diodes 115) enters the semiconductor substrate 123 (photo diodes 124) via the wiring layer 116, the passivation film 119, and the wiring layer 120. The wires 117 and the wires 121 in the wiring layer 116 and the wiring layer 120 are disposed in such positions as to secure the optical path of the incident light. For example, the wires 117 and the wires 121 may be disposed only in areas below hatched portions of the semiconductor substrate 114 (portions not containing the photo diodes 115), and only in areas above hatched portions of the semiconductor substrate 123 (portions not containing the photo diodes 124) as illustrated in FIG. 2. In other words, this positioning allows the use of the wires 117 and the wires 121 as light shielding walls surrounding the optical path. In this case, the incident light is easily reflected by the wires 117 and the wires 121; therefore, leakage of the incident light from the optical path to the outside is prevented. Accordingly, the efficiency of photoelectric conversion increases, and generation of color mixture decreases.

The photo diodes 124 are disposed at positions (depths) appropriate for photoelectric conversion of components in the near infrared wavelength region, and achieve efficient photoelectric conversion of components in the near infrared wavelength region contained in the incident light having entered the photo diodes 124 without photoelectric conversion by the photo diodes 115. For example, near infrared light 142 is transmitted through the condensing lens 111-4, the color filter 112-4, the insulation film 113, the photo diode 115-4, the wiring layer 116, the passivation film 119, and the wiring layer 120, and photoelectrically converted by the photo diode 124-4 with high efficiency.

As discussed above, the CMOS image sensor 100 has multilayer structure in the traveling direction of incident light, and includes double layers (semiconductor substrate 114 and semiconductor substrate 123) of photo diodes (photoelectric conversion elements) between which wiring layers (wiring layer 116 and wiring layer 120) are sandwiched.

This configuration of the CMOS image sensor 100 allows efficient photoelectric conversion of components in both the visible light and near infrared light wavelength regions (i.e., components in plural different wavelength regions) for one pixel by using the photo diodes 115 and the photo diodes 124. In other words, the depth of the photo diodes 124 is easily determined by adjustment of the thicknesses of the wiring layer 116 and wiring layer 120) sandwiched between the photo diodes 115 and the photo diodes 124 which are easily adjustable in thickness. Accordingly, the efficiency of photoelectric conversion more easily improves in a plurality of arbitrary wavelength regions.

A part or all of the pixels included in the CMOS image sensor 100 are constructed as above. Accordingly, the CMOS image sensor 100 forms (high-quality) visible light images and (high-quality) near infrared light images without decreasing the number of pixels and the pixel size, i.e., while preventing deterioration of image quality. The CMOS image sensor 100 forms visible light images having at least image quality equivalent to the image quality of the CMOS image sensor 10 illustrated in FIG. 1, and further forms near infrared light images.

The CMOS image sensor 100 forms both visible light images and near infrared light images by using the double-layered photo diodes (photo diodes 115 and photo diodes 124). Accordingly, the CMOS image sensor 100 is allowed to simultaneously form visible light images and near infrared light images (to form both images at the same timing). There is a case where infrared light images and visible light images formed at the same timing are desired such as a process executed using both the images. For example, there is a process in which an image correcting method is determined using infrared light images, and visible light images is corrected using the determined image correcting method. Needless to say, there is also a case where both the images formed at different timing are desired. The CMOS image sensor 100 is allowed to form visible light images and near infrared light images at different timing.

Moreover, the CMOS image sensor 100 forms high-quality infrared light images by synthesizing images obtained by the photo diodes 115 and images obtained by the photo diodes 124. Accordingly, such a near infrared sensor is realizable which has an extended effective optical path length.

At least a part of the wires 117 and the wires 121 may correspond to wires of circuits for reading charges from at least either the photo diodes 115 or the photo diodes 124. For example, at least a part of the wires 117 of the wiring layer 116 may correspond to wires of circuits for reading charges from the photo diodes 115, while at least a part of the wires 121 of the wiring layer 120 may correspond to wires of circuits for reading charges from the photo diodes 124. In this case, the respective circuits may be independent from each other.

According to this structure, the condensing lenses 111 through the passivation film 119 in FIG. 2 form a rear surface irradiation type CMOS image sensor, while the wiring layer 120 through the support substrate 125 form a front surface irradiation type CMOS image sensor. The rear surface irradiation type CMOS image sensor and the front surface irradiation type CMOS image sensor are independent from each other. In this case, the CMOS image sensor 100 includes the two independent CMOS image sensors overlapping with each other and connecting with each other.

The CMOS image sensor 100 thus constructed forms high-quality visible light images by photoelectric conversion of components in the visible light wavelength region of incident light using the rear surface irradiation type CMOS image sensor. On the other hand, the CMOS image sensor 100 forms high-quality near infrared light images by photoelectric conversion of components in the near infrared light wavelength region of incident light using the front surface irradiation type CMOS image sensor.

Moreover, the CMOS image sensors overlapped as components of the CMOS image sensor 100 may operate independently from each other. Accordingly, the CMOS image sensor 100 is allowed to simultaneously form visible light images and near infrared light images (to form images at the same timing), and form visible light images and near infrared light images at different timing with ease, for example. In addition, switching control is easily achievable.

For example, for forming visible light images and near infrared light images at the same time, charges accumulated by photoelectric conversion of incident light using the photo diodes 115 and charges accumulated by photoelectric conversion of incident light using the photo diodes 124 are output at the same timing. On the other hand, for forming visible light images and near infrared light images at different timing, for example, charges accumulated in the photo diodes 115 and charges accumulated in the photo diodes 124 are output at different timing.

Accordingly, the CMOS image sensor 100 provides a wider variety of photoelectric conversion outputs more easily.

2. Second Embodiment

[Manufacturing Device]

As discussed above, the CMOS image sensor 100 illustrated in FIG. 2 may be so configured that the condensing lenses 111 through the passivation film 119 constitute the rear surface irradiation type CMOS image sensor, and that the wiring layer 120 through the support substrate 125 constitute the front surface irradiation type CMOS image sensor.

Assuming that the respective CMOS image sensors are independent from each other, the CMOS image sensor 100 may be manufactured by separately producing the rear surface irradiation type CMOS image sensor and the front surface irradiation type CMOS image sensor, overlapping the front surface irradiation type CMOS image sensor on the front surface side of the produced rear surface irradiation type CMOS image sensor, and connecting both the CMOS image sensors via the TSV 131.

Figure 3:
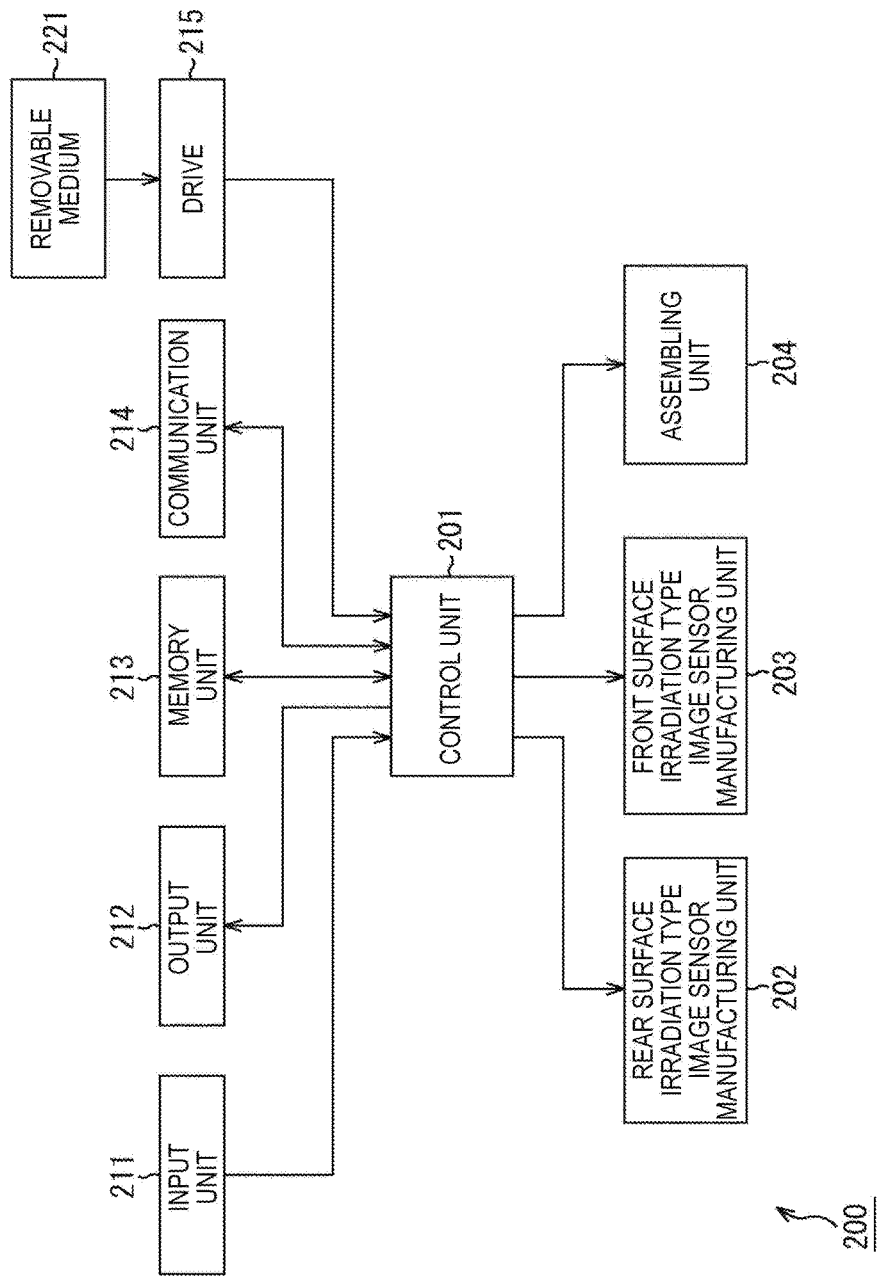
FIG. 3 is a block diagram illustrating an example of a chief configuration of a manufacturing device according to the present technology.

FIG. 3 is a block diagram illustrating an example of a chief configuration of a manufacturing device to which the present technology is applied. A manufacturing device 200 illustrated in FIG. 3 is a device which manufactures the CMOS image sensor 100.

As illustrated in FIG. 3, the manufacturing device 200 includes a control unit 201, a rear surface irradiation type image sensor manufacturing unit 202, a front surface irradiation type image sensor manufacturing unit 203, and an assembling unit 204. The manufacturing device 200 further includes an input unit 211, an output unit 212, a memory unit 213, a communication unit 214, and a drive 215.

The control unit 201 includes a CPU (Central Processing Unit), a ROM (Read Only Memory), and a RAM (Random Access Memory), and others. The control unit 201 controls respective other units, and executes processes associated with manufacture of the CMOS image sensor 100. For example, the CPU of the control unit 201 executes various types of processes under programs stored in the ROM. Moreover, the CPU executes various types of processes under programs loaded from the memory unit 213 to the RAM. The RAM also stores data required for execution of the various types of processes by the CPU as necessary, for example.

The control unit 201 connects to the input unit 211 constituted by a keyboard, a mouse, a touch panel and others. The control unit 201 further connects to the output unit 212 constituted by a display such as a CRT (Cathode Ray Tube) display and an LCD (Liquid Crystal Display), a speaker and others. The control unit 201 further connects to the memory unit 213 constituted by an SSD (Solid State Drive) such as a flash memory, and a hard disk. The control unit 201 further connects to the communication unit 214 constituted by interfaces of a wired LAN (Local Area Network) and a wireless LAN, a modem and others. The communication unit 214 executes communication processes via networks including the Internet.

The control unit 201 further connects to the drive 215 as necessary so that a removable medium 221 such as a magnetic disk, an optical disk, a magneto-optical disk, a semiconductor memory or the like is attachable to the drive 215. Computer programs read from the removable medium 221 via the drive 215 are installed in the memory unit 213 as necessary.

The rear surface irradiation type image sensor manufacturing unit 202 manufactures a rear irradiation type CMOS image sensor under the control by the control unit 201. In other words, the rear surface irradiation type image sensor manufacturing unit 202 produces the condensing lenses 111 to the passivation film 119 of the CMOS image sensor 100. This manufacturing method may be an arbitrary method. For example, the rear surface irradiation type image sensor manufacturing unit 202 manufactures the rear surface irradiation type CMOS image sensor by a method similar to a conventional method.

The front surface irradiation type image sensor manufacturing unit 203 manufactures a front irradiation type CMOS image sensor under the control by the control unit 201. In other words, the front surface irradiation type image sensor manufacturing unit 203 produces the wiring layer 120 to the support substrate 125 of the CMOS image sensor 100. This manufacturing method may be an arbitrary method. For example, the front surface irradiation type image sensor manufacturing unit 203 manufactures the front surface irradiation type CMOS image sensor by a method similar to a conventional method.

The assembling unit 204 assembles the CMOS image sensor 100 under the control by the control unit 201. In this case, the assembling unit 204 connects the rear surface irradiation type CMOS image sensor manufactured by the rear surface irradiation type image sensor manufacturing unit 202 and the front surface irradiation type CMOS image sensor manufactured by the front surface irradiation type image sensor manufacturing unit 203. More specifically, the assembling unit 204 overlaps the front surface irradiation type CMOS image sensor on the front surface side of the rear surface irradiation type CMOS image sensor, and connects the pads of both the CMOS image sensors via the TSV 131.

[Flow of Manufacturing Method]

Figure 4:
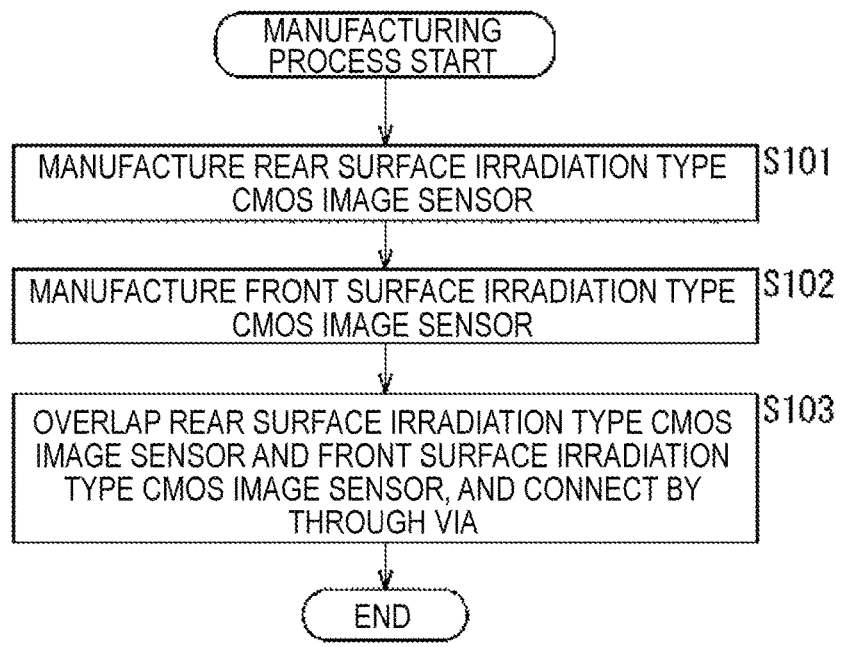
FIG. 4 is a flowchart showing a flow example of a manufacturing process.

A flow example of a manufacturing process is now described with reference to a flowchart shown in FIG. 4.

When manufacturing the CMOS image sensor 100 by using the manufacturing device 200, the control unit 201 executes the manufacturing process.

After the start of the manufacturing process, the control unit 201 allows the rear surface irradiation type image sensor manufacturing unit 202 to manufacture a rear surface irradiation type CMOS image sensor in step S101.

In step S102, the control unit 201 allows the front surface irradiation type image sensor manufacturing unit 203 to manufacture a front surface irradiation type CMOS image sensor.

In step S103, the control unit 201 allows the assembling unit 204 to assemble the CMOS image sensor 100. More specifically, the assembling unit 204 overlaps the front surface irradiation type CMOS image sensor manufactured by the process in step S102 on the front surface side of the rear surface irradiation type CMOS image sensor manufacture by the process in step S101 under the control by the control unit 201. Then, the assembling unit 204 connects the pads of these CMOS image sensors by a through via (TSV) under the control by the control unit 201.

After completion of the process in step S103, the control unit 201 ends the manufacturing process.

According to the foregoing manufacturing method, the manufacturing device 200 more easily manufactures the CMOS image sensor 100 without the necessity of ultra-high energy ion implantation, or special processes or facilities required by laser annealing or the like. In other words, such an imaging element is more easily realizable which can more easily provide a wider variety of photoelectric conversion outputs.

3. Third Embodiment

[Imaging Element]

The CMOS image sensor 100 may have arbitrary configurations as long as a large amount of light having passed through the photo diodes 115 travels through the wiring layer 116 and the wiring layer 120 (between the respective wires of the wiring layers 116 and 120) and reach the photo diodes 124. In other words, the positions of the respective wires 117 of the wiring layer 116 and the positions of the respective wires 121 of the wiring layer 120 are arbitrarily determined as long as the optical path of incident light is secured from the diodes 115 to the photo diodes 124. For example, the wires 117 and the wires 121 may be positioned below the photo diodes 115 or above the photo diodes 124.

Figure 5:
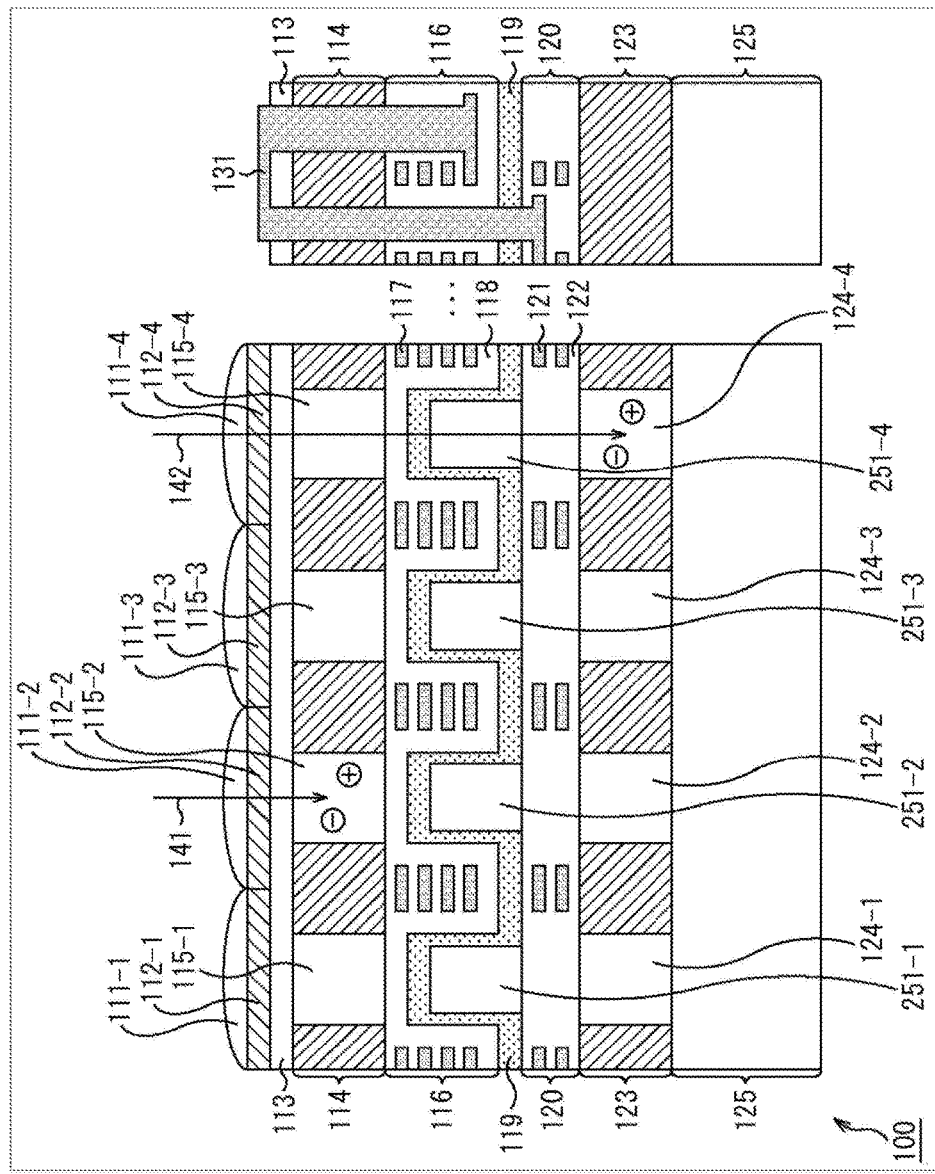
FIG. 5 is a figure illustrating another configuration example of the CMOS image sensor according to the present technology.

In addition, waveguides may be formed in the wiring layer 116, for example. FIG. 5 is a figure illustrating a configuration example of the CMOS image sensor 100 thus constructed. According to the example illustrated in FIG. 5, a waveguide 251-1 is formed in the wiring layer 116 of the CMOS image sensor 100 in an area substantially below the photo diode 115-1. A waveguide 251-2 is further formed in the wiring layer 116 in an area substantially below the photo diode 115-2. A waveguide 251-3 is further formed in the wiring layer 116 in an area substantially below the photo diode 115-3. A waveguide 251-4 is further formed in the wiring layer 116 in an area substantially below the photo diode 115-4. The waveguides 251-1 to 251-4 are collectively referred to as waveguides 251 when no distinction between the respective waveguides 251-1 to 251-4 is needed.

The waveguides 251 are constituted by predetermined waveguide material made of material having a larger refractive index than that of the surroundings, for example. Other configurations are similar to the corresponding configurations in FIG. 2.

The waveguides 251 are formed during production of the rear surface irradiation type CMOS image sensor. For example, holes are formed in the wiring layer 116 in areas substantially below the photo diodes 115 (between the wires 117) in the direction from below to above in the figure. Then, the passivation film 119 is formed on the front surface side (lower surface in the figure) of the rear surface irradiation type CMOS image sensor containing the holes. Thereafter, the waveguides 251 are formed in the respective holes of the wiring layer 116.

As illustrated in FIG. 5, incident light having passed through the photo diodes 115 reach the photo diodes 124 via the waveguides 251. In this case, the CMOS image sensor 100 more efficiently supplies the near infrared light 142 corresponding to components in the near infrared light wavelength region contained in the incident light to the photo diodes 124 by waveguide effect of the waveguides 251. Accordingly, the sensitivity of the photo diodes 124 improves.

The waveguides may be formed in the wiring layer 120. Alternatively, the waveguides may be formed in both the wiring layer 116 and the wiring layer 120. In either of the cases, the sensitivity of the photo diodes 124 improves as discussed above. The material of the waveguides may be arbitrarily determined.

The CMOS image sensor 100 described in this embodiment may be manufactured by a method similar to the method discussed in the second embodiment. More specifically, the control unit 201 may allow the rear surface irradiation type image sensor manufacturing unit 202 to form the foregoing waveguides in the wiring layer 116 at the time of manufacture of the rear surface irradiation type CMOS image sensor (step S101). The waveguides may be formed by a method similar to a conventional method.

When forming the waveguides in the wiring layer 120, the control unit 201 may allow the front surface irradiation type image sensor manufacturing unit 203 to form the foregoing waveguides in the wiring layer 120 at the time of manufacture of the front surface irradiation type CMOS image sensor (step S102). In this case, the waveguides may also be formed by a method similar to a conventional method.

When forming the waveguides in both the wiring layer 116 and the wiring layer 120, the control unit 201 allows both the rear surface irradiation type image sensor manufacturing unit 202 and the front surface irradiation type image sensor manufacturing unit 203 to form the waveguides in the respective wiring layers.

Accordingly, the manufacturing device 200 more easily manufactures the CMOS image sensor 100 in this embodiment similarly to the above embodiments.

4. Fourth Embodiment

[Imaging Element]

The positions of the components for the respective pixels are not limited to the foregoing examples. Position correction (pupil correction) may be executed in accordance with incident angles of incident light, for example.

In general, incident light entering an imaging element is affected by a lens or the like. Incident light enters pixels in the vicinity of the center substantially at right angles, and enters pixels in the peripheral area at a predetermined angle (incident angle $\theta$) to the center direction.

In case of the CMOS image sensor 100 illustrated in FIGS. 2 and 5, the optical path of incident light is formed in the vertical direction in the figures. This optical path is optimized for the incident light entering substantially at right angles, but is not necessarily optimized for light entering at a predetermined angle. In this case, the light condensing rate of the photo diodes 115 and the photo diodes 124 may lower.

Figure 6:
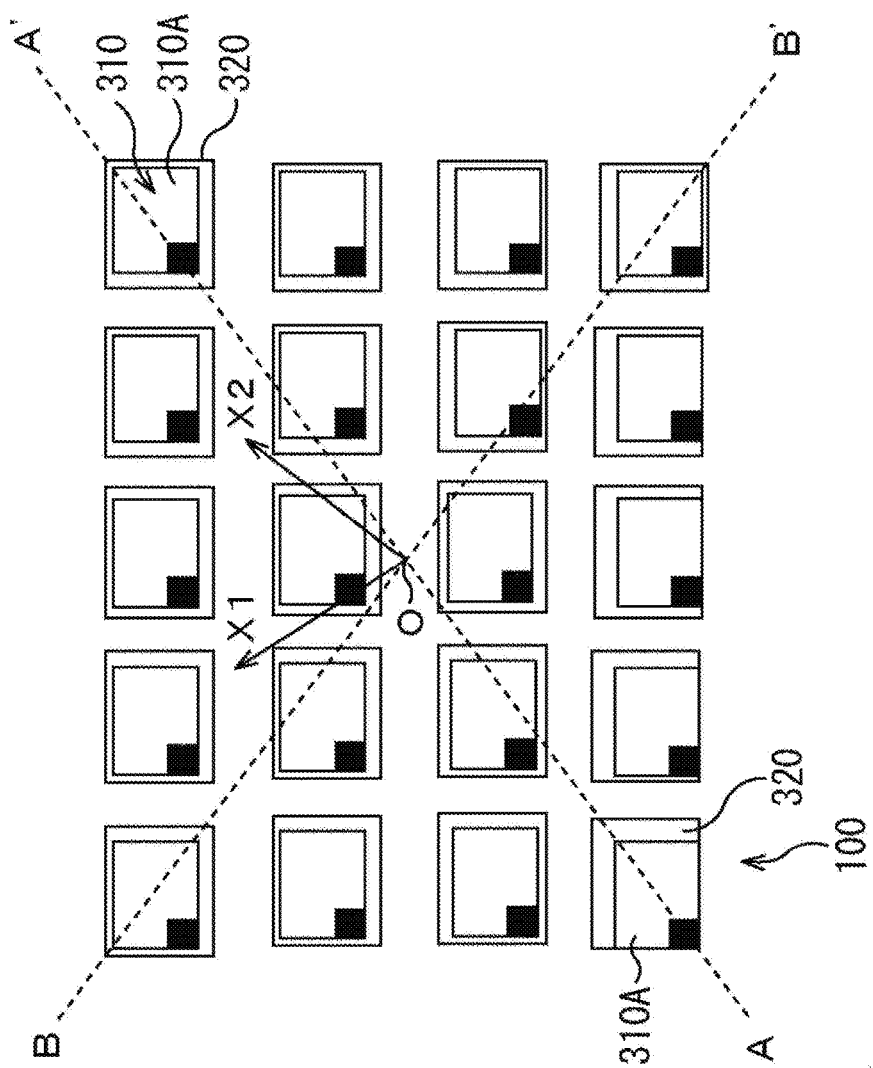
FIG. 6 is a figure illustrating an example of pupil correction.

Accordingly, the positions of the respective components for the respective pixels may be corrected (disposed at appropriate positions) in accordance with the incident angle $\theta$ of the incident light as illustrated in FIG. 6.

FIG. 6 is a figure schematically illustrating the condition of the CMOS image sensor where the components for the respective pixels are positioned in consideration of the incident angle $\theta$ of incident light as viewed from the light entrance side.

As illustrated in FIG. 6, lenses 320 for respective pixels 310 of the CMOS image sensor 100, corresponding to microlenses for the respective pixels, are shifted toward the center from sensor light receiving units 310A in accordance with the incident angle $\theta$ of the incident light.

Figure 7:
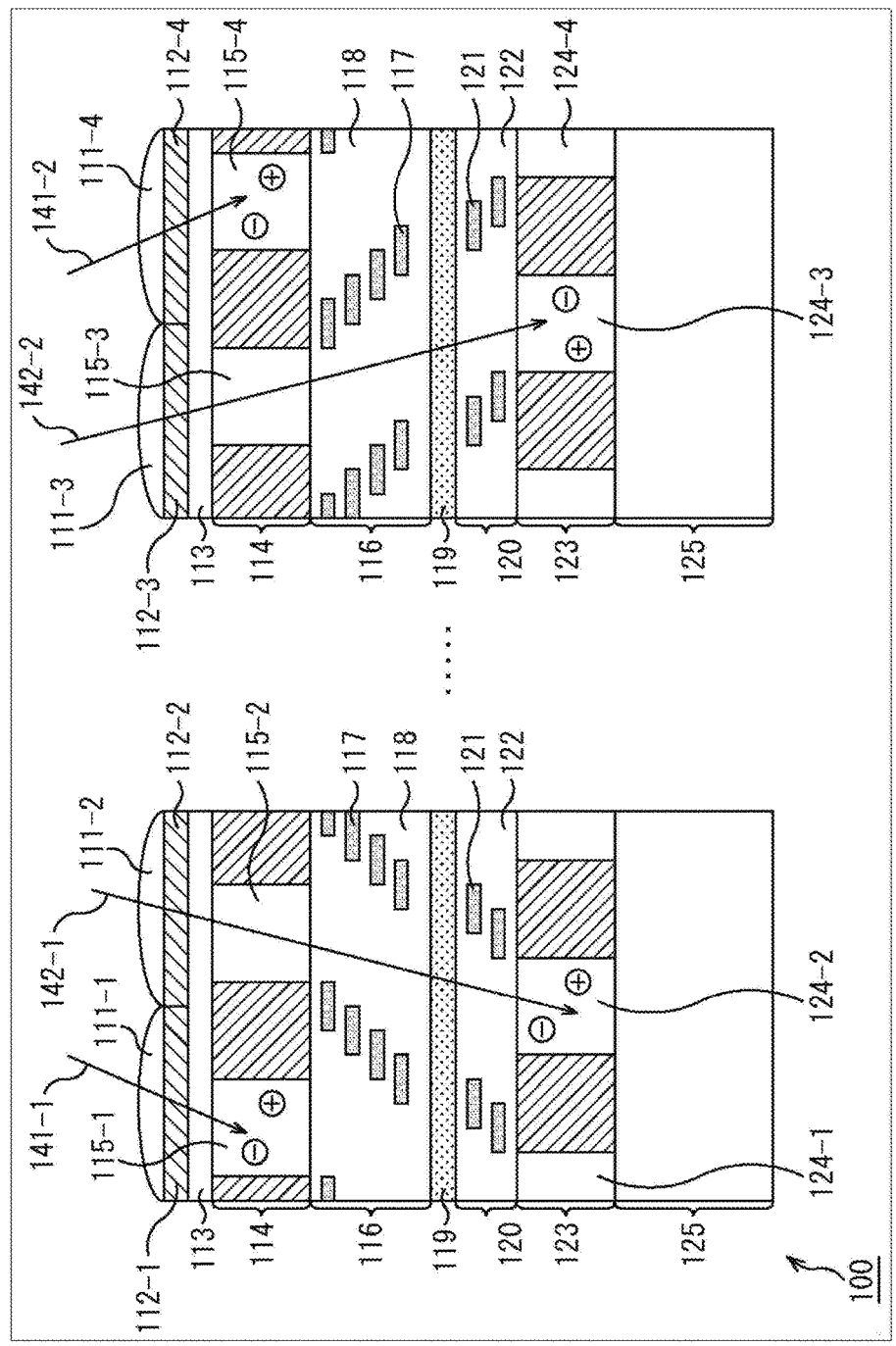
FIG. 7 is a figure illustrating a further configuration example of the CMOS image sensor according to the present technology.

FIG. 7 illustrates cross sections of the CMOS image sensor 100 in this case as viewed similarly to FIGS. 2 and 5. As illustrated in FIG. 7, the condensing lenses 111 and the color filters 112 are shifted toward the center from the photo diodes 115 in accordance with the incident angle $\theta$. Practically, the condensing lenses 111 and the color filters 112 are shifted toward the center in a two-dimensional array as illustrated in FIG. 6.

This arrangement positions the optical path from the condensing lenses 111 to the photo diodes 115 with inclination to the vertical direction at an angle corresponding to the incident angle $\theta$. In this case, an appropriate optical path is established for the incident light; therefore, lowering of the light condensing rate of the photo diodes 115 decreases.

The respective layers of the wires 117 may also be disposed with inclination in accordance with the incident angle $\theta$ of near infrared light as in the example illustrated in FIG. 7. More specifically, the wires 117 may be disposed outside the photo diodes 115 (toward the side opposite to the center) in accordance with the incident angle $\theta$.

Moreover, the respective layers of the wires 121 may also be disposed with inclination in accordance with the incident angle $\theta$ of near infrared light as in the example illustrated in FIG. 7. More specifically, the wires 121 may be disposed further outside the wires 117 (toward the side opposite to the center) in accordance with the incident angle $\theta$.

Furthermore, the photo diodes 124 may also be disposed further outside the wires 121 in accordance with the incident angle $\theta$ of near infrared light as in the example illustrated in FIG. 7.

This arrangement positions the optical path from the photo diodes 115 to the photo diodes 124 with inclination to the vertical direction at an angle corresponding to the incident angle $\theta$. In this case, an appropriate optical path is established for the incident light; therefore, lowering of the light condensing rate of the photo diodes 124 decreases.

The CMOS image sensor 100 described in this embodiment may be manufactured by a method similar to the method discussed in the second embodiment. More specifically, the positions of the respective layers are so determined as to allow the foregoing pupil correction at the time of manufacture of the respective CMOS image sensors by the rear surface irradiation type image sensor manufacturing unit 202 and the front surface irradiation type image sensor manufacturing unit 203 under the control by the control unit 201 (step S101 and step S102).

Accordingly, the manufacturing device 200 more easily manufactures the CMOS image sensor 100 in this embodiment similarly to the above embodiments.

5. Fifth Embodiment

[Imaging Element]

The sizes, shapes, and intervals of the photo diodes may be arbitrarily determined. For example, at least one of these factors may be different between the photo diodes 115 and the photo diodes 124 as illustrated in FIG. 8.

Figure 8:
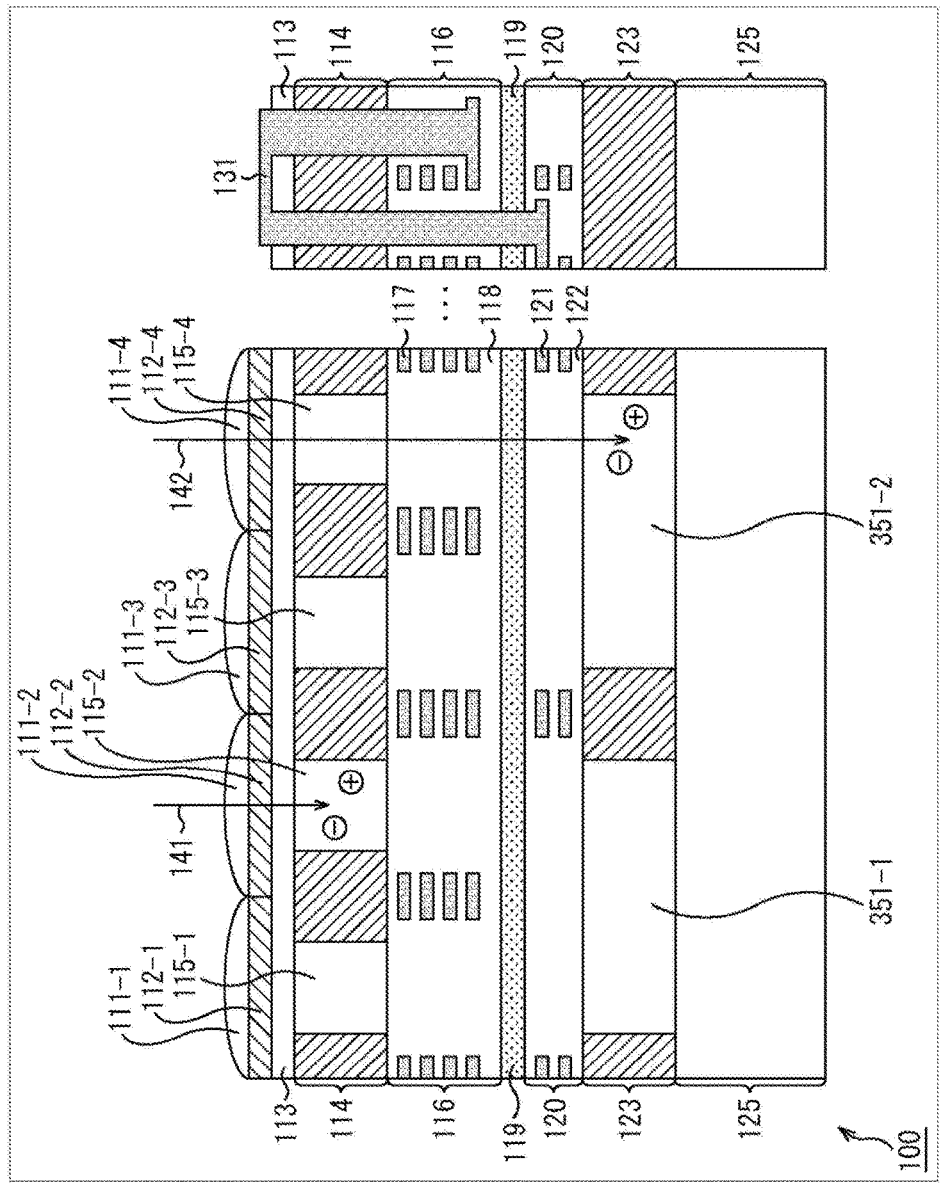
FIG. 8 is a figure illustrating a still further configuration example of the CMOS image sensor according to the present technology.

According to the example illustrated in FIG. 8, there are provided in the semiconductor substrate 123 photo diodes 351-1 and 351-2 each having a size equivalent to two pieces of the photo diodes 115. More specifically, the photo diode 351-1 is provided in the semiconductor substrate 1 below the photo diodes 115-1 and 115-2, and corresponds to the photo diodes 115-1 and 115-2. Accordingly, the photo diode 351-1 photoelectrically converts components in the near infrared light wavelength region of incident light having passed through the photo diode 115-1 or the photo diode 115-2.

On the other hand, the photo diode 351-2 is provided in the semiconductor substrate 1 below the photo diodes 115-3 and 115-4, and corresponds to the photo diodes 115-3 and 115-4. Accordingly, the photo diode 351-2 photoelectrically converts components in the near infrared light wavelength region of incident light having passed through the photo diode 115-3 or the photo diode 115-4. The photo diodes 351-1 and 351-2 are collectively referred to as photo diodes 351 when no distinction between the photo diodes 351-1 and 351-2 is needed.

In this case, the arrangement intervals of the wires 117 in the wiring layer 116 may be different from the arrangement intervals of the wires 121 in the wiring layer 120. According to the example in FIG. 8, the wires 117 are formed in the semiconductor substrate 114 in areas out of the areas below the photo diodes 115 in accordance with the arrangement intervals of the photo diodes 115. On the other hand, the wires 121 are formed in the semiconductor substrate 123 in areas out of the areas above the photo diodes 351 in accordance with the arrangement intervals of the photo diodes 351.

The positions of the wires 117 and 121 are not limited to the positions of the example shown FIG. 8, but may be arbitrarily determined. For example, the positions of the wires 117 may be disposed in areas out of the areas above the photo diodes 351 of the semiconductor substrate 123 in alignment with the wires 121. Similarly, the positions of the wires 121 may be disposed in areas out of the areas above the photo diodes 115 of the semiconductor substrate 114 in alignment with the wires 117.

This arrangement allows the CMOS image sensor 100 to individually set the resolution of visible light images and the resolution of near infrared light images. For example, the CMOS image sensor 100 forms visible light image and near infrared light images having different resolutions.

According to the example illustrated in FIG. 8, the sizes of the photo diodes in the horizontal direction are different for each layer. However, the different factor of the photo diodes for each layer may be arbitrarily determined as long as at least one of the factors of sizes, shapes, and intervals of the photo diodes is different for each layer.

The CMOS image sensor 100 described in this embodiment may be manufactured by a method similar to the method discussed in the second embodiment. More specifically, the rear surface irradiation type image sensor manufacturing unit 202 and the front surface irradiation type image sensor manufacturing unit 203 manufacture the CMOS image sensors independently from each other. In this case, the sizes, shapes, and intervals of the photo diodes are allowed to be determined independently from each other.

Accordingly, the manufacturing device 200 more easily manufactures the CMOS image sensor 100 in this embodiment similarly to the above embodiments.

6. Sixth Embodiment

[Imaging Element]

According to the embodiments discussed above, both visible light images and near infrared light images are formed. However, the thicknesses of the respective photo diodes may be arbitrarily determined. More specifically, the wavelength regions photoelectrically converted by the respective photo diodes are arbitrarily determined, and the CMOS image sensor 100 forms images in arbitrary wavelength regions by determining the depth of potential distribution for each photo diode in accordance with the penetration length of incident light for silicon.

Figure 9:
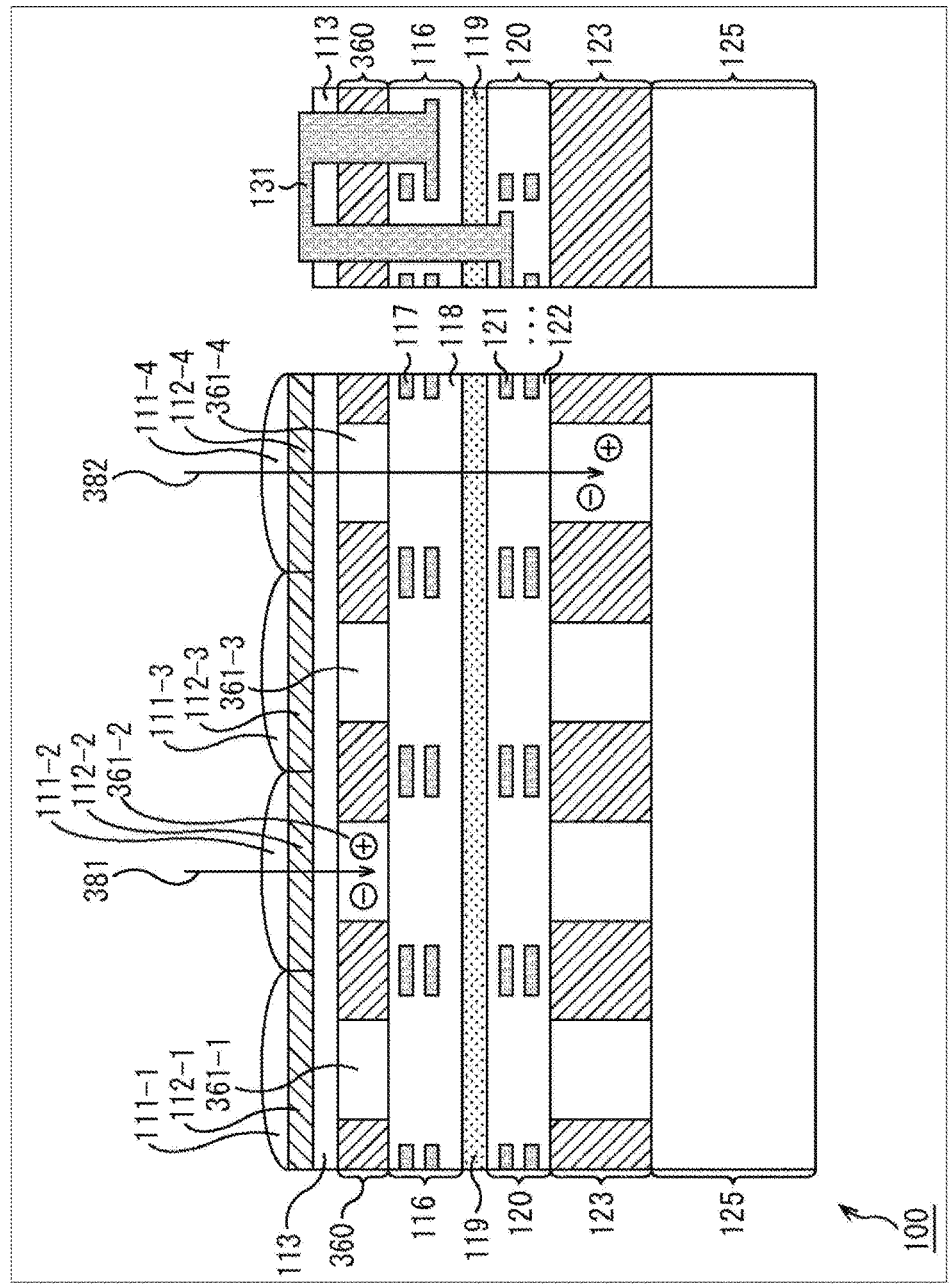
FIG. 9 is a figure illustrating a still further configuration example of the CMOS image sensor according to the present technology.

For example, the CMOS image sensor 100 may be configured to form two types of visible light images in different wavelength regions as illustrated in an example in FIG. 9. In case of the example illustrated in FIG. 9, a semiconductor substrate 360 is provided in place of the semiconductor substrate 114 illustrated in FIG. 2. Photo diodes 361-1 to 361-4 are formed in the semiconductor substrate 360. More specifically, the photo diodes 361-1 to 361-4 correspond to the photo diodes 115-1 to 115-4, respectively. The photo diodes 361-1 to 361-4 are collectively referred to as photo diodes 361 when no distinction between the photo diodes 361-1 to 361-4 is needed. Other configurations are similar to the corresponding configurations in FIG. 2.

The thickness (such as 1 μm) of the semiconductor substrate 360 is smaller than the thickness of the semiconductor substrate 114 illustrated in FIG. 2. This configuration allows the photo diodes 361 to photoelectrically convert components in a short wavelength region of visible light (visible light 381) contained in incident light. In addition, reduction of the thickness of the photo diodes 361 decreases the depth of the photo diodes 124. Accordingly, this configuration allows the photo diodes 124 to photoelectrically convert components in a long wavelength region of visible light (visible light 382) contained in incident light instead of near infrared light. For example, this configuration allows the CMOS image sensor 100 to form images using photo diodes contained in different layers for each color.

Accordingly, the CMOS image sensor 100 includes photo diodes in a plurality of layers, and executes photoelectric conversion individually for each layer. In this case, the components in wavelength regions to be photoelectrically converted by the photo diodes may be determined for each layer of the diodes. As discussed above, the thicknesses of the respective photo diodes may be arbitrarily determined;

therefore the thicknesses of the photo diodes may be determined independently for each layer. For example, the thicknesses of the photo diodes may be different for each layer, or the thicknesses of all the photo diodes may be equalized. In other words, the components in respective wavelength regions to be photoelectrically converted by the respective photo diodes are determined more easily and more freely.

As discussed above, the CMOS image sensor 100 controls not only components in wavelength regions to be photoelectrically converted by the photo diodes 361, but also components in wavelength regions to be photoelectrically converted by the photo diodes 124 in accordance with the thicknesses of the photo diodes 361.

The CMOS image sensor 100 described in this embodiment may be manufactured by a method similar to the method discussed in the second embodiment. More specifically, the rear surface irradiation type image sensor manufacturing unit 202 and the front surface irradiation type image sensor manufacturing unit 203 manufacture the CMOS image sensors independently from each other. In this case, the thicknesses of the layers of the photo diodes are allowed to be determined independently from each other.

Accordingly, the manufacturing device 200 more easily manufactures the CMOS image sensor 100 in this embodiment similarly to the above embodiments.

7. Seventh Embodiment

[Imaging Element]

According to the embodiments described above, the front surface irradiation type CMOS image sensor is overlapped on the front surface side of the rear surface irradiation type CMOS image sensor. However, the rear surface irradiation type CMOS image sensor may be overlapped in place of the front surface irradiation type CMOS image sensor as illustrated in FIG. 10, for example.

Figure 10:
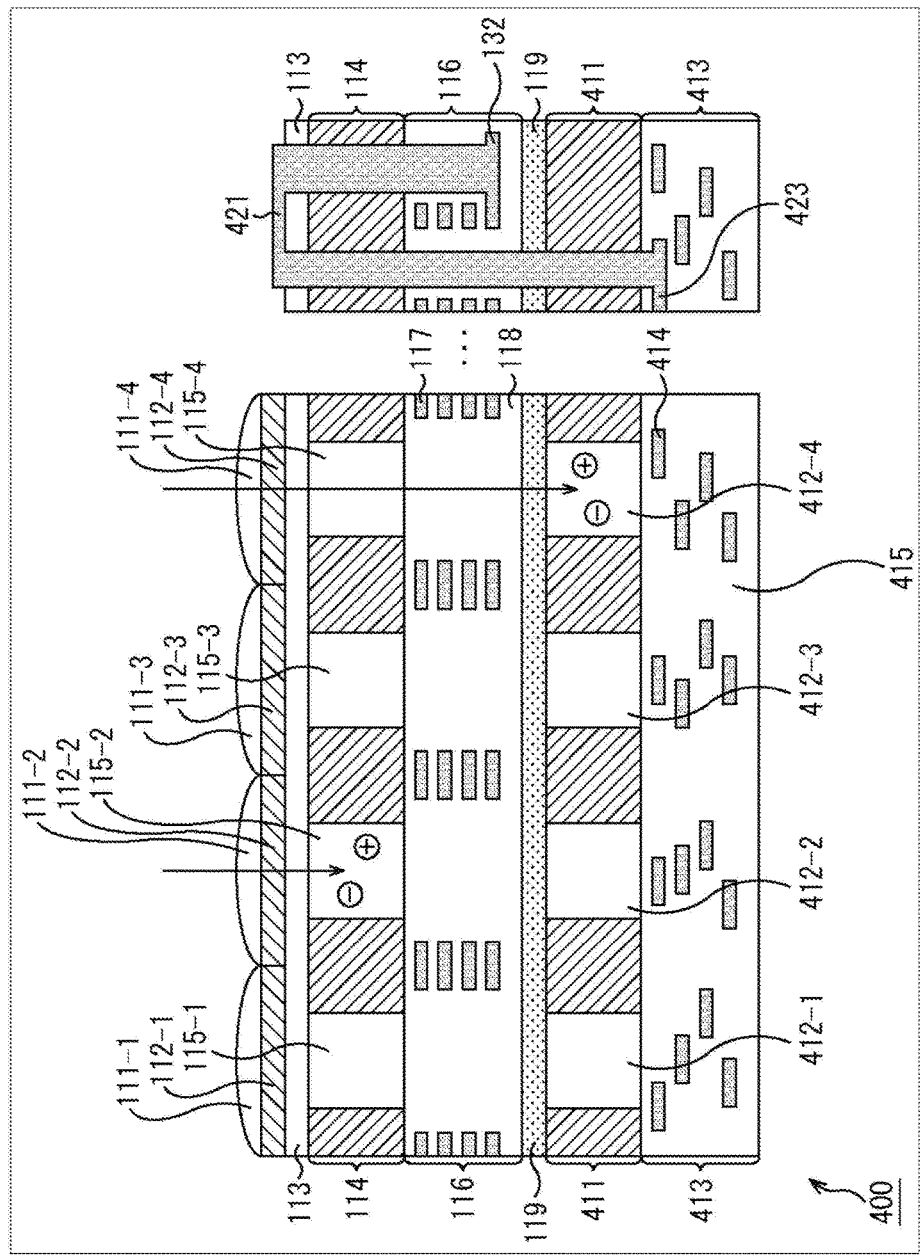
FIG. 10 is a figure illustrating a still further configuration example of the CMOS image sensor according to the present technology.

A CMOS image sensor 400 illustrated in FIG. 10 includes the condensing lenses 111 to the passivation film 119 similar to the corresponding components of the foregoing CMOS image sensor 100. The CMOS image sensor 400 includes a semiconductor substrate 411 and a wiring layer 413 in place of the wiring layer 120 to the support substrate 125.

The semiconductor substrate 411 includes photo diodes 412-1 to 412-4 in correspondence with the respective pixels of the photo diodes 115-1 to 115-4. The photo diodes 412-1 to 412-4 are collectively referred to as photo diodes 412 when no distinction between the photo diodes 412-1 to 412-4 is needed.

The photo diodes 412 photoelectrically convert components in a wavelength region different from the wavelength region of the photo diodes 115 similarly to the photo diodes 124. More specifically, the photo diodes 412 photoelectrically convert a longer wavelength region than the wavelength region of the photo diodes 115. For example, the photo diodes 115 photoelectrically convert components in a visible light wavelength region, while the photo diodes 412 photoelectrically converts components in a near infrared light wavelength region. Alternatively, the photo diodes 115 photoelectrically convert components in a visible light short wavelength region, while the photo diodes 412 photoelectrically convert components in a visible light long wavelength region, for example.

In case of the CMOS image sensor 400, the wiring layer 413 is formed below the semiconductor substrate 411 as viewed in the figure. More specifically, the CMOS image sensor 400 includes a rear surface irradiation type CMOS image sensor on the front surface side of the rear surface irradiation type CMOS image sensor.

The wiring layer 413 is basically identical to the wiring layer 116 and the wiring layer 120, and includes an arbitrary layer number of wires 414 and a wire interlayer film 415. The wiring layer 413 is disposed below the photo diodes 412; therefore, formation of an optical path is not necessary for the wiring layer 413. In this case, the wires 414 may be disposed at arbitrary positions. Accordingly, easier layout is allowed for the wires 414.

Similarly to the wiring layer 116 and the wiring layer 120, a pad 423 corresponding to an external terminal is provided in the wiring layer 413 in an area out of the effective pixel area. The pad 423 is connected with the pad 132 of the wiring layer 116 via a TSV 421.

Accordingly, the CMOS image sensor 400 more easily provides a wider variety of photoelectric conversion outputs similarly to the CMOS image sensor 100.

In case of the CMOS image sensor 400, incident light reaches the photo diodes at the deeper positions (photo diodes 412) without passing through the wiring layer 413. Accordingly, the CMOS image sensor 400 further increases the sensitivity of the photo diodes 412 in comparison with the structure which overlaps a front surface irradiation type CMOS image sensor as the CMOS image sensor 100.

The CMOS image sensor 100 described in this embodiment may be manufactured by a method basically similar to the method discussed in the second embodiment. However, the control unit 201 controls the rear surface irradiation type image sensor manufacturing unit 202 to allow manufacture of a rear surface irradiation type CMOS image sensor in the process in step S102 in place of controlling the front surface irradiation type image sensor manufacturing unit 203. This rear surface irradiation type CMOS image sensor may be produced in a manner similar to a conventional method similarly to step S101. Other processes may be executed in a manner similar to the corresponding processes discussed in the second embodiment.

Accordingly, the manufacturing device 200 more easily manufactures the CMOS image sensor 100 in this embodiment similarly to the above embodiments.

The manufacturing methods of the CMOS image sensor described in the respective embodiments are not greatly different from each other as obvious from above. Accordingly, the manufacturing device 200 can easily switch the manufacturing methods without the necessity of preparation of a new special device or addition of a new special step as long as the methods to be selected are included in the foregoing respective manufacturing methods. Accordingly, the manufacturing device 200 more easily manufactures a wider variety of CMOS image sensors.

According to the above description, the present technology has been applied to a CMOS image sensor. However, the present technology is applicable to any types of imaging elements using photoelectric conversion elements such as photo diodes as well as the CMOS image sensor. For example, the present technology is applicable to a CCD (Charge Coupled Device) image sensor.

According to the above description, the two photo diode layers between which the wiring layer is sandwiched are provided. However, the number of the photo diode layers may be three or more. In this case, the three or more layers of photo diodes may be provided with a wiring layer sandwiched between each of the layers. In other words, three or more layers of rear surface irradiation type or surface irradiation type CMOS image sensors may be overlapped with each other, and respective pads may be connected with each other via through vias.

The three or more layers of photo diodes thus provided similarly form images in different wavelength regions. More specifically, the CMOS image sensor thus constructed is allowed to form three types of images in different wavelength regions. Accordingly, the CMOS image sensor more easily provides a wider variety of photoelectric conversion outputs.

The charge accumulation time of the photo diodes in the respective layers may be determined independently for each layer. In this case, the photo diodes in the respective layers are easily driven in accordance with different charge accumulation time. Accordingly, the charge accumulation time for one of the photo diode layers may be set longer than each charge accumulation time of the other layers. The CMOS image sensor thus constructed forms images in a wider dynamic range than the range of images formed by a single-layer photo diode by synthesizing a plurality of images formed with different charge accumulation times.

As described above, the CMOS image sensor 100 photoelectrically converts components in different wavelength regions of incident light by the respective photo diode layers.

8. Eighth Embodiment

[Imaging Device]

Figure 11:
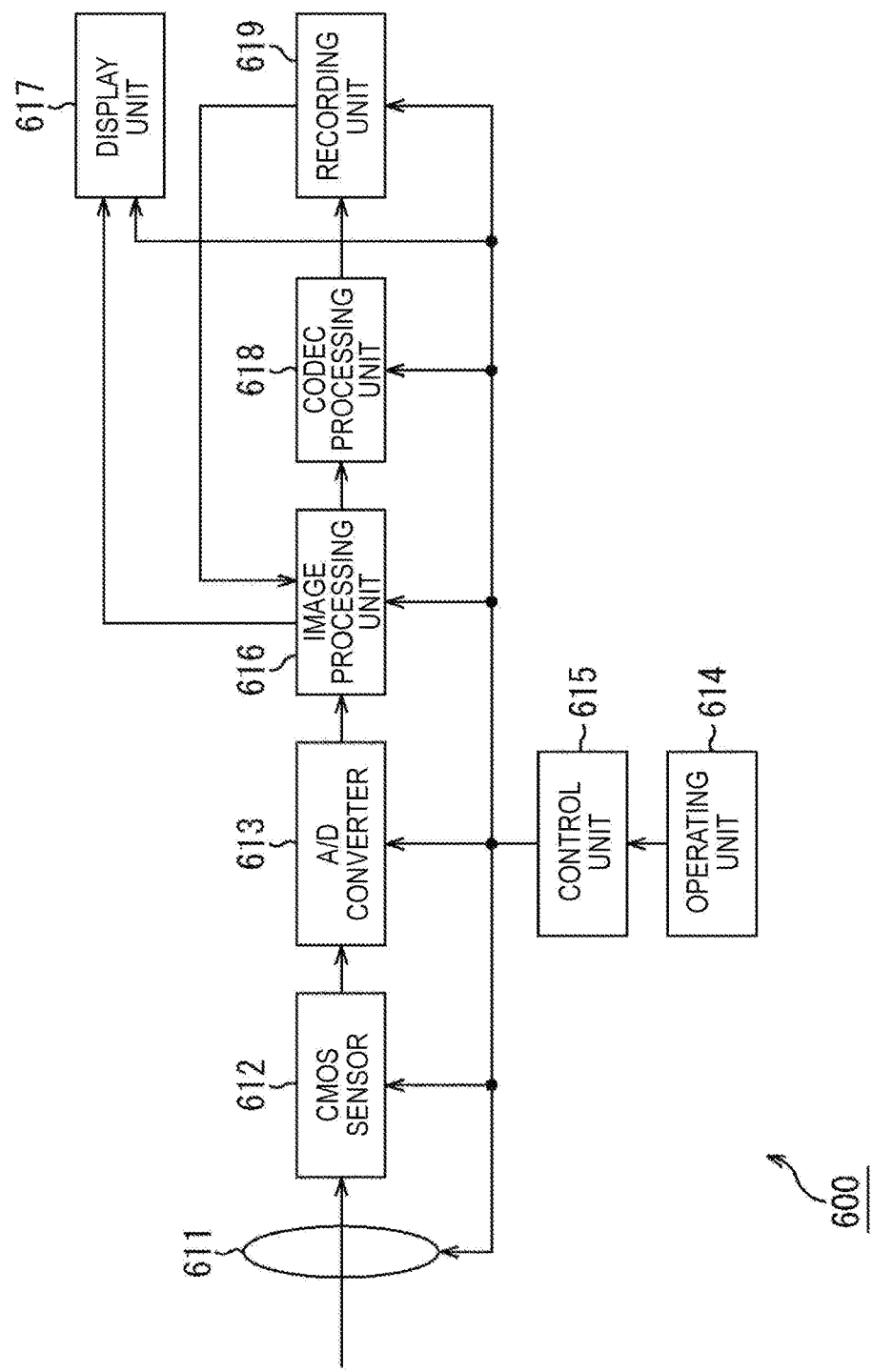
FIG. 11 is a block diagram illustrating an example of a chief configuration of an imaging device.

FIG. 11 is a figure illustrating a configuration example of an imaging device to which the present technology is applied. An imaging device 600 illustrated in FIG. 11 is a device which images a subject and outputs an image of the subject as an electric signal.

As illustrated in FIG. 11, the imaging device 600 includes a lens unit 611, a CMOS sensor 612, an A/D converting unit 613, an A/D converter 613, an operating unit 614, a control unit 615, an image processing unit 616, a display unit 617, a codec processing unit 618, and a recording unit 619.

The lens unit 611 adjusts a focus positioned in the course of a subject, condenses light coming from a position in focus, and supplies the light to the CMOS sensor 612.

The CMOS sensor 612 is a solid imaging element having the foregoing structure, and contains color mixture detecting pixels within an effective pixel area.

The A/D converter 613 converts voltage signals supplied at predetermined timing from the CMOS sensor 612 for each pixel into digital image signals (hereinafter referred to as pixel signals depending on situations), and sequentially supplies the converted signals to the image processing unit 616.

The operating unit 614 is constituted by a jog dial (registered trademark), keys, buttons, a touch panel, or others, for example. The operating unit 614 receives operation input from a user, and supplies signals corresponding to the operation input to the control unit 615.

The control unit 615 controls driving of the lens unit 611, the CMOS sensor 612, the A/D converter 613, the image processing unit 616, the display unit 617, the codec processing unit 618, and the recording unit 619 based on the signals corresponding to the operation input from the user via the operating unit 614, and allows the respective units to execute processes associated with imaging.

The image processing unit 616 executes various types of image processing such as the foregoing color mixture correction, black level correction, white balance adjustment, demosaic processing, matrix processing, gamma correction, and YC conversion for the image signals supplied from the A/D converter 613. The image processing unit 616 supplies the image signals obtained after the image processing to the display unit 617 and the codec processing unit 618.

The display unit 617 is constituted by a liquid display, for example, and displays an image of the subject based on the image signals supplied from the image processing unit 616.

The codec processing unit 618 executes an encoding process in a predetermined system for the image signals received from the image processing unit 616, and supplies image data obtained as a result of the encoding process to the recording unit 619.

The recording unit 619 records the image data supplied from the codec processing unit 618. The image data recorded in the recording unit 619 is read by the image processing unit 616 as necessary to be supplied to the display unit 617. As a result, a corresponding image is displayed.

The imaging device including the solid imaging sensor and the image processing unit to which the present technology is applied is not limited to the foregoing configurations, but may have other configurations.

9. Ninth Embodiment

[Ordinary Image Sensor]

According to an ordinary image sensor (such as image sensors disclosed in Japanese Patent Application Laid-Open Nos. 2010-232595, 2010-41034, and 2008-103368), the maximum depth of photo diodes to be formed in silicon (Si) substrate is limited to a certain depth. This depth is determined by limitation associated with implantation in a photo diode forming process, and factors such as performance for transferring charges after photoelectric conversion, and electric color mixture with adjacent pixels. The limited depth is approximately 3 µm in many cases. However, there is an increasing demand for infrared sensitivity in recent years. Light absorbable by silicon (Si) is dependent on wavelengths; therefore, silicon only absorbs about half of light even when the depth is 3 µm. In this case, it may be difficult to sufficiently increase sensitivity for infrared light.

For overcoming this problem, a method of overlapping two imaging sensors has been proposed (for example, see Japanese Patent Application Laid-Open No. 2008-227250). According to this method, however, a distance (such as spacer) is produced between imaging sensors when two imaging sensors are only affixed to each other, and, thus, the distance or an inserted object such as a spacer may produce sensitivity losses. For increasing sensitivity of photo diodes on both the upper surface and the lower surface, it is preferable that the photo diodes on both the upper surface and the lower surface are disposed at the closest possible positions to an on-chip lens (OCL).

More specifically, a complex type solid imaging element described in Japanese Patent Application Laid-Open No. 2008-227250 is constituted by solid imaging sensors already completed and joined to each other. Each of the solid imaging sensors is extremely thin; therefore, a wafer where each of the solid imaging elements is provided is fragile. Accordingly, a dedicated special device is needed to join these imaging sensors while avoiding breakage of the wafers. In this case, the manufacture becomes difficult, and the cost may considerably increase. Moreover, it may be difficult to obtain sufficient yields.

Therefore, junction by an ordinary method is preferable. In this case, however, each thickness of the wafers needs to be several hundred µm or larger to avoid breakage of the respective wafers at the time of junction. For this purpose, a support substrate needs to be provided for each of the solid imaging elements to be joined. For example, in case of the example illustrated in FIG. 2, the support substrate is formed in the configuration of the imaging element on the lower side in the figure. However, no support substrate is formed in the configuration of the imaging element on the upper side.

According to the method described in Japanese Patent Application Laid-Open No. 2008-227250, a spacer is provided for the configuration of the imaging element on the upper side in place of the support substrate. As obvious from this example, it is required in this method to insert the support substrate or an alternative component between the imaging elements to be joined.

In this case, however, the distance between the photo diodes overlapped for each pixel may become excessively long by the presence of the support substrate (or the alternative component). Under this condition, it may be difficult to achieve photoelectric conversion in a desired wavelength region by the photo diodes located away from the light entrance side (photo diodes 124 in case of the example in FIG. 2). Moreover, incident light is difficult to reach the corresponding photo diodes, and, thus, the sensitivity may lower without necessity.

Other possible example methods are disclosed in US 2009/0294813 A1 and US 2009/0200589 A1, for example. The former document proposes a method which joins a different substrate containing photo diodes to a front surface irradiation type image sensor. However, as discussed above, it is preferable that both photo diodes on the upper surface and photo diodes on the lower surface are disposed at closest possible positions to an on-chip lens (OCL) for realizing high sensitivity of both the photo diodes on the upper and lower surfaces. In other words, it is preferable that the upper surface photo diodes are formed in a rear surface irradiation type image sensor (Japanese Patent Application Laid-Open No. 2008-103368, for example). Moreover, according to this document, a temporary support substrate is joined to the front irradiation (FIG. 3, for example), and removed in another step (FIG. 6, for example). In this case, a lot of complicated and ineffectual steps are needed.

According to the technology described in the latter document, two light receiving units are provided on the same silicon (Si) substrate. In this case, individual reading from the upper surface and the lower surface is difficult. In addition, the lower surface handles only IR light. Accordingly, many limitations are imposed.

The infrared light discussed above is also used for a distance measuring method called TOF (for example, see Japanese Patent Application Laid-Open No. 2012-49547). In addition, there is a method for measuring a distance based on projection as described in US Patent No. US 2010/0118123 A1, for example. Concerning such technologies, further improvement of distance measurement accuracy and improvement of durability for effects of external light have been demanded, for example.

The use of wavelengths including near infrared wavelength is also started in medical fields, for example, as wavelength regions expected to improve analysis accuracy and the like. However, problems such as low infrared sensitivity are arising as discussed above. Moreover, one wavelength is analyzed for one pixel in a conventional method; therefore, irradiation of lights in a plurality of wavelength regions, or the use of a plurality of near infrared pixels is required in a method for analyzing hemoglobin based on information about a plurality of wavelengths (Japanese Patent No. 2932644, for example). In this case, miniaturization of imaging elements and imaging devices becomes difficult.

For application to capsule endoscopes and the like in the future, further miniaturization and improvement in accuracy will be demanded. In analyzing optical characteristics of micro-molecules and DNA, the molecule size falls within one pixel. In this case, the number and the structure of the molecules arranged for each pixel differ in case of the use of plural pixels such as Bayer array, and, thus, accurate analysis may become difficult.

Furthermore, also considering lights other than infrared light, there is proposed a vertical spectrum structure for obtaining colors such as RGB by one pixel. For example, this method is proposed in Japanese Patent Application Laid-Open No. 2011-29453. This method provides a plurality of photo diodes within a single silicon (Si) substrate. Accordingly, this method requires individual reading gate electrodes for the photo diodes on the silicon (Si) surface side, and for the photo diodes on the silicon (Si) deep side. In addition, this method requires etching of silicon (Si) up to a depth equivalent to the photo diodes and forming of the gate electrodes for reading from the photo diodes on the silicon (Si) deep side (for example, Japanese Patent Application Laid-Open No. 2011-29453, FIG. 16). In this case, the photo diode area for photoelectric conversion decreases by the area of the gate electrodes. This condition may adversely affects the number of saturated electrons and the sensitivity. Moreover, etching for excavating silicon at the time of formation of the gate electrodes may damage the silicon (Si) substrate, and, thus, dark current, white spots and other problems may be generated.

Furthermore, according to the vertical spectrum structure, control over plural wavelength components for the photo diodes is allowed only by the depth of the photo diodes and formation of potentials by implantation. Accordingly, the controllability of spectrum is not high.

Example 1

Figure 12:
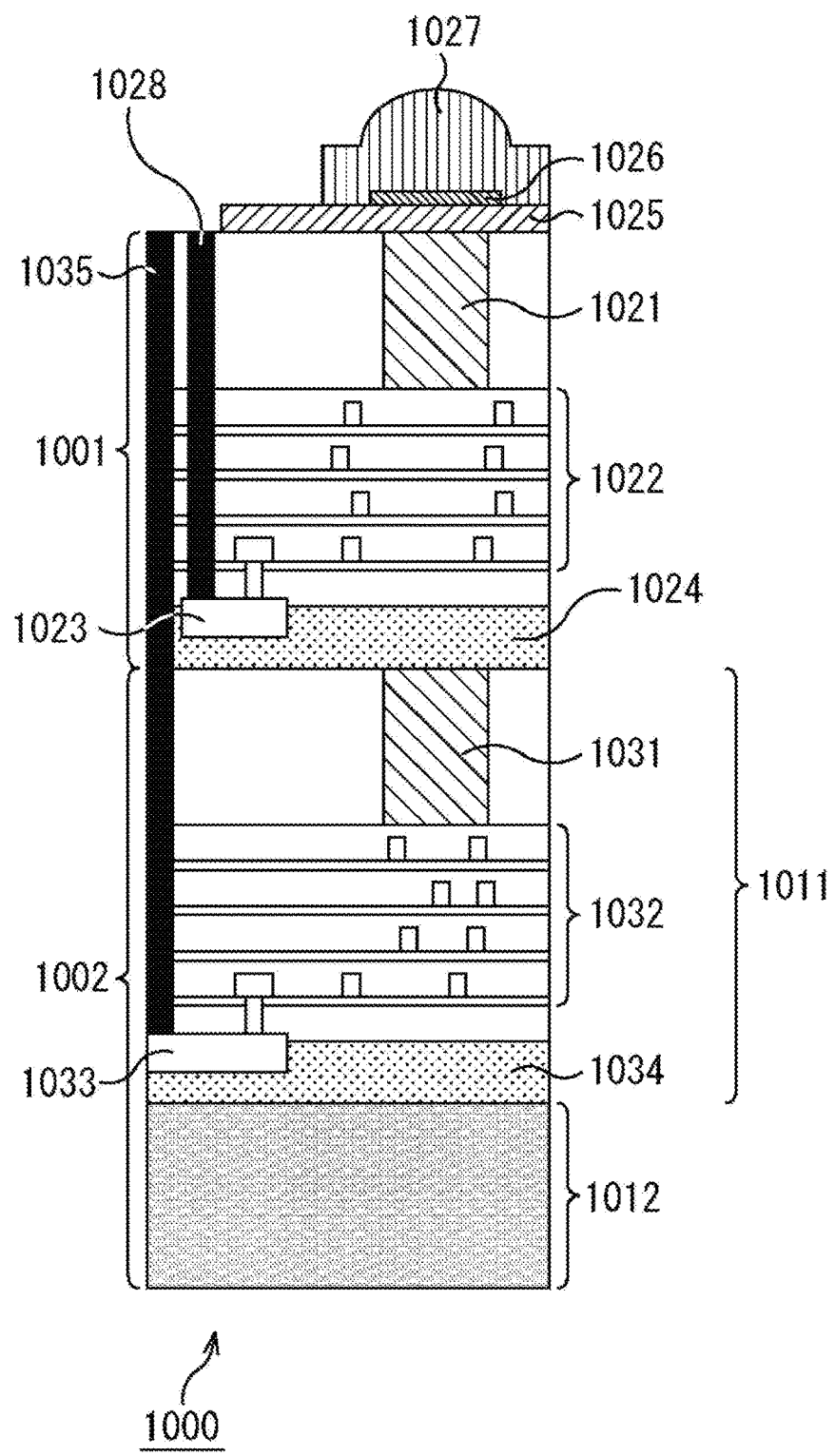
FIG. 12 is a figure illustrating a still further configuration example of the CMOS image sensor according to the present technology.

For solving the above problems, such a configuration is considered which also includes photo diodes in a support substrate layer of a rear surface irradiation type CMOS image sensor as illustrated in FIG. 12.

A CMOS image sensor 1000 illustrated in FIG. 12 is a mode of an imaging element, and basically has a configuration identical to the configuration of the CMOS image sensor 400 illustrated in FIG. 10. More specifically, the CMOS image sensor 1000 includes double structure of a constitution 1001 corresponding to an upper layer and having an imaging function, and a support substrate 1002 corresponding to a lower layer as illustrated in FIG. 12.

The constitution 1001 having the imaging function has a configuration similar to the configuration of an ordinary rear surface irradiation type CMOS image sensor. More specifically, a photo diode 1021, wiring layers 1022, an electrode 1023, a passivation film 1024 and others are laminated in the constitution 1001. An insulation film 1025, a color filter 1026, an on-chip lens 1027 and others are further laminated on the constitution 1001 having the imaging function on the upper surface side of the constitution 1001 as viewed in the figure. The constitution 1001 having the imaging function further includes a through electrode 1028 extended from the upper side as viewed in the figure to connect the electrode 1023.

In case of the ordinary CMOS image sensor, the support substrate 1002 corresponding to the lower layer is constituted only by a silicon (Si) substrate. On the other hand, the support substrate 1002 of the CMOS image sensor 1000 in this example includes a photo diode 1031. Accordingly, the support substrate 1002 is constituted by a constitution 1011 having an imaging function, and a support substrate 1012.

The constitution 1011 having the imaging function includes a lamination of the photo diode 1031, wiring layers 1032, an electrode 1033, and a passivation film 1034. The support substrate 1012 constituted by a silicon (Si) substrate is laminated. on the lower surface side of the passivation film 1034 as viewed in the figure. A through electrode 1035 is further formed from the upper surface side as viewed in the figure to connect with the electrode 1033 of the support substrate 1002.

Accordingly, the CMOS image sensor 1000 includes two layers of rear surface irradiation CMOS image sensors (constitutions having the imaging function). In this case, the CMOS image sensor 1000 photoelectrically converts incident light not only by the photo diode 1021 in the upper layer, but also by the photo diode 1031 in the lower layer. Accordingly, the CMOS image sensor 100 achieves a wider variety of photoelectric conversions, and expands the utilization range (application range).

For example, this structure allows the photo diode 1021 in the upper layer to offer rear surface irradiation type high-sensitivity characteristics for the light receiving surface as in the conventional structure, and further allows the additional photo diode 1031 in the lower layer to output optical characteristics different from those of the upper layer. The distance between the support substrate 1002 and the photo diode 1021 is equivalent only to the thickness of the wiring layer. In this case, optical losses decrease, and both of the photo diodes obtain high-sensitivity characteristics. Moreover, in case of the conventional rear surface irradiation type image sensor, light having passed through the photo diode is applied to the wiring layer located below the photo diode, and is reflected thereon and mixed with the adjoining photo diode in some situations. According to the CMOS image sensor 1000, however, incident light is guided toward a lower layer; therefore, generation of color mixture in the photo diode 1021 in the upper layer is avoided.

As illustrated in FIG. 12, the CMOS image sensor 1000 contains two photo diodes within the same pixel (referring to the same coordinate in the layout). The CMOS image sensor 1000 may include an individual wiring layer for each of the photo diodes. Accordingly, the CMOS image sensor 1000 achieves driving and reading of the photo diodes in the respective layers independently from each other.

Unlike an image sensor having vertical spectrum structure as described in Japanese Patent Application Laid-Open No. 2011-29453, for example, the CMOS image sensor 1000 optimizes each of the photo diodes in the respective layers in accordance with the purposes of use. This configuration eliminates the necessity of etching silicon (Si) and forming a transfer gate right beside the photo diode which increases the configuration, for example, and allows enlargement of the photo diodes. Accordingly, the CMOS image sensor 1000 increases the number of saturated electrons more than the foregoing image sensor having vertical spectrum structure, thereby improving the sensitivity. Furthermore, the necessity of excavating the side of the photo diodes by etching or other methods is eliminated; therefore, generation of dark current or white spots resulting from plasma damage or defects is prevented.

As a result, a plurality of spectra are obtained from the same pixel without decreasing the resolution. In addition, advantages of high infrared sensitivity, and prevention of the foregoing color mixture (reflection from wire) with the photo diode in the upper surface are offered.

As described above, the configuration illustrated in the example in FIG. 12 is easily realized (manufactured) by using an ordinary method for manufacturing a rear surface irradiation type CMOS image sensor described below, which method forms the photo diode 1031 different from the photo diode 1021 in the support substrate 1002 of the ordinary rear surface irradiation type CMOS image sensor 1000, rather than simply joining completed solid imaging elements.

In other words, the CMOS image sensor 1000 is configured to include the two imaging elements on the upper side and the lower side as illustrated in FIG. 12. In this case, the necessity of providing a support substrate or a component such as a spacer between the two imaging elements is eliminated; therefore, the distance between the photo diode 1021 and the photo diode 1031 is shortened. Accordingly, the sensitivity and the light receiving band of the photo diode 1031 can be easily designed based on the thicknesses of the wiring layers 1022 and the like.

A part or all of the pixels in the CMOS image sensor 1000 are thus constructed; therefore, photoelectric conversion is achievable for a plurality of different wavelength regions of incident light in one pixel without decreasing the number of pixels and the pixel size, i.e., while avoiding deterioration of the image quality. Accordingly, the CMOS image sensor 1000 more easily provides a wider variety of photoelectric conversion outputs.

The thicknesses of the photo diode 1021 and the photo diode 1031 in the incident light traveling direction (vertical direction in the figure) may be arbitrarily determined. For example, the thickness of the photo diode 1021 and the thickness of the photo diode 1031 may be equivalent to each other, or may be different from each other. The respective thicknesses of the photo diodes may be designed according to the bands for photoelectric conversion.

[Manufacturing Device]

A manufacturing device for manufacturing the CMOS image sensor 1000 thus constructed is now described.

Figure 13:
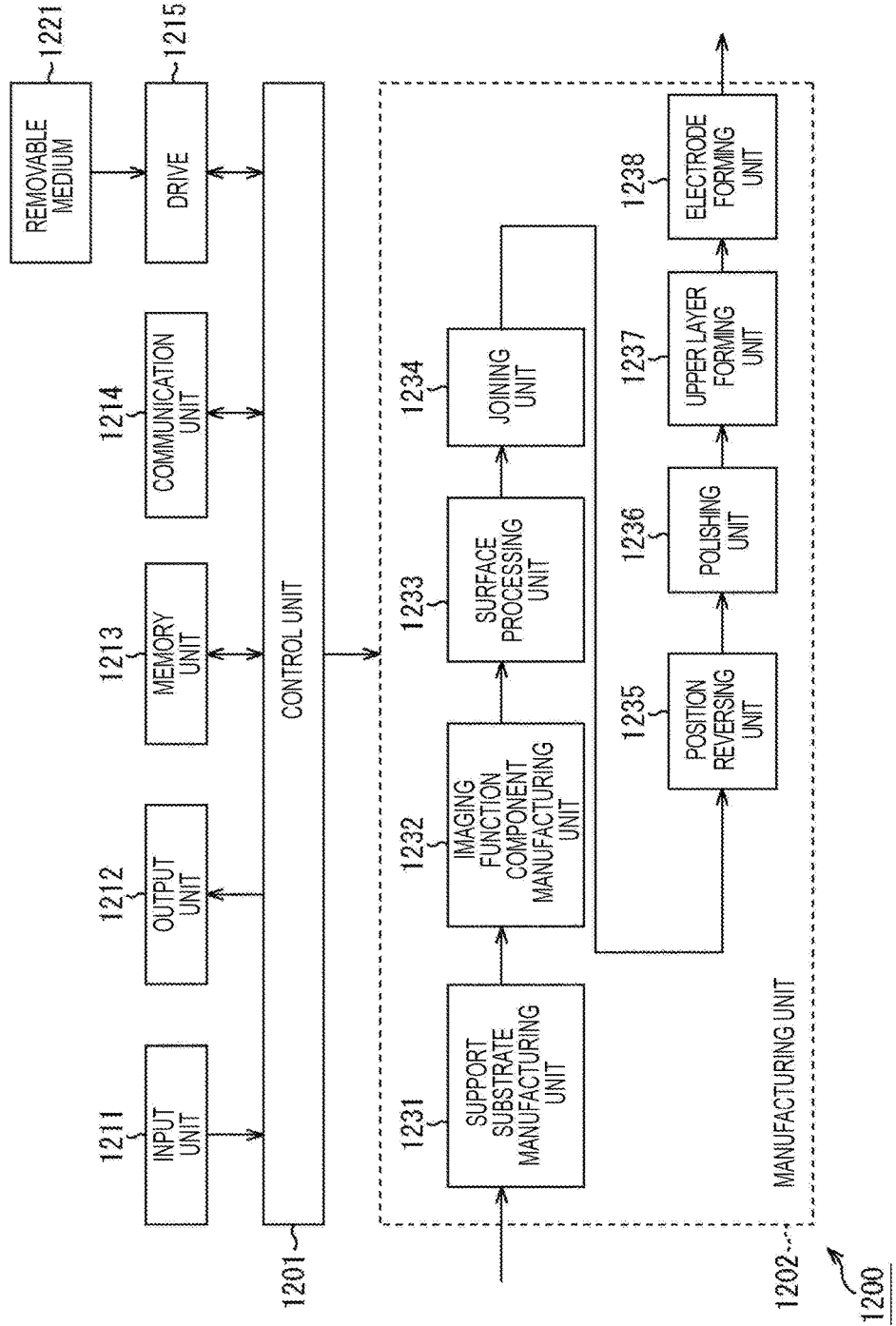
FIG. 13 is a block diagram illustrating another configuration example of the manufacturing device according to the present technology.

FIG. 13 is a block diagram illustrating an example of a chief constitution of a manufacturing device for manufacturing the CMOS image sensor 1000. A manufacturing device 1200 illustrated in FIG. 13 includes a control unit 1201 and a manufacturing unit 1202.

The control unit 1201 includes a CPU (Central Processing Unit), a ROM (Read Only Memory), RAM (Random Access Memory), and others, and controls the respective units of the manufacturing unit 1202 to execute control processes associated with manufacture of the CMOS image sensor 1000. For example, the CPU of the control unit 1201 executes various types of processes under programs stored in the ROM. In addition, the CPU of the control unit 1201 executes various types of processes under programs loaded from a memory unit 1213 to the RAM. The RAM also stores data required by the CPU for execution of the processes as necessary.

The manufacturing unit 1202 executes processes associated with manufacture of the CMOS image sensor 1000 under the control by the control unit 1201. The manufacturing unit 1202 includes a support substrate manufacturing unit 1231, an imaging function component manufacturing unit 1232, a front surface processing unit 1233, a joining unit 1234, a position reversing unit 1235, a polishing unit 1236, an upper layer forming unit 1237, and an electrode forming unit 1238.

The support substrate manufacturing unit 1231 to the electrode forming unit 1238 execute processes in respective steps for manufacturing the CMOS image sensor 1000 as described below under the control by the control unit 1201.

The manufacturing device 1200 includes an input unit 1211, an output unit 1212, a memory unit 1213, a communication unit 1214, and a drive 1215.

The input unit 1211 is constituted by a keyboard, a mouse, a touch panel, an external input terminal and the like. The input unit 1211 receives input of instructions from a user or information from the outside, and supplies the input to the control unit 1201. The output unit 1212 is constituted by a display such as CRT (Cathode Ray Tube) display or an LCD (Liquid Crystal Display), a speaker, an external output terminal and the like. The output unit 1212 outputs various types of information supplied from the control unit 1201 in the form of images, audio, or analog signals or digital data.

The memory unit 1213 is constituted by an SSD (Solid State Drive) such as a flash memory, or a hard disk. The memory unit 1213 stores information supplied from the control unit 1201, or reads and supplies stored information in response to requests from the control unit 1201.

The communication unit 1214 is constituted by a wired LAN (local Area Network) or a wireless LAN interface or a modem, for example, and executes communication processing with an external device via a network including the Internet. For example, the communication unit 1214 transmits information supplied from the control unit 1201 to a communications partner, and supplies information received from a communications partner to the control unit 1201.

The drive 1215 is connected with the control unit 1201 as necessary. A removable medium 1221 such as a magnetic disk, an optical disk, a magneto-optical disk, a semiconductor memory or others is attached to the drive 1215 as necessary. Computer programs read from the removable medium 1221 via the drive 1215 are installed in the memory unit 1213 as necessary.

[Flow of Support Substrate Manufacturing Process]

Figure 14:
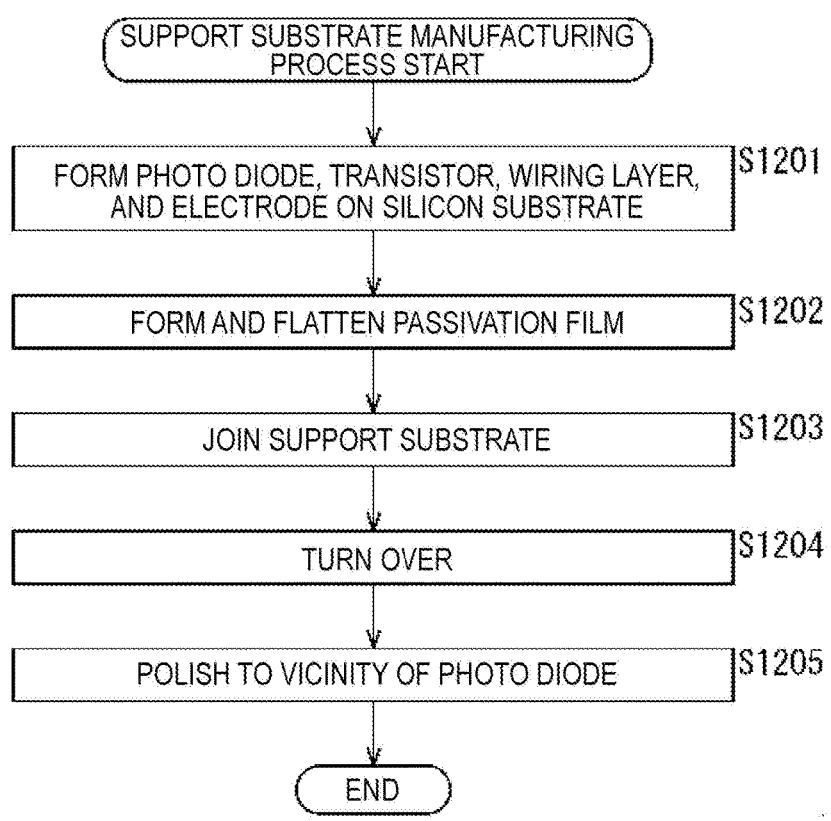
FIG. 14 is a flowchart showing a flow example of a support substrate manufacturing process.
Figure 15:
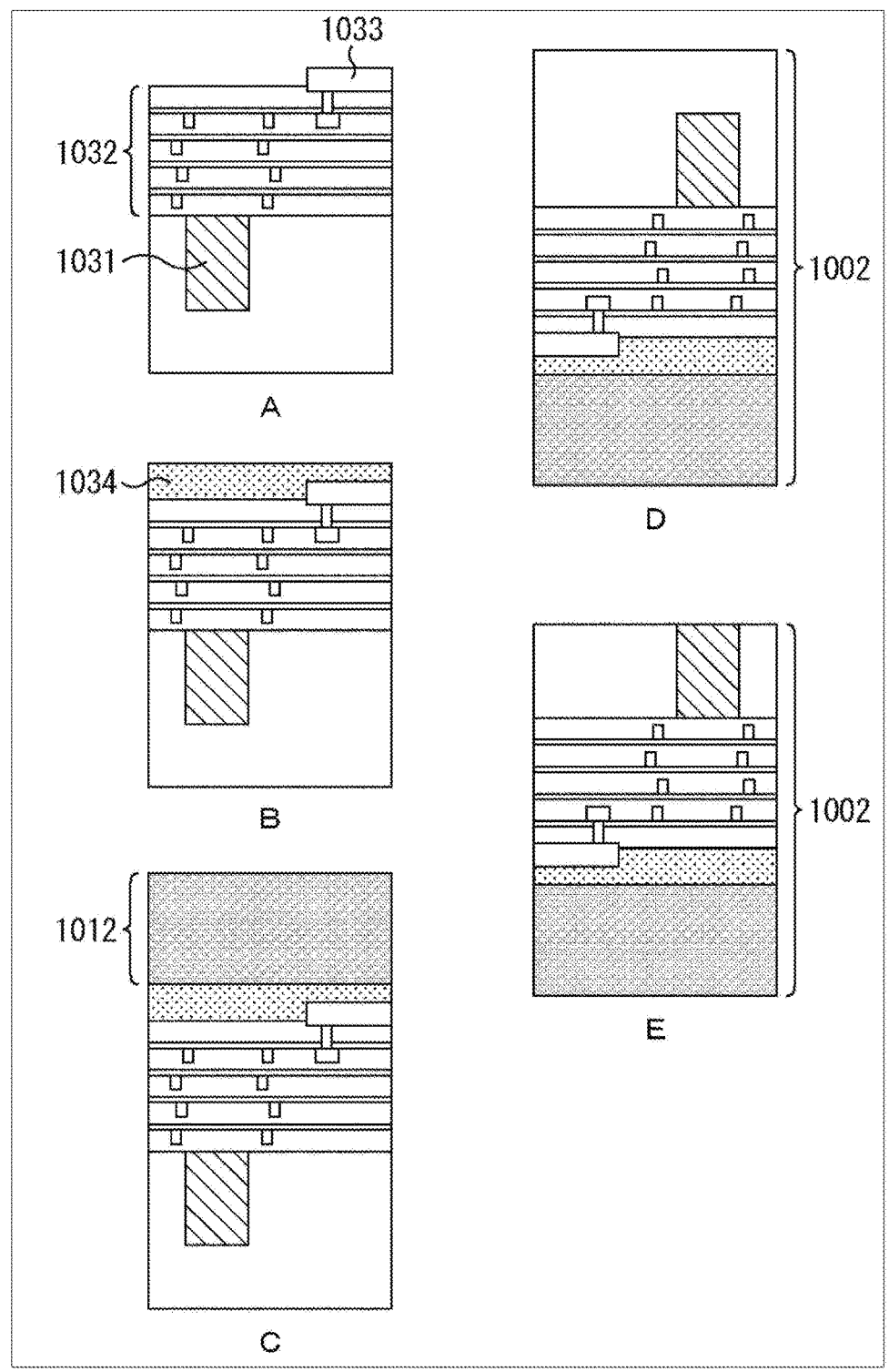
FIG. 15 is a figure illustrating conditions of the support substrate manufacturing process.

The support substrate manufacturing unit 1231 executes a support substrate manufacturing process to manufacture the support substrate 1002. A flow example of the support substrate manufacturing process executed by the support substrate manufacturing unit 1231 is now described with reference to a flowchart shown in FIG. 14. This process is discussed in conjunction with FIG. 15 as necessary. FIG. 15 illustrates conditions in respective steps executed in the support substrate manufacturing process.

After the start of the support substrate manufacturing step, the support substrate manufacturing unit 1231 forms the silicon substrate photo diode 1031, a transistor (not shown), the wiring layers 1032, and the electrode 1033 supplied from the outside under the control by the control unit 1201 in step S1201 (A in FIG. 15). It is assumed herein that a rear surface irradiation type structure is produced. However, either the "front surface irradiation" or the "rear surface irradiation" may be selected for the support substrate. For example, an example of the front surface irradiation type image sensor is disclosed in Japanese Patent Application Laid-Open No. 2010-41034. An example of the rear surface irradiation type image sensor is disclosed in Japanese Patent Application Laid-Open No. 2008-103368.

In step S1202, the support substrate manufacturing unit 1231 forms the passivation film 1034 (such as SIN or SiO2) for protecting the front surface under the control by the control unit 1201, and flattens the passivation film 1034 by CMP (Chemical Mechanical Polishing) or other methods (B in FIG. 15).

In step S1203, the support substrate manufacturing unit 1231 joins the support substrate 1012 to the constitution 1011 constructed as above and having the imaging function by plasma junction or an adhesive, for example, under the control by the control unit 1201 (C in FIG. 15).

In step S1204, the support substrate manufacturing unit 1231 turns over the support substrate 1002 thus manufactured under the control by the control unit 1201 (D in FIG. 15).

In step S1205, the support substrate manufacturing unit 1231 polishes the upper surface of the turned over support substrate 1002 as viewed in the figure up to the vicinity of the photo diode 1031 by CMP, back grind, etching or other method, or by combination thereof under the control by the control unit 1201 (E in FIG. 15). In this case, the support substrate 1002 corresponds to an ordinary rear surface irradiation type image sensor from which a color filter and an on-chip lens (OCL) are removed. Accordingly, the support substrate 1002 is easily manufactured by a method similar to the method for manufacturing an ordinary rear surface irradiation type image sensor.

[Flow of Manufacturing Process]

The imaging function component manufacturing unit 1232 to the electrode forming unit 1238 of the manufacturing unit 1202 execute a manufacturing process to manufacture the CMOS image sensor 1000 using the support substrate 1002 thus produced. A flow example of the manufacturing process executed by the imaging function component manufacturing unit 1232 to the electrode forming unit 1238 is now described with reference to a flowchart shown in FIG. 16. This process is discussed in conjunction with FIG. 17 as necessary. FIG. 17 illustrates conditions in respective steps executed in the manufacturing process.

After the start of the manufacturing process, the imaging function component manufacturing unit 1232 forms the photo diode 1021, a transistor (not shown), the wiring layers 1022, and the electrode 1023 on an ordinary silicon substrate under the control by the control unit 1201 in step S1221 (A in FIG. 17).

In step S1222, the surface processing unit 1233 forms the passivation film 1024 (such as SIN and SiO2) for protecting the surface of the upper side of the constitution 1001 thus formed and having the imaging function as viewed in A in FIG. 17, and flattens the passivation film 1024 thus formed by CMP (chemical mechanical polishing) or other methods under the control by the control unit 1201. (B in FIG. 17).

In step S1223, the joining unit 1234 joins the support substrate 1002 to the constitution 1001 having the imaging function and equipped with the passivation film 1024 by plasma junction or an adhesive, for example under the control by the control unit 1201 (C in FIG. 17). As illustrated in C in FIG. 17, the constitution 1001 having the imaging function does not have a support substrate at this time, and the silicon substrate including the photo diode 1021 is not yet polished and is still thick. Accordingly, the wafer on which the constitution 1001 having the imaging function is formed secures a sufficient thickness; therefore, the probability of breakage of the wafer at the time of junction is extremely low. This condition allows the joining unit 1234 to easily join the constitution 1001 having the imaging function and the support substrate 1002.

In step S1224, the position reversing unit 1235 turns over the constitution 1001 having the imaging function and the support substrate 1002 joined to each other as discussed above under the control by the control unit 1201 (D in FIG. 17)

In step S1225, the polishing unit 1236 polishes the upper surface of the turned over constitution 1001 having the imaging function as viewed in the figure up to the vicinity of the photo diode 1021 by CMP, back grind, etching or other method, or by a combination thereof under the control by the control unit 1201 (E in FIG. 17).

In step S1226, the upper layer forming unit 1237 forms the insulation film 1025, the color filter 1026, and the on-chip lens (OCL) 1027 on the polished upper surface under the control by the control unit 1201 (F in FIG. 17).

In step S1227, the electrode forming unit 1238 forms the through electrode 1028 for extracting the electrode 1023 toward the upper surface side as viewed in the figure, and the through electrode 1035 for extracting the electrode 1033 to the upper surface side as viewed in the figure under the control by the control unit 1201 (G in FIG. 17).

Manufacture of the CMOS image sensor 1000 is completed by these processes. The process flow such as the junction method of the support substrate containing wires is disclosed in Japanese Patent Application Laid-Open No. 2011-204915.

As described above, the manufacturing device 1200 easily manufactures the CMOS image sensor 1000 including a plurality of layers by utilizing the manufacturing steps for manufacturing an ordinary single-layer CMOS image sensor.

Example 2

According to the characteristics of the present technology, there may be provided a different film (such as oxide film and other wiring layer) between the photo diodes. It is characteristic that this configuration is also applicable to control of light entering from the photo diode 1021 in the upper layer into the photo diode 1031 in the lower layer. When the largest possible amount of light is desired to be introduced into the photo diode 1031, it is preferable that a light transmission path (such as waveguide) is formed in the wiring layers 1022 to reduce optical losses. On the contrary, when reduction of light entering the photo diode 1031 is desired, a part of the light may be blocked by wires (such as Cu, Al, and W) of the wiring layers 1022. In controlling the wavelength of light entering the photo diode 1031, a structure absorbing a large amount of particular wavelength light (such as Poly-Si capable of absorbing short wavelength light) may be provided. (Alternatively, a light absorber such as a color filter may be used.)

[Manufacturing Device]

A manufacturing device for manufacturing the CMOS image sensor 1000 thus constructed is now described.

Figure 18:
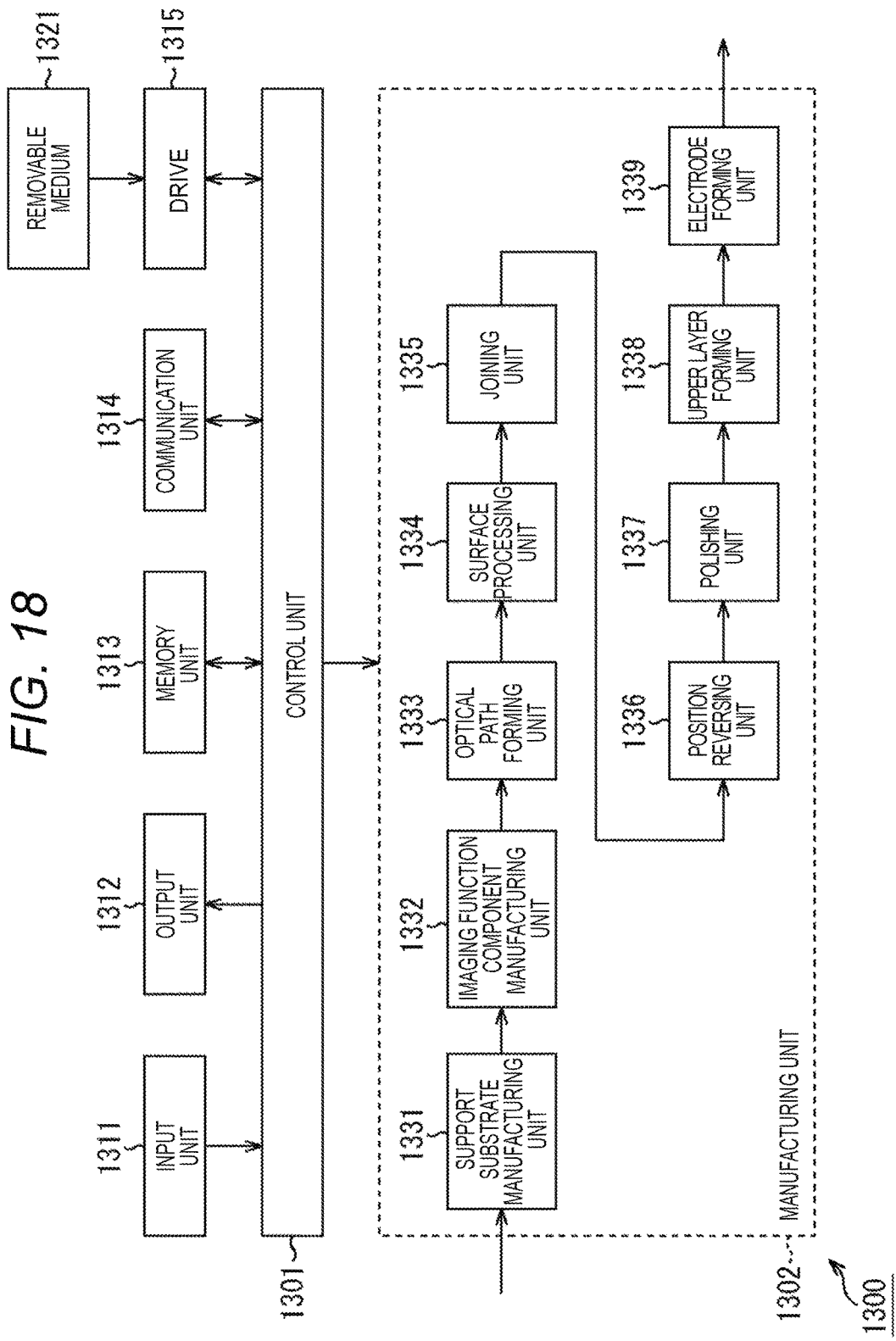
FIG. 18 is a block diagram showing a further configuration example of the manufacturing device according to the present technology.

FIG. 18 is a block diagram illustrating an example of a chief configuration of the CMOS image sensor 1000 thus constructed. A manufacturing device 1300 illustrated in FIG. 18 has basically the same configuration as that of the manufacturing device 1200 illustrated in FIG. 13, and includes a control unit 1301 and a manufacturing unit 1302.

The control unit 1301 is a processing unit similar to the control unit 1201, and controls operation of the manufacturing unit 1302. The manufacturing unit 1302 executes processes associated with manufacture of the CMOS image sensor 1000 under the control of the control unit 1301 similarly to the manufacturing unit 1202.

The manufacturing unit 1302 includes a support substrate manufacturing unit 1331, an imaging function component manufacturing unit 1332, an optical path forming unit 1333, a front surface processing unit 1334, a joining unit 1335, a position reversing unit 1336, a polishing unit 1337, an upper layer forming unit 1338, and an electrode forming unit 1339.

The support substrate manufacturing unit 1331 is a unit similar to the support substrate manufacturing unit 1231. The imaging function component manufacturing unit 1332 is a processing unit similar to the imaging function component manufacturing unit 1232. The front surface processing unit 1334 is a processing unit similar to the front surface processing unit 1233. The joining unit 1335 is a processing unit similar to the joining unit 1234. The position reversing unit 1336 is a processing unit similar to the position reversing unit 1235. The polishing unit 1337 is a processing unit similar to the polishing unit 1236 The upper layer forming unit 1338 is a processing unit similar to the upper layer forming unit 1237. The electrode forming unit 1339 is a processing unit similar to the electrode forming unit 1238.

The manufacturing unit 1300 includes an input unit 1311, an output unit 1312, a memory unit 1313, a communication unit 1314, and a drive 1315. These units are similar to the input unit 1211 to the drive 1215. A removable medium 1321 similar to the removable medium 1221 is attached to the drive 1315 as necessary.

[Flow of Manufacturing Process]

The support substrate manufacturing unit 1331 executes a support substrate manufacturing process (FIG. 14) similar to the processes performed by the support substrate manufacturing unit 1231 under the control by the control unit 1301 to manufacture the support substrate 1002.

Figure 19:
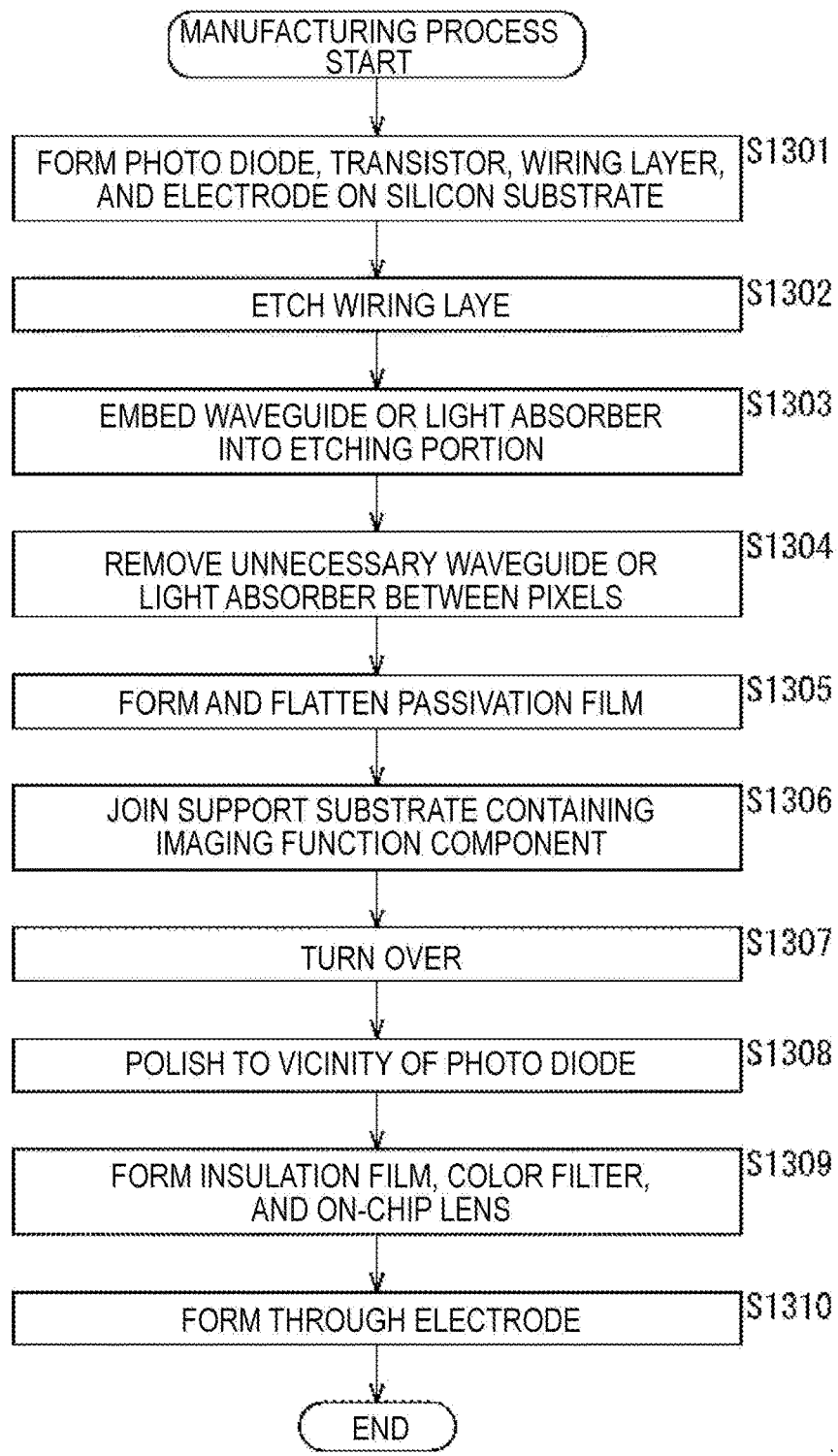
FIG. 19 is a flowchart showing a further flow example of the manufacturing process.
Figure 20:
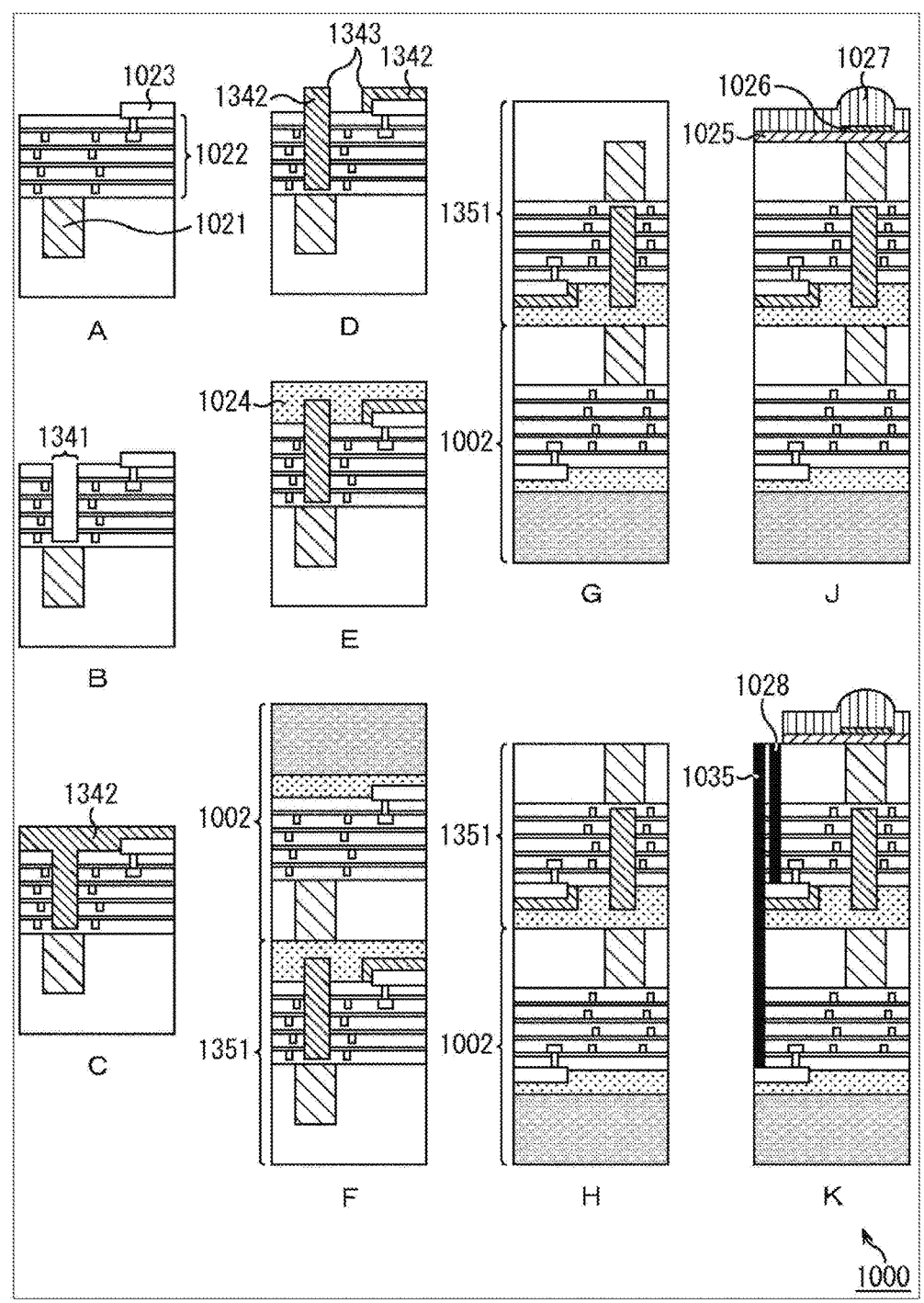
FIG. 20 is a figure illustrating conditions of the manufacturing process.

The imaging function component manufacturing unit 1332 to the electrode forming unit 1339 of the manufacturing unit 1302 execute the manufacturing process to manufacture the CMOS image sensor 1000 using the support substrate 1002 thus produced. A flow example of the manufacturing process executed by the imaging function component manufacturing unit 1332 to the electrode forming unit 1339 is now described with reference to a flowchart shown in FIG. 19. This process is discussed in conjunction with FIG. 20 as necessary. FIG. 20 illustrates conditions in respective steps executed in the manufacturing process.

After the start of the manufacturing process, the imaging function component manufacturing unit 1332 forms the photo diode 1021, a transistor (not shown), the wiring layers 1022, and the electrode 1023 on an ordinary silicon substrate under the control by the control unit 1301 in step S1301 similarly to step S1221 (A in FIG. 20).

In step S1302, the optical path forming unit 1333 etches a portion (such as an etching portion 1341 in B in FIG. 20) of the wiring layers 1022 in correspondence with a position (optical path) into which a waveguide or a light absorber is desired to be inserted under the control by the control unit 1301 (B in FIG. 20).

In step S1303, the optical path forming unit 1333 embeds the waveguide (high refractive index material) or a light absorber (color filter, or material whose absorptivity is dependent on wavelengths such as Poly-Si) (embedding member 1342 in C in FIG. 20) into the etching portion 1341 by ALD (Atomic Layer Deposition), CVD (Chemical Vapor Deposition), PVD (Physical Vapor Deposition), application or other methods under the control by the control unit 1301 (C in FIG. 20). It is assumed in this example that a film of silicon nitride SIN (refractive index: about 1.8 to 2) formed by ALD is used. SIN has a higher refractive index in comparison with surrounding wiring layers (refractive index: 1.5 or lower in case of oxide film), and has excellent condensing characteristics. Moreover, this material is an inorganic membrane, and thus is characteristic in sufficient durability for enduring heat or pressure when heat or pressure is applied in the subsequent manufacturing steps. However, the film to be embedded may be an organic membrane.

In step S1304, the optical path forming unit 1333 removes an unnecessary portion (etching portion 1343 in D in FIG. 20) such as an area between pixels in the embedding member 1342 (waveguide member or light absorber) by etching under the control by the control unit 1301 (D in FIG. 20).

For example, SIN has a high refractive index, and thus may cause color mixture when connected with adjacent pixels. Accordingly, the optical path forming unit 1333 removes the etching portion 1343 between the pixels as discussed herein. This process prevents transmission of light to the adjacent pixels via the embedding member 1342 (such as SIN). However, this process may be omitted when not needed.

Figure 16:
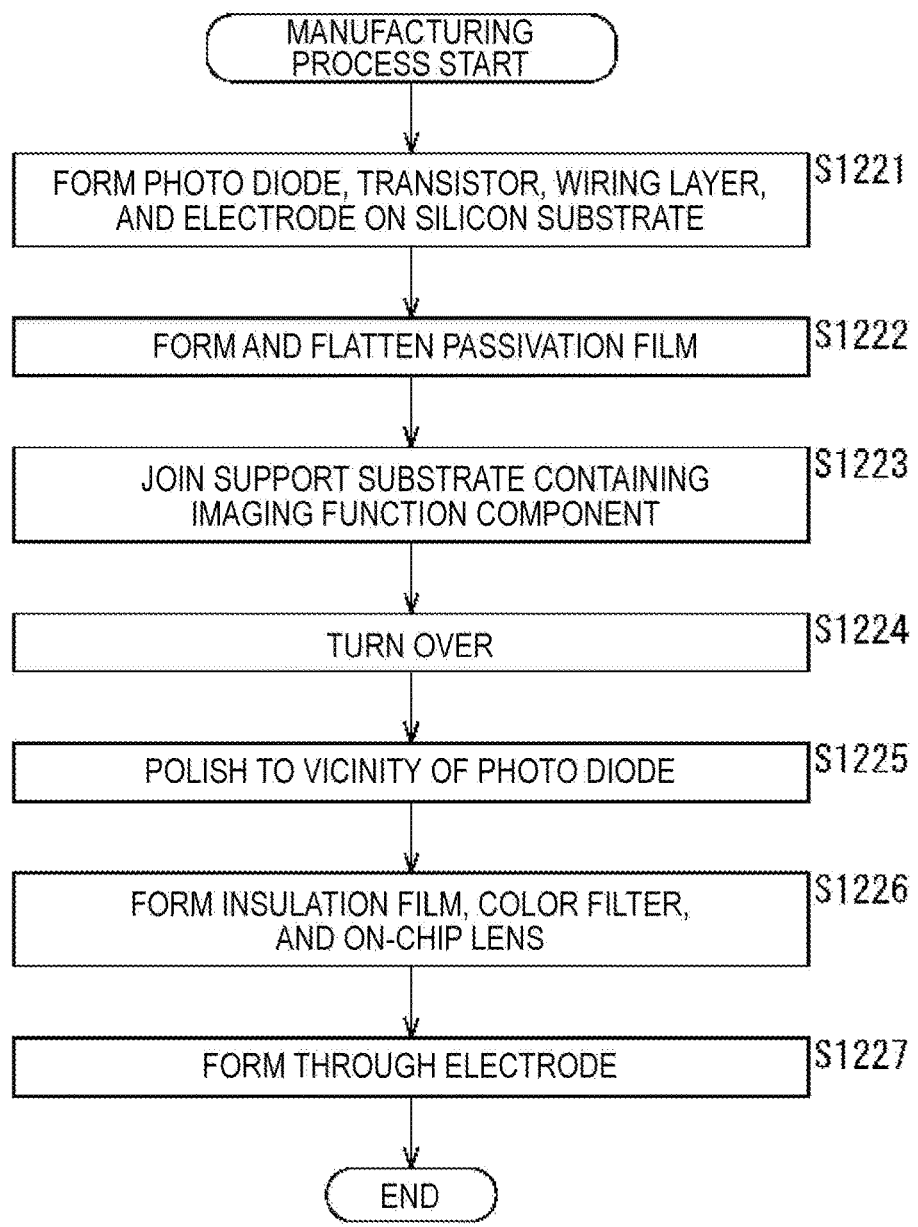
FIG. 16 is a flowchart showing another flow example of the manufacturing process.
Figure 17:
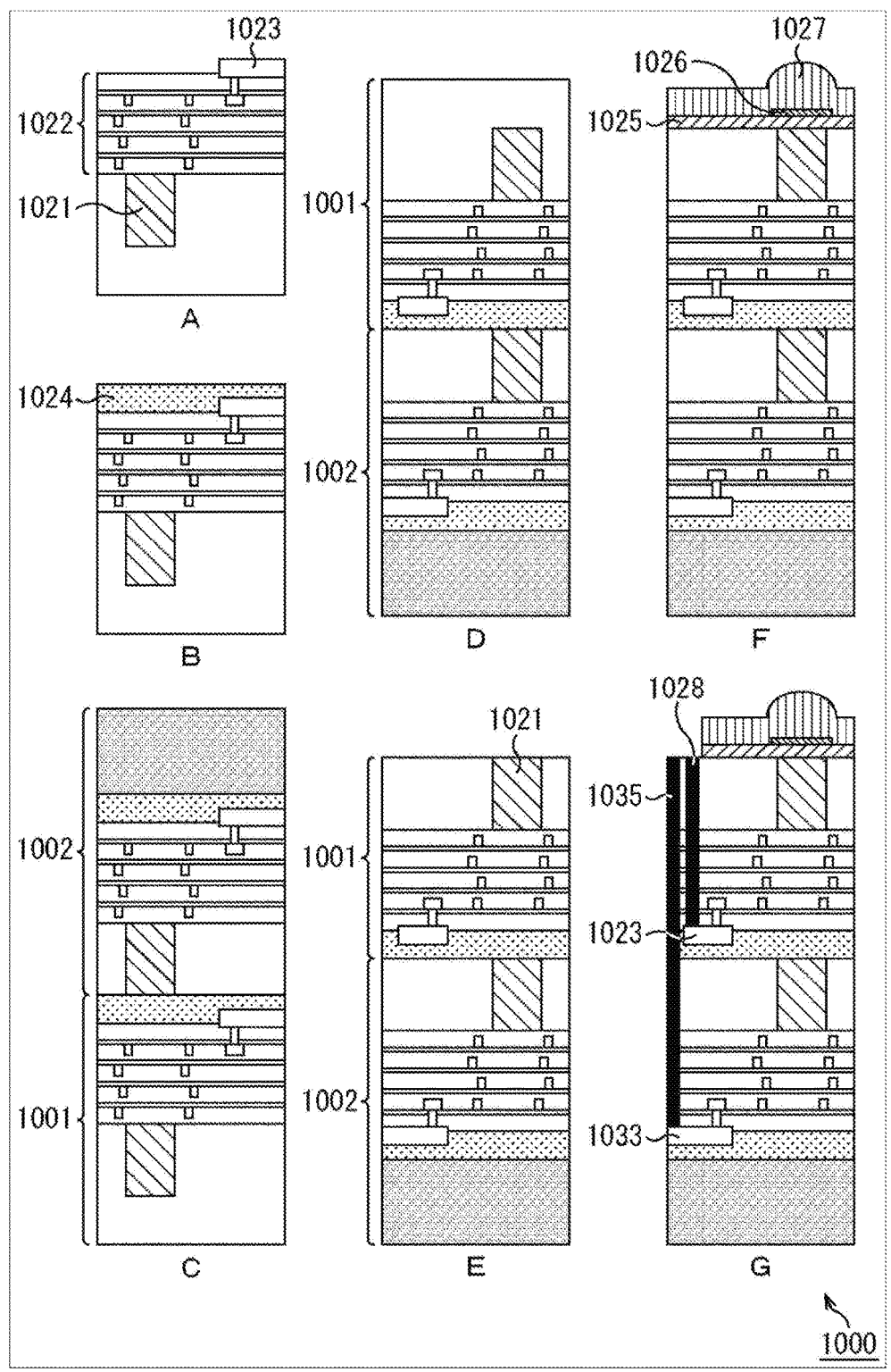
FIG. 17 is a figure illustrating conditions of the manufacturing process.

Respective processes in steps S1305 to S1310 are executed by the front surface processing unit 1334 to the electrode forming unit 1339 under the control by the control unit 1301 in a manner similar to the respective processes in steps S1222 to S1227 in FIG. 16 (E to K in FIG. 20).

By executing the foregoing manufacturing process, the manufacturing device 1300 completes manufacture of a constitution 1351 having an imaging function and containing a waveguide (or light absorber) in the wiring layers 1022. In other words, the manufacturing device 1300 completes manufacture of the CMOS image sensor 1000 including the constitution 1351 having the imaging function.

Example 3

Figure 21:
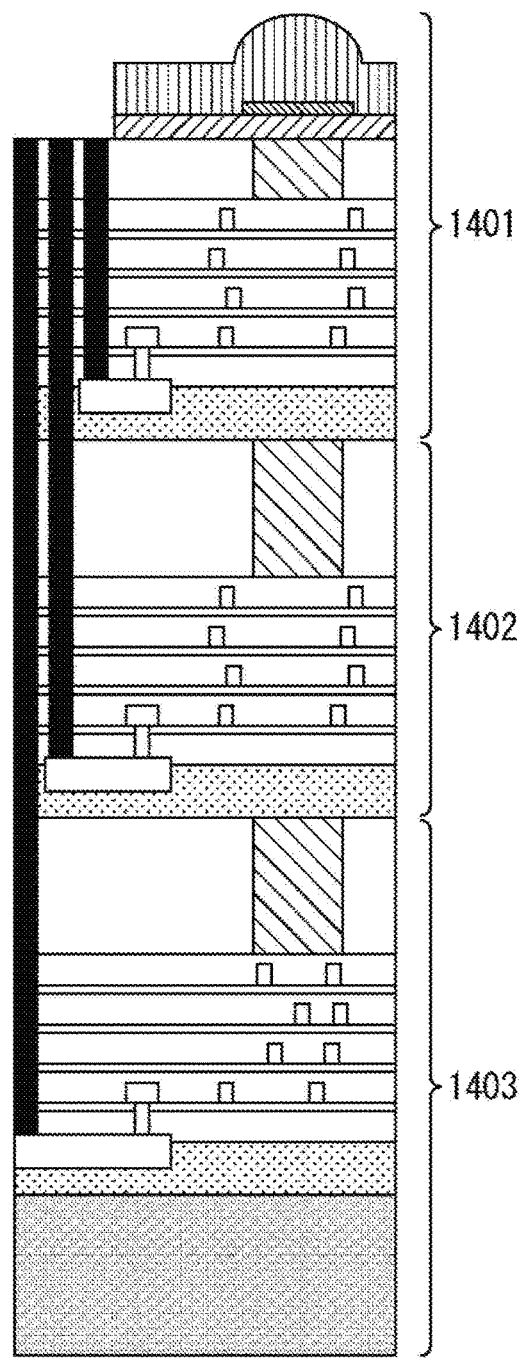
FIG. 21 is a figure illustrating a still further configuration example of the CMOS image sensor according to the present technology.

The number of layers of photo diodes may be increased to three or more by a similar method. FIG. 21 illustrates a constitution example of a CMOS image sensor having three layers of photo diodes. A CMOS image sensor 1400 illustrated in FIG. 21 includes an upper layer 1401, a middle layer 1402, and a lower layer 1403. Each of the upper layer 1401 to the lower layer 1403 may contain a photo diode. Accordingly, three photo diodes are formed at the maximum within one pixel.

The CMOS image sensor 1400 only adds one layer of a constitution having the imaging function to the CMOS image sensor 1000 discussed above. Accordingly, the CMOS image sensor 1400 may be manufactured by using the manufacturing method of the foregoing CMOS image sensor 1000.

More specifically, in step S1203 of the support substrate manufacturing process discussed with reference to the flowchart in FIG. 14, the support substrate 1012 constituted by a silicon substrate is joined to the constitution 1011 having the imaging function. According to the process in this example, however, a support substrate including a constitution having the imaging function is joined to the constitution 1011 having the imaging function in a manner similar to the process in step S1223 in FIG. 16.

Accordingly, three or more layers of photo diodes formed in different silicon layers are obtained by recursively repeating the processes. The wavelengths of light received by the respective layers (photoelectrically converted) are controlled by controlling the respective film thicknesses of silicon (Si) containing the photo diodes. For example, the respective photo diodes may be configured to receive lights in blue, green, and red in this order from above (by utilizing different Si absorptivity for each color). Moreover, this configuration is considerably advantageous in receiving light in the infrared range, and realizes the advantage of high sensitivity.

The pixel sizes of the respective layers are not required to be the same.

An example of driving/signal processing is now described.

Example 4

An independent wiring layer may be provided for each of the plural photo diodes laminated as discussed above. This configuration increases the degree of freedom in driving the respective photo diodes. For example, in case of the double-layer CMOS image sensor 1000 illustrated in A in FIG. 22, a signal value obtained by the photo diode 1021, and a signal obtained by the photo diode 1031 may be individually output as shown in B in FIG. 22, or may be synthesized and output as shown in C in FIG. 22.

Figure 22:
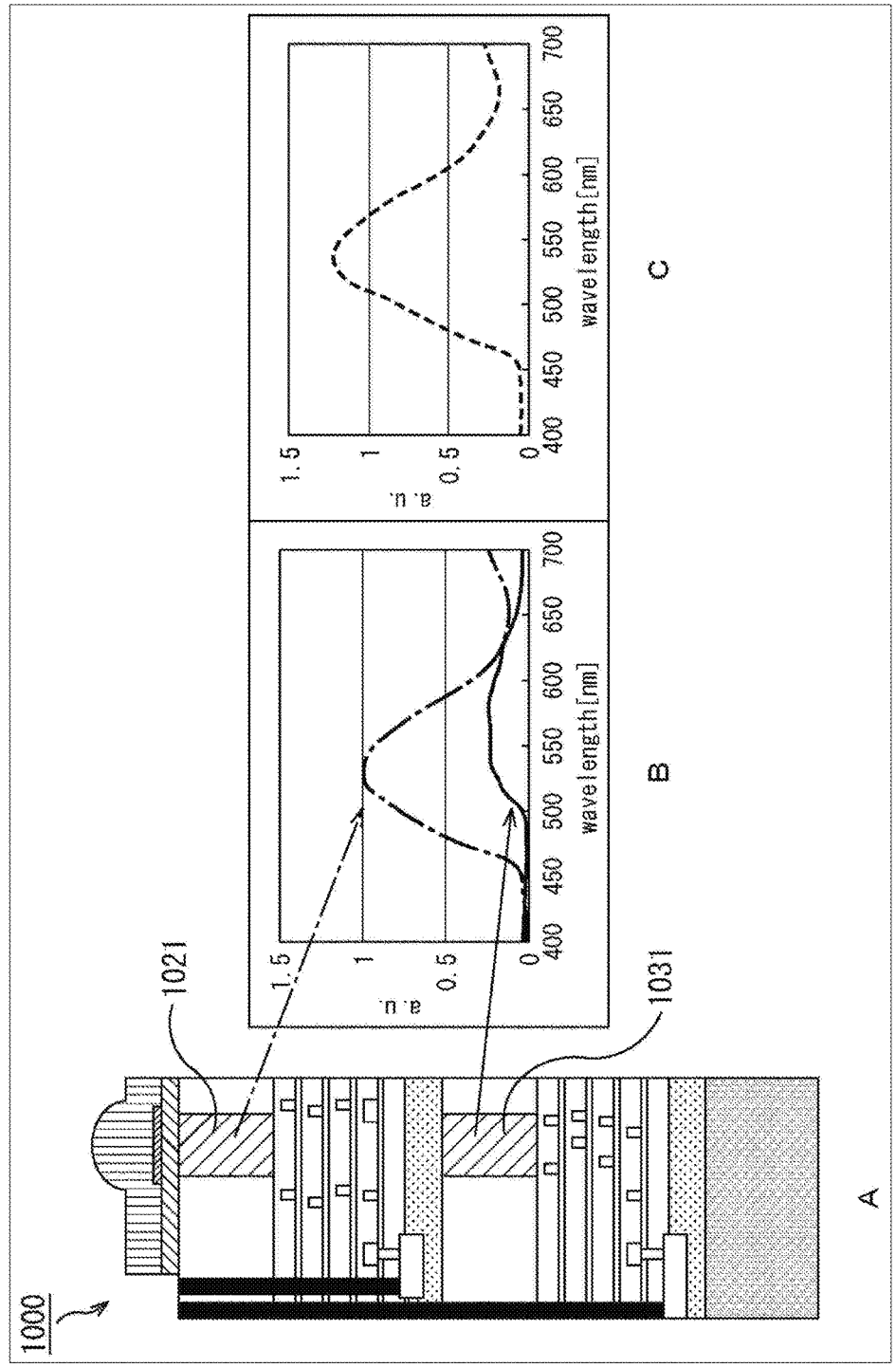
FIG. 22 is a figure illustrating an example of signal reading.

When the signal values of the upper and lower photo diodes are synthesized and output as shown in C in FIG. 22, the light receiving sensitivity increases. Accordingly, this configuration may be used as a high sensitivity mode. For example, a high output is obtained for light not sufficiently photoelectrically converted by one photo diode, such as infrared light.

Silicon (Si) has a higher light absorption coefficient on the short wavelength side; therefore, the upper surface absorbs a larger amount of short wavelength light with respect to the light entrance surface. In other words, the spectrum characteristics differ between the photo diode 1021 in the upper layer and the photo diode 1031 in the lower layer. More specifically, the photo diode 1031 in the lower layer has such spectrum characteristics where a peak lies on the long wavelength side in comparison with the photo diode 1021 in the upper layer as indicated in B in FIG. 22 (because the short wavelength is easily absorbed by the photo diode 1021 in the upper layer).

In case of the example in B in FIG. 22, a green color filter is provided below the on-chip lens. Accordingly, light entering the photo diode 1021 in the upper layer is green light. In this case, the short wavelength side is particularly absorbed while light is traveling through the inside of the photo diode 1021; therefore, light entering the photo diode 1031 in the lower layer shifts to the long wavelength side with respect to the upper layer.

Accordingly, when the signal value of the photo diode 1021 in the upper layer and the signal value of the photo diode 1031 in the lower layer are output without synthesis, signals of plural wavelength lights are produced for one pixel.

As discussed in Example 2, wavelength control may be further achieved by inserting a wavelength-dependent light absorber between photo diodes.

Figure 23:
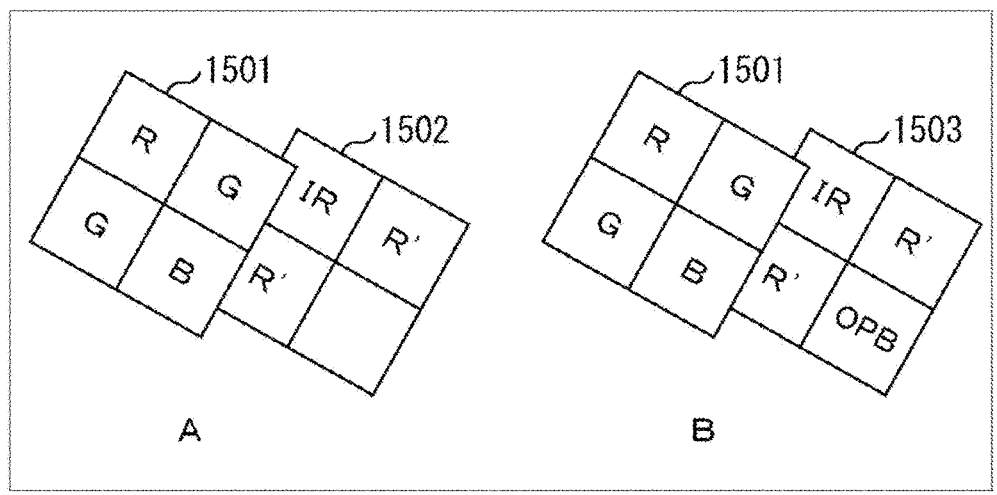
FIG. 23 is a figure illustrating an example of pixel arrangement.

In signal processing, obtaining data which contains plural spectra from one pixel offers great advantages. For example, visible light may be photoelectrically converted by the upper surface photo diode, and near infrared light may be photoelectrically converted by the lower surface photo diode. FIG. 23 illustrates an example of color arrangement. Initially, red (R), green (G), and blue (B) color filters are provided in A in FIG. 23. An upper surface photo diode (PD) 1501 photoelectrically converts components in the wavelength region (color) having passed through the color filters. A lower surface photo diode 1502 only receives components not absorbed by the upper surface photo diode 1501, and thus photoelectrically converts components in a longer wavelength region than the wavelength region of the light absorbed by the upper surface photo diode 1501. In case of the example in A in FIG. 23, a red (R) component is photoelectrically converted by the upper surface photo diode 1501 for a pixel corresponding to the red (R) filter, while an infrared (including near infrared) (IR) component is photoelectrically converted by the lower surface photo diode 1502 for the same pixel. On the other hand, a green (G) component is photoelectrically converted by the upper surface photo diode 1501 for a pixel corresponding to the green (G) filter, while a red (R') component is photoelectrically converted by the lower surface photo diode 1502 for the same pixel.

In this case, a blue (B) component is photoelectrically converted by the upper surface photo diode 1501 for a pixel corresponding to the blue (B) filter, while no photo diode is provided below the same pixel. This is because substantially no component of light enters the lower surface photo diode 1502 when only the blue component corresponding to a short wavelength enters the upper surface photo diode 1501.

Figure 24:
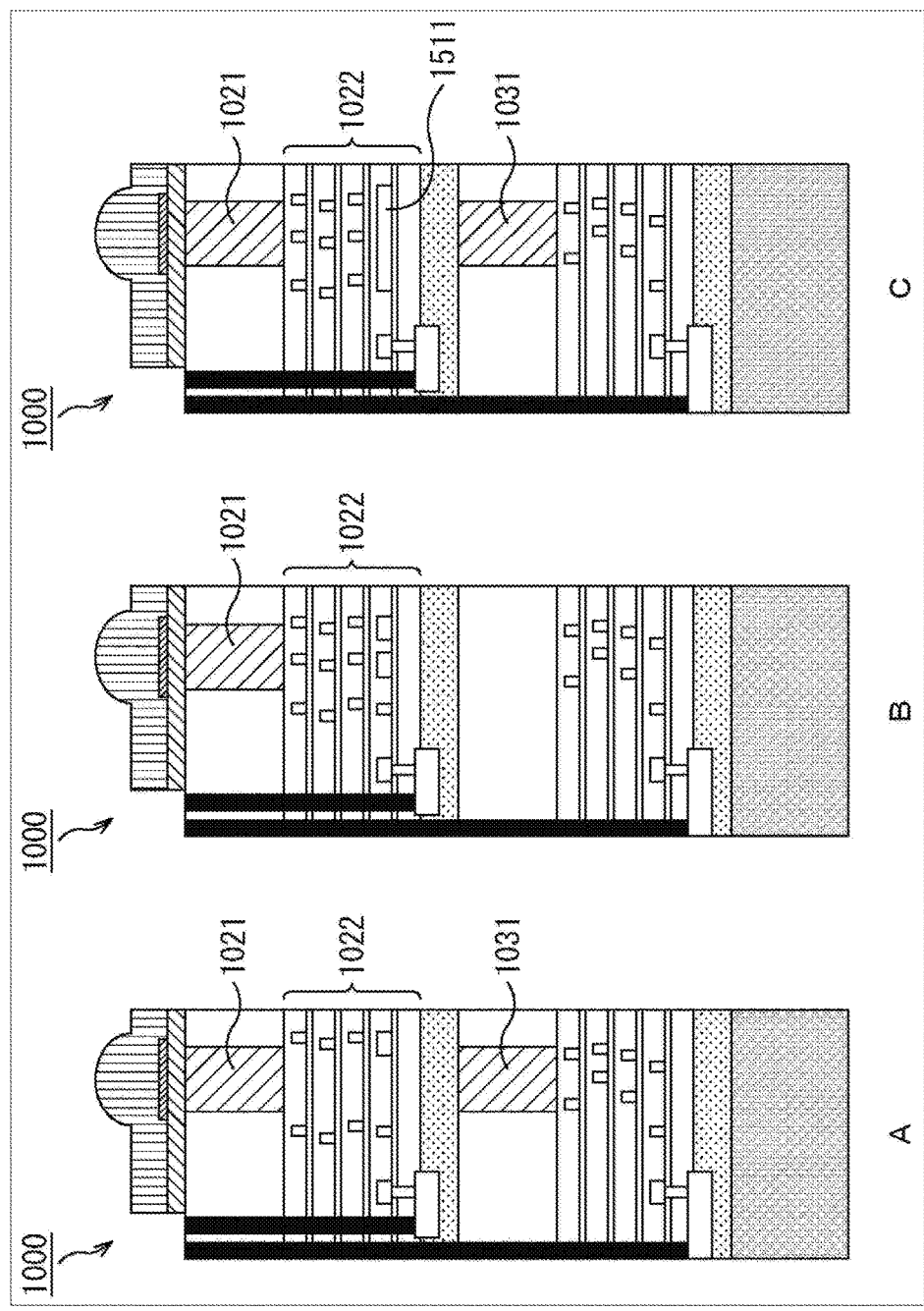
FIG. 24 is a figure illustrating a configuration example of a lower layer.

A larger number of wires may be provided between photo diodes as illustrated in B in FIG. 24, for example, instead of providing the lower surface photo diode 1502. Alternatively, (a part of pixels of) the lower surface photo diode 1502 may be used as OPB (optical black) as illustrated in B in FIG. 23, for example. In this case, the photo diode 1031 may be used as OPB by intentional and complete light shielding using a light shielding film 1511 or the like made of material not transmitting light as illustrated in C in FIG. 24, for example. The OPB provided within the pixel area allows estimation of a black level or a color mixture amount for each position.

Figure 25:
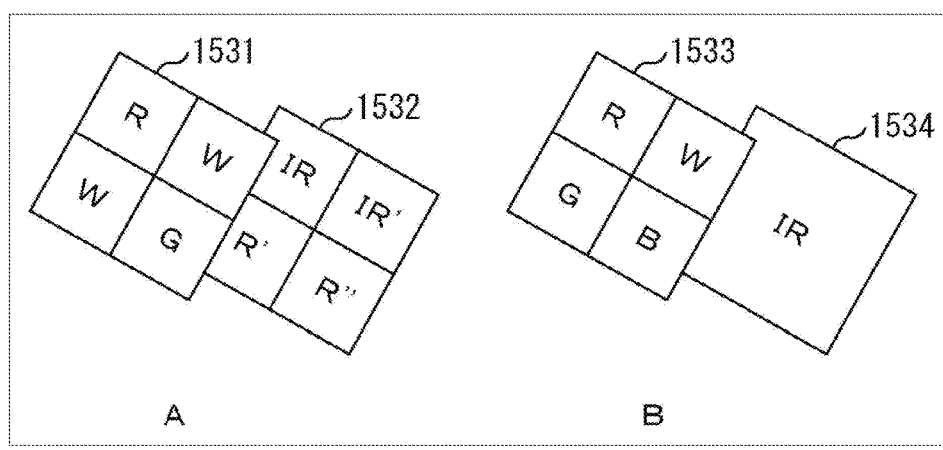
FIG. 25 is a figure illustrating another example of the pixel arrangement.

FIG. 25 illustrates another layout. Red (R), green (G), and white (W) color filters are provided in A in FIG. 25. A red (R) component is photoelectrically converted by an upper surface photo diode 1531 for a pixel corresponding to the red (R) filter, while an infrared (including near infrared) (IR) component is photoelectrically converted by a lower surface photo diode 1532 for the same pixel. A white (W) component (i.e., all components) is photoelectrically converted by the upper surface photo diode 1531 for a pixel corresponding to the white (all color transmission) (W) filter, while an infrared (IR') component or a red (R') component contained in incident light as a component not photoelectrically converted by the upper surface photo diode 1531 and having a long wavelength reaching the lower surface photo diode 1532 is photoelectrically converted by the lower surface photo diode 1532 for the same pixel. A green (G) filter is photoelectrically converted by the upper surface photo diode 1531 for a pixel corresponding to the green (G) filter, while a red (R") component is photoelectrically converted by the lower surface photo diode 1532 for the same pixel.

Figure 26:
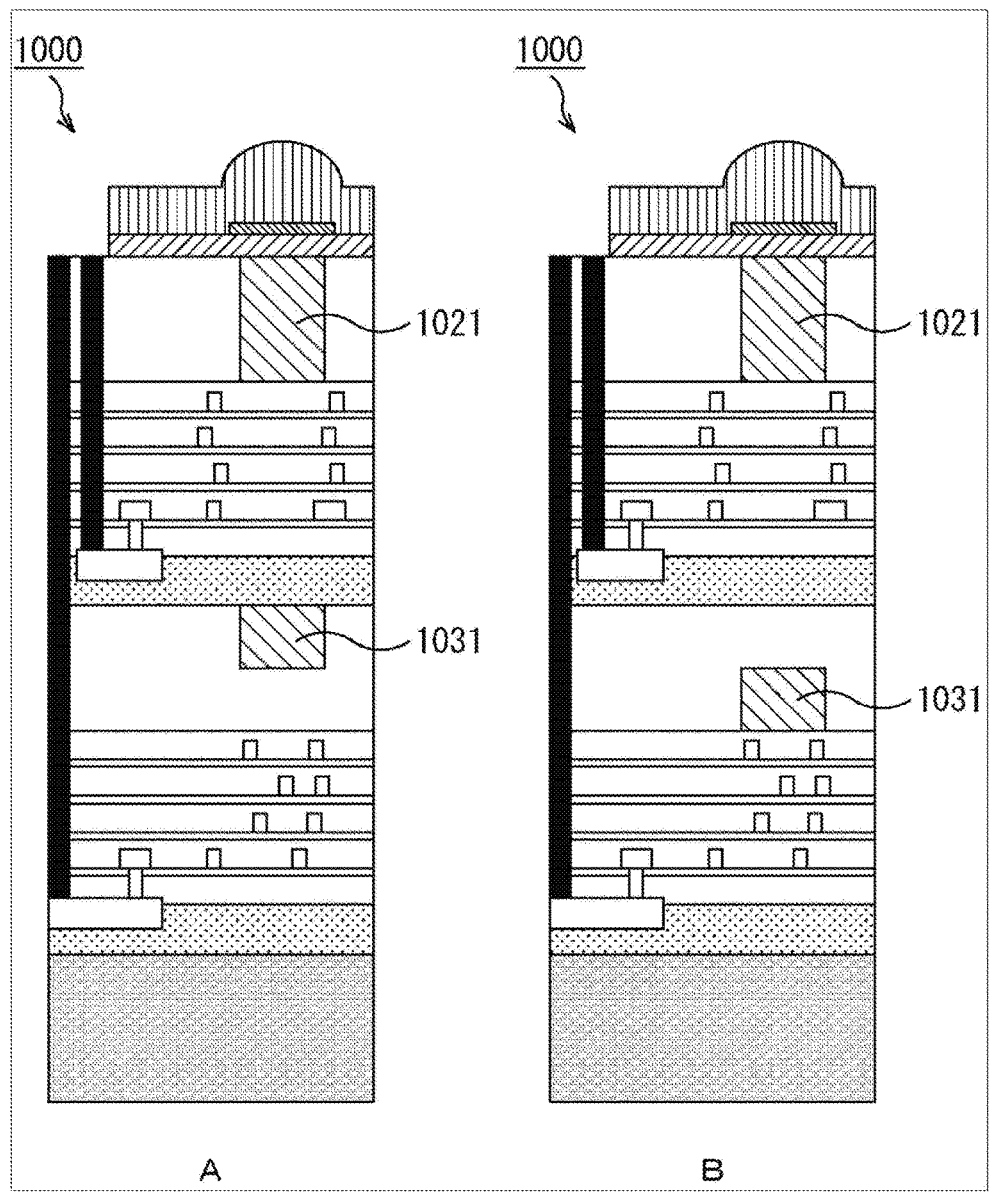
FIG. 26 is a figure illustrating an example of positions of formed photo diodes.

This example is characterized in that the same color of lights received by the photo diode in the upper surface (white in case of the example in A in FIG. 25) can be changed to different colors of lights when received by the photo diode in the lower surface (red and infrared in the example in A in FIG. 25). In this case, the wavelength may be controlled by using the light absorber or the like discussed in Example 2, or by changing the position of the photo diode as illustrated in the example in FIG. 26. (A longer wavelength component is more dominant as the depth of the silicon (Si) position becomes larger from the on-chip lens.)

The arrangement pattern of the colors of the color filters containing the white (W) color filter is not limited to the example in A in FIG. 25, but may be arbitrarily determined. In addition, the number of colors of the color filters may be arbitrarily determined, such as four or more. For example, as illustrated in B in FIG. 25, red (R), green (G), blue (B), and white (W) color filters may be provided. In this case, red (R), green (G), blue (B), and white (W) components are photoelectrically converted by the upper surface photo diode 1533 for each pixel.

On the other hand, components to be photoelectrically converted by the lower surface photo diode 1534 are only required to be contained in a longer wavelength region than the wavelength region of the components to be photoelectrically converted by the upper surface photo diode 1533. For example, as illustrated in B in FIG. 25, infrared (IR) components may be photoelectrically converted by the lower surface photo diode 1534 for all the pixels regardless of the colors of the color filters. The bands to be photoelectrically converted by the foregoing lower surface photo diode may be controlled based on the position, thickness and the like in the depth direction where the lower surface photo diode is formed, or controlled by a light absorber provided between the upper surface photo diode and the lower surface photo diode (in a wiring layer, for example).

Signals obtained from these photo diodes may be individually read and added as discussed above, or processed without addition for signal processing. The charge reading timing by the photo diode 1021 and the charge reading timing of the photo diode 1031 may be the same, or may be different from each other.

Figure 27:
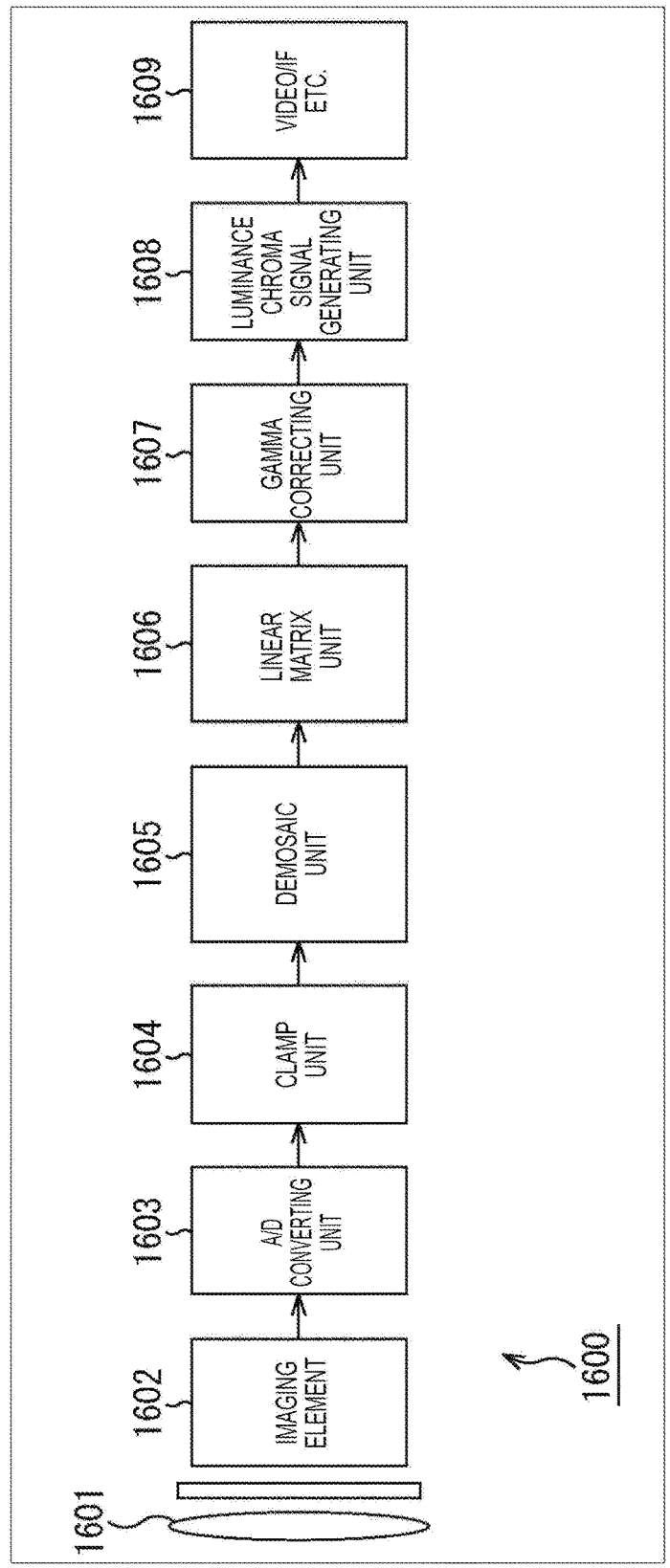
FIG. 27 is a block diagram illustrating an example of a chief configuration of an imaging device according to the present technology.

FIG. 27 illustrates an example of a block diagram realizing an imaging element according to the present technology. An imaging device 1600 illustrated in FIG. 27 images a subject, and outputs an image of the subject as electric signals (image data). As illustrated in FIG. 27, the imaging device 1600 includes a lens system 1601, an imaging element 1602, an A/D converting unit 1603, a clamp unit 1604, a demosaic unit 1605, a linear matrix unit 1606, a gamma correcting unit 1607, a luminance chroma signal generating unit 1608, and a video interface (IF) 1609.

A CMOS image sensor (such as CMOS image sensor 1000 or 1400) to which the present technology has been applied is applicable to the imaging element 1602 to obtain high sensitivity characteristics providing a plurality of spectra in the vertical direction for one pixel.

The A/D converting unit 1603 converts analog signals of an image of a subject photoelectrically converted by the imaging element 1602 into digital values. The clamp unit 1604 subtracts a black level from the digital data (image data) of the image of the subject supplied from the A/D converting unit 1603. The demosaic unit 1605 supplements the image data supplied from the clamp unit 1604 with color signals as necessary. The linear matrix unit 1606 increases color reproducibility and the like by applying linear matrix to the image data supplied from the demosaic unit 1605 as necessary. The gamma correcting unit 1607 executes gamma correction for naturalizing luminance expression of the image data supplied from the linear matrix unit 1606. The luminance chroma signal generating unit 1608 generates luminance signals and chroma signals from the image data supplied from the gamma correcting unit 1607. The video interface 1609 outputs the luminance signals and the chroma signals supplied from the luminance chroma signal generating unit 1608.

Example 5

Utilization and application example of the signal processing after individual extraction of signals in the manner discussed in Example 4 is now explained.

1. Color Reproducibility Improvement

For example, suppose that RGB are obtained by the upper surface photo diode, and that colors in different wavelength bands are obtained by the lower surface photo diode. In this case, the number of types of spectra (colors) usable for signal processing further increases. For example, spectra (colors) usable for imaging such as emerald as well as RGB may be added to improve color reproducibility. This method establishes a plurality of colors for the same pixel; therefore, color reproducibility improves without lowering the resolution.

When the number of usable pixels increases, input from the imaging element 1602 increases in the imaging device 1600 illustrated in FIG. 27. Accordingly, the number of coefficients allowed to be used by the linear matrix unit 1606 increases; therefore, color reproducibility improves.

For example, when wavelength components to be received (photoelectrically converted) are only R, G, and B, the linear matrix unit 1606 only applies linear matrix of a mode A shown in the following equation (1) (left side: values after linear matrix, right side: calculation formula).

[Mathematical Formula 1]

$$\text{Mode } A: \begin{pmatrix} R\_Im \\ G\_Im \\ B\_Im \end{pmatrix} = \begin{pmatrix} 1-\alpha-\beta & \alpha & \beta \\ \delta & 1-\gamma-\delta & \gamma \\ \varepsilon & \zeta & 1-\varepsilon-\zeta \end{pmatrix} \begin{pmatrix} R \\ G \\ B \end{pmatrix} \quad (1)$$

On the other hand, when emerald (E) is received (photoelectrically converted) as well as R, G and B, for example, the linear matrix unit 1606 applies linear matrix of a mode B indicated by the following equation (2).

[Mathematical Formula 2]

$$\text{Mode } B: \begin{pmatrix} R\_Im \\ G\_Im \\ B\_Im \end{pmatrix} = \quad (2)$$

$$\begin{pmatrix} 1-\alpha-\beta-\phi & \alpha & \beta & \phi \\ \delta & 1-\gamma-\delta-\theta & \gamma & \theta \\ \varepsilon & \zeta & 1-\varepsilon-\zeta-\Omega & \Omega \end{pmatrix} \begin{pmatrix} R \\ G \\ B \\ E \end{pmatrix}$$

In this case, the number of coefficients allowed to be used increases. Accordingly, output having a higher degree of freedom is obtained after linear matrix; therefore, color reproducibility is expected to improve.

2. Light Source Estimation Accuracy Improvement (Imaging Device)

According to an imaging device like a camera, such a method has been widely used which estimates surrounding lighting at the time of imaging (such as fluorescent light, incandescent light, and white LED), and performs imaging in accordance with lighting (change of color target, for example). However, with rise in the number of new types of light sources such as white LED (Light Emitting Diode), the level of difficulty in estimating the type of the light source has been rising.

According to the CMOS image sensor 1000 discussed above, RGB are obtained by photoelectric conversion using the upper surface photo diode 1021, and color components in different wavelength bands are obtained by photoelectric conversion using the lower surface photo diode 1031. When the light source is difficult to be estimated only based on signal values obtained by the upper surface photo diode 1021, the light source may be estimated based on signal values obtained by the lower surface photo diode 1031. This method increases the accuracy of light source estimation.

For example, suppose that conventional light source estimation is carried out based on output ratios of R/G and B/G, for example. When a light source 1 and a light source 2 having different light source output spectra are used, different values are not necessarily obtained for R/G and B/G. The output is not obtained for each light wavelength, but obtained as an integral factor determined by multiplication of spectrum characteristics of a sensor and a light source. Accordingly, when integral values are the same, distinction between different outputs for respective wavelengths is difficult. According to the present technology, however, additional spectrum characteristics are obtained by the lower surface photo diode. Thus, the characteristics of R/IR may be different for the lower surface even when R/G and B/G are equivalent for the upper surface, for example. In this case, the accuracy of light source estimation increases. In addition, a plurality of colors are established for the same pixel. Accordingly, this improvement is realized without lowering the resolution.

3. Application to Medical Equipment

The use of wavelengths including near infrared wavelength is also started in the medical field as wavelength regions expected to improve analysis accuracy and the like. However, problem such as low infrared sensitivity are arising as discussed above.

For example, there is a method for hemoglobin analysis based on information about a plurality of wavelengths. A method disclosed in Japanese Patent No. 2932644, for example, measures absorptivity changes in respective wavelengths by applying light in different two pairs of wavelength groups to biological tissues in a near infrared region where an absorptivity change with a change from oxygenation to deoxygenation of hemoglobin and an absorption change with an oxidization-reduction state change of cytochrome oxidase are both produced. Then, this method calculates a hemoglobin amount fluctuation only based on a light absorption coefficient of oxygenation type hemoglobin and a light absorption coefficient of deoxygenation type hemoglobin in the respective wavelengths as light absorption coefficients on the assumption that light absorptivity changes in the respective wavelength groups are all dependent on oxygenation-deoxygenation, and calculates a fluctuation amount of cytochrome oxidase based on the difference between hemoglobin amount fluctuation calculation values of the two pairs of wavelength groups.

According to this method, one wavelength is analyzed for one pixel. Accordingly, this method requires irradiation of a plurality of wavelength lights, or use of a plurality of near infrared pixels. In this case, miniaturization of an imaging element and an imaging device is difficult.

Figure 28:
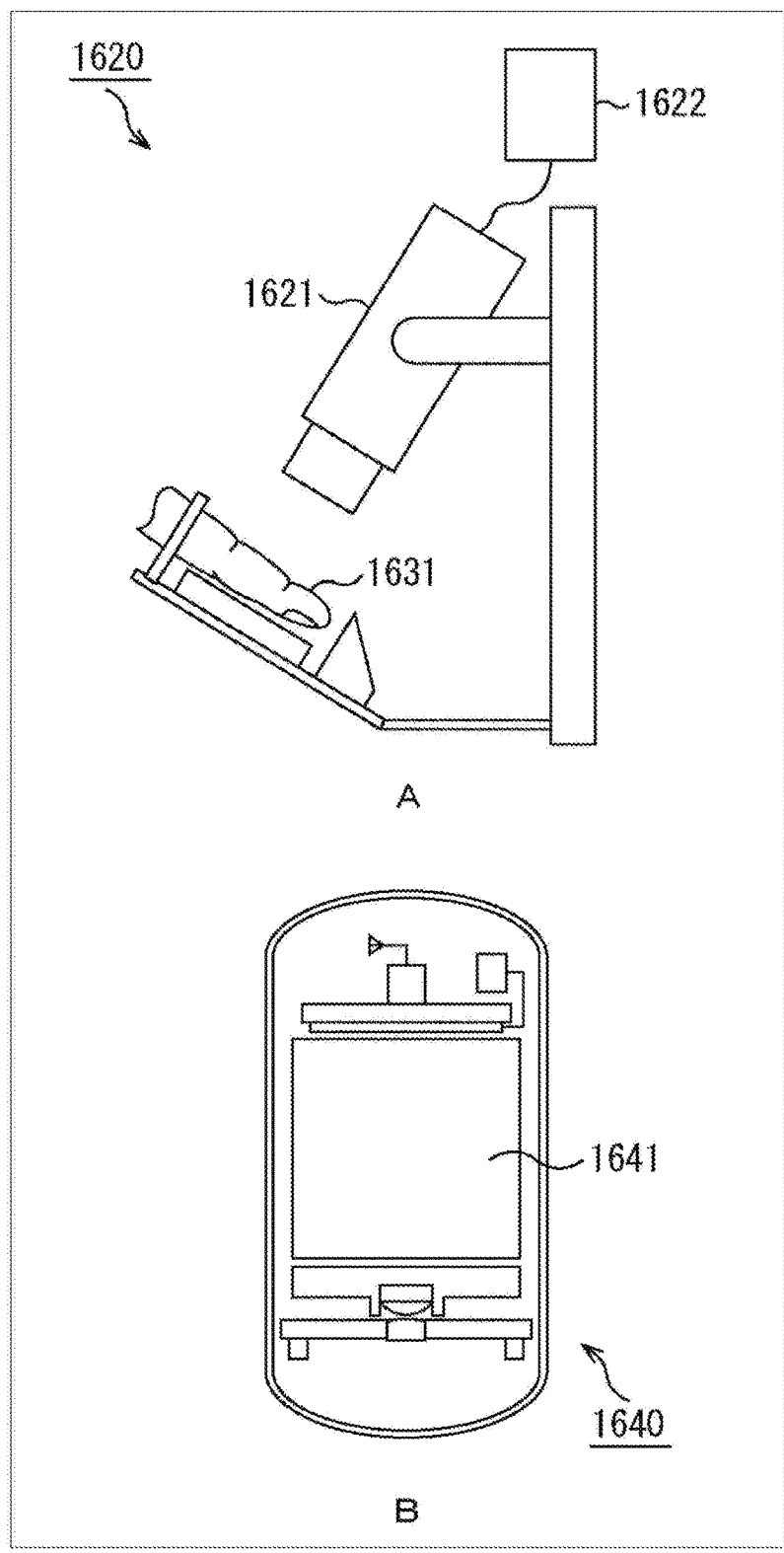
FIG. 28 is a figure illustrating an example of application to medical equipment.

When the present technology is applied to medical equipment as illustrated in FIG. 28 (such as healthcare device, capsule endoscope, and DNA chip), output of a plurality of wavelength components for a single pixel is obtained from single light.

A healthcare device 1620 illustrated in A in FIG. 28 includes an imaging device 1621 and an analyzing device 1622. The imaging device 1621 images a human body 1631 (such as finger) corresponding to a specimen, and detects signals of plural wavelength lights as discussed above. The analyzing device 1622 obtains predetermined analysis on medical treatment such as hemoglobin analysis.

A capsule endoscope 1640 illustrated in B in FIG. 28 is a small-sized device swallowed by an examinee or the like for imaging a state of the human body within the body. The capsule endoscope 1640 contains an imaging device 1641.

The imaging device 1600 (FIG. 27) to which the present technology has been applied is used as an imaging device for these systems. These systems allow a simultaneous acquisition of wavelength dependency while maintaining high resolution. The obtained wavelength dependency may be used for healthcare and pathology analysis such as hemoglobin analysis discussed above.

Moreover, according to the present technology capable of providing a plurality of optical characteristics for one pixel, optical characteristics are more securely obtained even in optical characteristics analysis for molecules and DNA where the molecule size is contained in a single pixel. (Plural spectra for the same molecule are obtained by the same pixel.)

4. Application to ToF

There is a method called ToF (Time of Flight) for obtaining depth information using infrared light or the like (for example, see Japanese Patent Application Laid-Open No. 2012-49547). When the present technology is applied to this method, the degree of accuracy increases.

Figure 29:
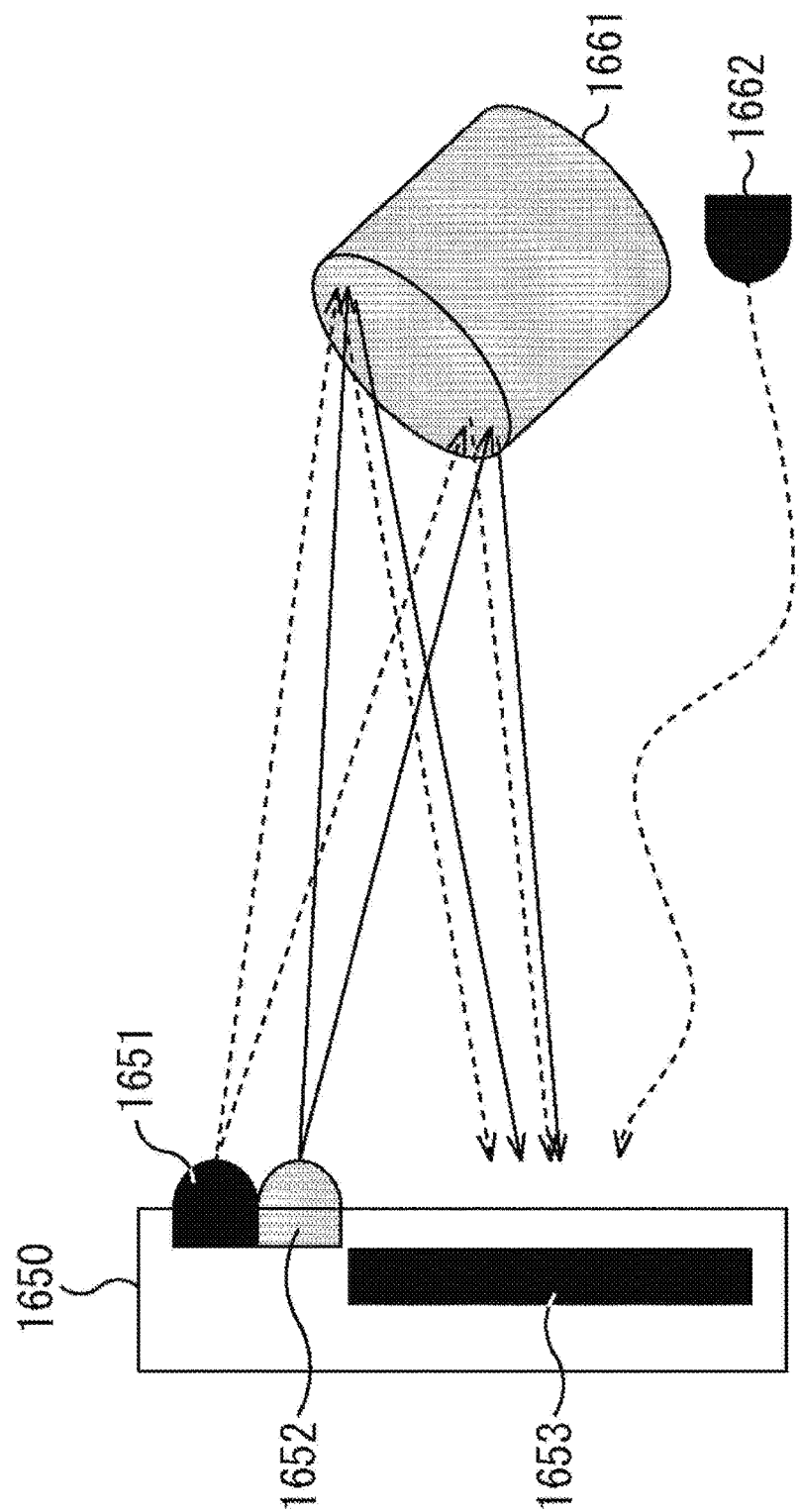
FIG. 29 is a figure illustrating an example of application to ToF.

An electronic device 1650 illustrated in FIG. 29 includes an infrared light irradiating unit 1651 and infrared light irradiating unit 1652 for irradiating different wavelength infrared lights. When plural different wavelength infrared lights are applied to a measurement target 1661, distance measurement is more securely achieved by obtaining output in one of the wavelength bands even in such a case where the other wavelength band is not measured by a large quantity of noise superimposed on the other wavelength band by the effect of external light (noise source 1662).

When the present technology is applied to an imaging element 1653 of the electronic device 1650, a plurality of infrared lights are sampled for one pixel. Accordingly, improvement of accuracy is expected without lowering the resolution.

5. Elimination of IR Cut Filter

There may be a case where elimination of an IR cut filter is needed for the purpose of receiving infrared light (IR), cost advantages, height reduction and others. In addition, insertion ON/OFF of an IR cut filter (IRCF) may be switched by using a mechanical unit within a module. According to a layout illustrated in A in FIG. 30, RGB output containing IR is obtained by an upper surface PD 1671, while the remaining IR components are output by a lower surface PD 1672. In this case, IR components are reduced or removed by subtracting output of the lower PD 1672 from the output of the upper surface PD 1671. At the time of removal, individual outputs may be multiplied by correction coefficients, or calculation such as linear matrix may be performed using infrared information on other colors and the like.

Figure 30:
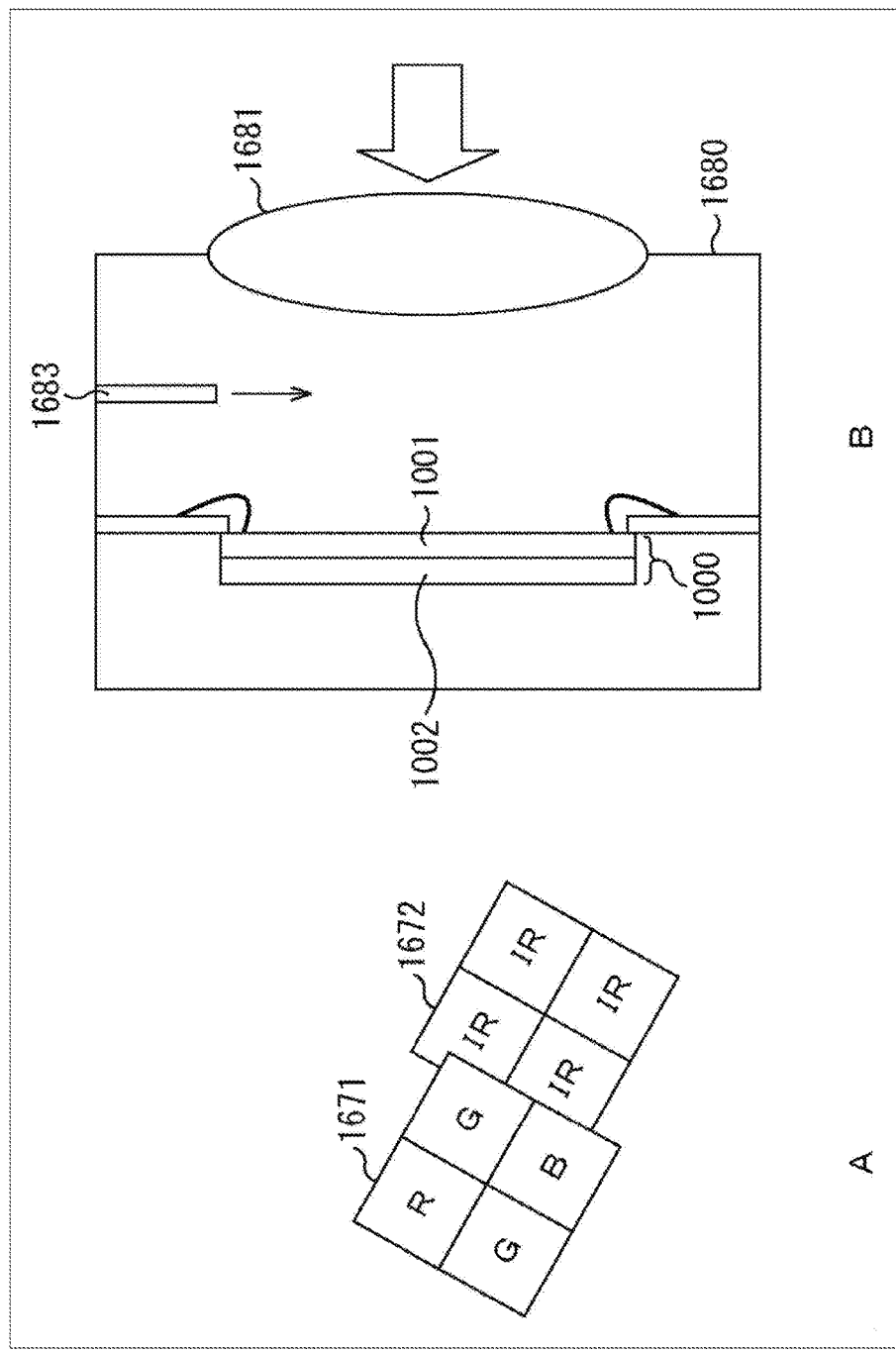
FIG. 30 is a figure illustrating an example of application to an imaging module.

As illustrated in B in FIG. 30, an imaging module 1680 including the CMOS image sensor 1000 as an imaging element is configured to control insertion of an IR cut filter (IRCF) 1683 using a mechanical unit. Light enters the imaging module 1680 via a condensing lens 1681.

While the IR cut filter 1683 is inserted, the infrared component of the incident light is cut off. Accordingly, light components not absorbed by the RGB on the upper surface are photoelectrically converted by the lower surface diode. In this case, the output from the upper surface PD and the output from the lower surface PD may be synthesized.

On the other hand, when the IR cut filter is absent, the infrared component enters both the upper surface PD and the lower surface PD. In this case, the rate of the infrared component entering the lower surface photo diode is higher. Accordingly, the output from the lower surface PD may be subtracted from the signal from the upper surface PD as discussed above. As can be understood, the control method may be switched in accordance with the condition of the IR cut filter 1683.

Example 6

The upper surface PD and the lower surface PD not only have different wavelength peaks, but also provide different outputs. When the charge accumulation time and the photo diode design are the same, the output from the lower surface photo diode is lower than that from the upper surface photo diode. This is because only light not absorbed by the upper surface photo diode enters the lower surface photo diode. Based on this difference, imaging may be performed by using the value of the lower surface photo diode at the time of saturation of the upper surface photo diode. More specifically, charges may be initially read from the upper surface diode, and then may be read from the lower surface diode at the time of saturation of the upper surface diode (excess of predetermined threshold, for example). In this case, the wavelength peaks of the spectra are different as discussed in conjunction with the example in B in FIG. 22; therefore, it is preferable that different coefficients of linear matrix are used for the upper surface PD and for the lower surface PD.

Figure 31:
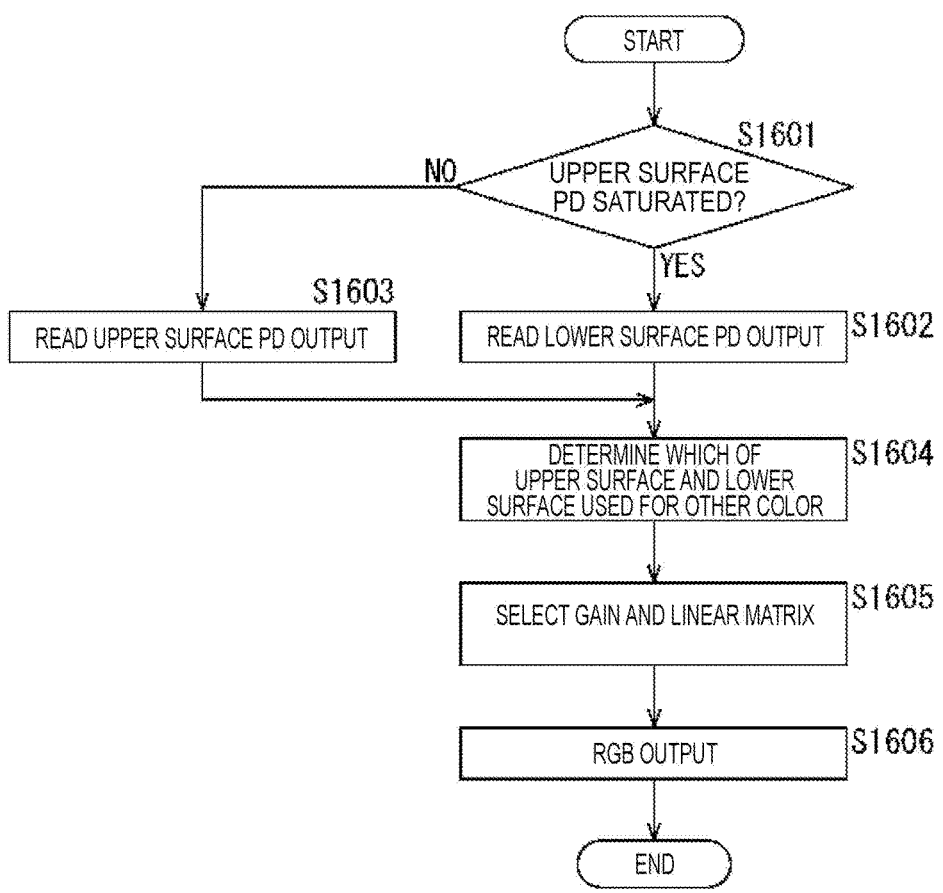
FIG. 31 is a flowchart showing a flow example of an imaging process.

FIG. 31 shows a flow example at the time of selection of linear matrix.

In step S1601, the linear matrix unit 1606 obtains upper surface PD output, determines whether or not the upper surface PD output is saturated based on the value, and determines which of the upper surface PD and the lower surface PD is used based on the determination result.

When it is determined that the upper surface PD output is saturated, the process proceeds to step S1602.

In step S1602, the linear matrix unit 1606 allows read of the lower surface PD output, and obtains image data created based on the output from the demosaic unit 1605. After completion of the process in step S1602, the process proceeds to step S1604.

When it is determined that the upper surface PD output is not saturated in step S1601, the process proceeds to step S1603. In step S1603, the linear matrix unit 1606 allows read of the upper surface PD output, and obtains image data created based on the output from the demosaic unit 1605. After completion of the process in step S1603, the process proceeds to step S1604.

In step S1604, the linear matrix unit 1606 determines which of the upper surface and the lower surface is used for other colors.

In step S1605, the linear matrix unit 1606 selects linear matrix in accordance with the determination result. This is because the optimum value varies with combinations of spectrum characteristics of assumed pixels.

The linear matrix unit 1606 multiplies the image data by the selected linear matrix to improve color reproducibility and the like, and allows execution of gamma correction. Then, the linear matrix unit 1606 generates luminance signals and color difference signals, and outputs these signals from the video interface (IF) 1609 in step S1606.

The sensitivity difference between the upper surface and the lower surface may be controlled based on control of incident light by light shielding using a light absorber or a wiring layer as described in Example 2, or control of the amount of photoelectric conversion by individual control of charge accumulation time. Alternatively, correction of the sensitivity difference for each color may be executed based on accumulation time. (the output from the lower surface PD decreases as the wavelength of light entering the upper surface PD is shorter; therefore, correction is made based on accumulation time so as to eliminate wavelength dependency.)

Figure 32:
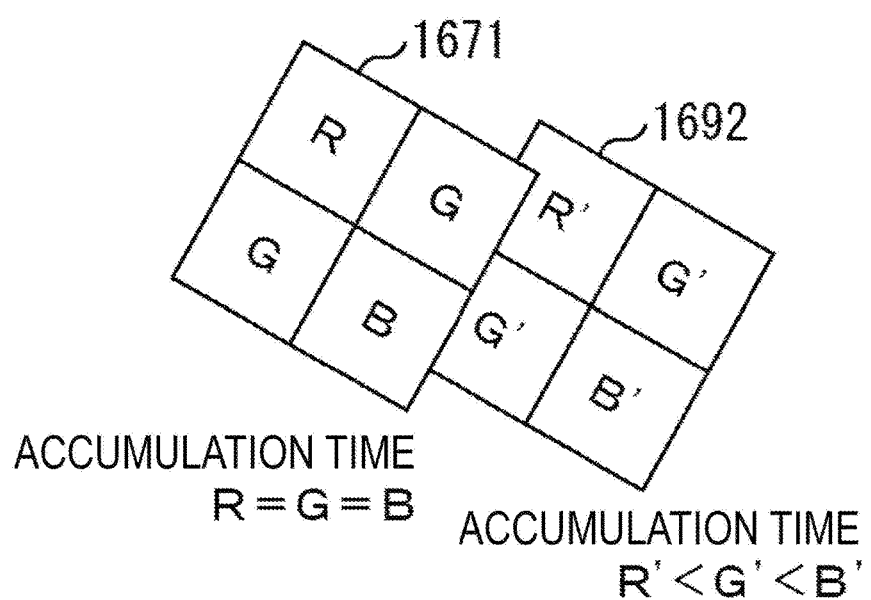
FIG. 32 is a figure illustrating a further example of the pixel arrangement.

FIG. 32 illustrates this example. In case of the example illustrated in FIG. 32, the accumulation time is uniform for each color of RGB (accumulation time R'=G'=B') for the upper surface PD 1671. However, the accumulation time different for each of R', G', and B' (accumulation time R'<G'<B') is set for the lower surface PD 1692.

This method sets the sensitivity of the lower surface photo diode 1692 (light amount difference/accumulation time difference) to 1/16 of the corresponding sensitivity of the upper surface photo diode 1671, for example. In this case, 16 times larger amount of light (light entering on-chip lens) can be received by the lower surface even when the upper surface is saturated. Accordingly, the dynamic range expands to 16 times wider.

When the upper surface photo diode 1671 is saturated at the time of reading in signal processing, the lower surface photo diode 1672 is selected. The light amount difference and the sensitivity difference may be adjusted by varying gains and linear matrix so that color components and luminance components do not change after combination of the signals of the upper surface photo diode 1671 and the signals of the lower surface photo diode 1672.

Figure 33:
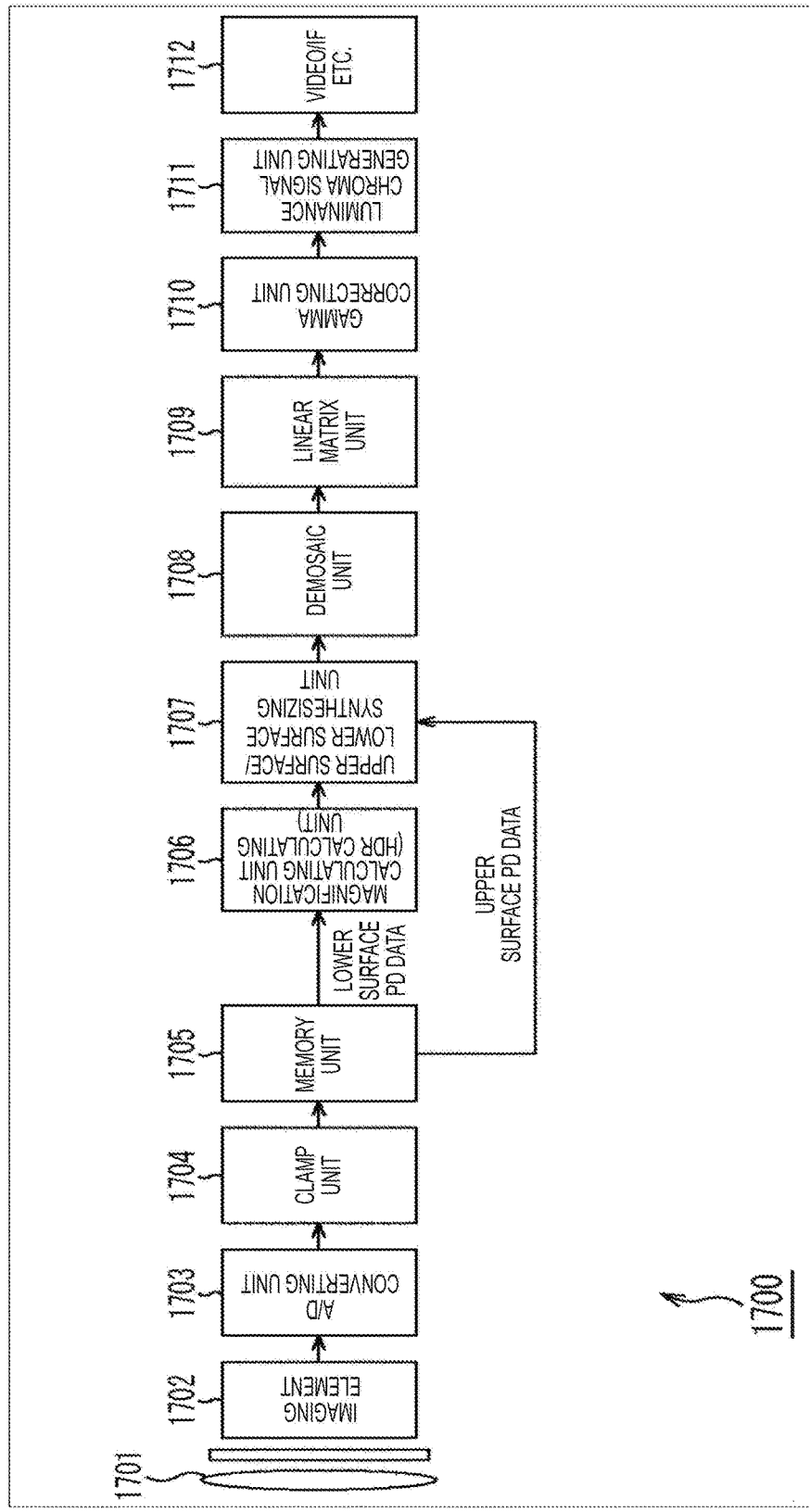
FIG. 33 is a block diagram illustrating another configuration example of the imaging device according to the present technology.

The magnification of the light amount difference may be arbitrarily determined by the foregoing method. FIG. 33 illustrates an example of a chief configuration of an imaging device when HDR is executed.

An imaging device 1700 illustrated in FIG. 33 images a subject, and outputs an image of the subject as electric signals (image data). As illustrated in FIG. 33, the imaging device 1700 includes a lens system 1701, an imaging element 1702, an A/D converting unit 1703, a clamp unit 1704, a memory unit 1705, a magnification calculating unit (HDR calculating unit) 1706, an upper surface/lower surface synthesizing unit 1707, a demosaic unit 1708, a linear matrix unit 1709, a gamma correcting unit 1710, a luminance chroma signal generating unit 1711, and a video interface (IF) 1712.

In other words, in comparison with the imaging device 1600 (FIG. 27), the imaging device 1700 additionally includes the memory unit 1705, the magnification calculating unit 1706, and the upper surface/lower surface synthesizing unit 1707 as well as the lens system 1701 to clamp unit 1704, and the demosaic unit 1708 to the video interface (IF) 1712 corresponding to the lens system 1601 to the video interface (IF) 1609 of the imaging device 1600, respectively.

The memory unit 1705 stores each of upper surface PD output and lower surface PD output. The magnification calculating unit 1706 multiplies output data of the lower surface PD by a gain of the sensitivity difference between the lower surface PD and the upper surface PD. The upper surface/lower surface synthesizing unit 1707 synthesizes output data of the upper surface PD and output data of the lower surface PD multiplied by the gain. According to this process, there are choices including the use of the lower surface PD output at the time of saturation of the upper surface PD output as discussed in conjunction with FIG. 31, for example.

Selection may be made based on a threshold or a reference (threshold) for other color pixels rather than saturation. Then, the demosaic unit 1708 supplements color signals as necessary, while the linear matrix unit 1709 applies linear matrix. It is preferable that the linear matrix applied herein is varied according to which of the upper surface PD and the lower surface PD is used and how the selected surface PD is used for the respective colors (because spectrum characteristics are different between the upper surface and the lower surface). More specifically, the linear matrix is selected based on the flow discussed in conjunction with FIG. 31.

The linear matrix unit 1709 applies linear matrix in the mode A shown in Equation (1) when the pixels of the upper surface PD (R, G, B) are used for all components, and changes the values of the linear matrix to a mode C shown in Equation (3) when the pixel (G') of the lower surface PD is used only for G, for example.

[Mathematical Formula 3]

$$\text{Mode } C: \begin{pmatrix} R\_Im \\ G\_Im \\ B\_Im \end{pmatrix} = \begin{pmatrix} 1-\alpha'-\beta' & \alpha' & \beta' \\ \delta' & 1-\gamma'-\delta' & \gamma' \\ \varepsilon' & \zeta' & 1-\varepsilon'-\zeta' \end{pmatrix} \begin{pmatrix} R \\ G' \\ B \end{pmatrix} \quad (3)$$

Example 7

The advantage of accuracy increase is offered by combining the method of ToF (Time of Flight) (for example, see Japanese Patent Application Laid-Open No. 2012-49547) for obtaining depth information using infrared light and the like as discussed above.

Figure 34:
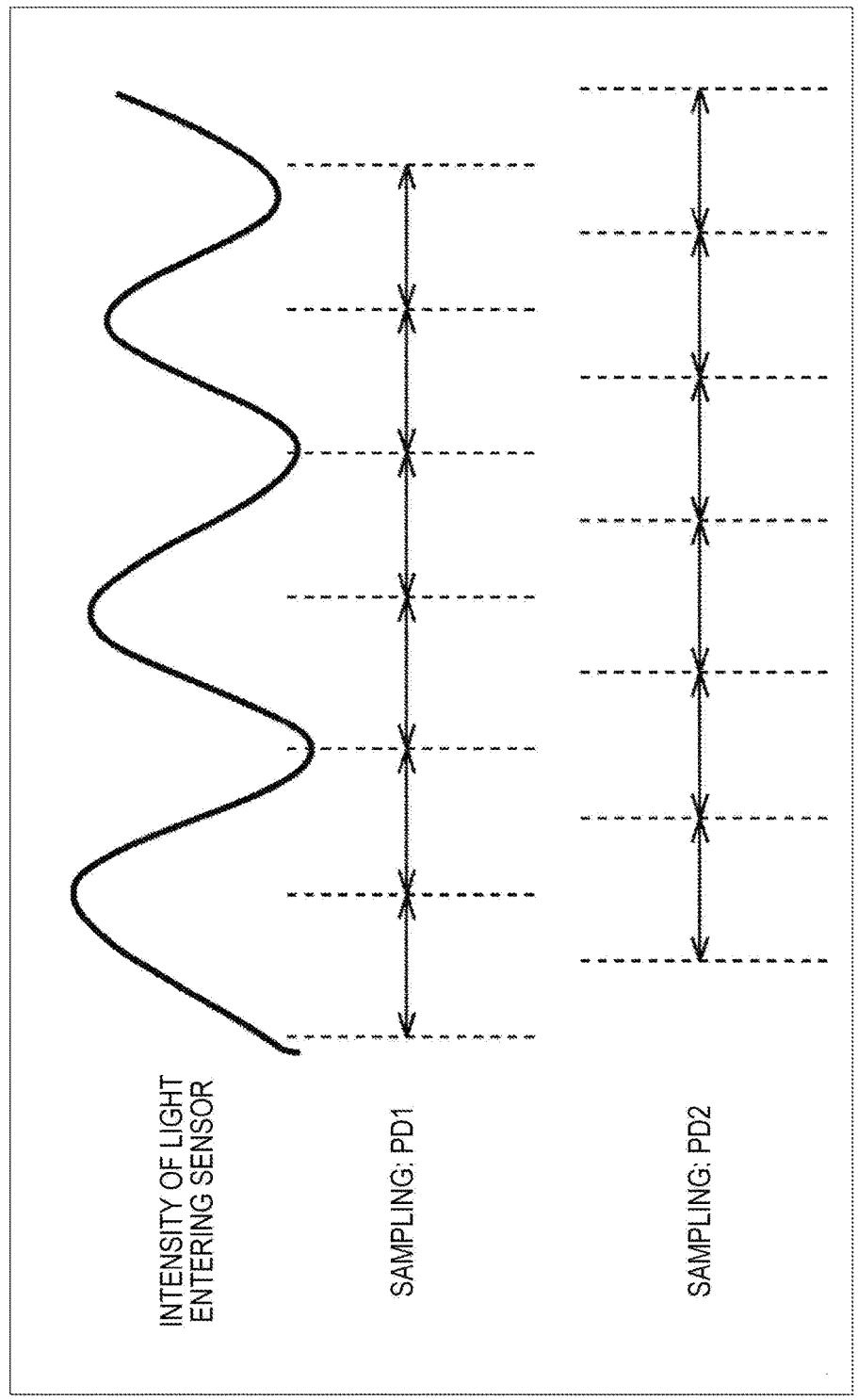
FIG. 34 is a figure illustrating an example of sampling intervals.

For example, the accuracy increases even when the light emission wavelength is one wavelength in the example shown in FIG. 29. ToF is a method which applies LED in one wavelength band to a subject, and measures a distance by capturing a phase difference of light reflected at that time. In this case, ToF applies LED while varying the light emission intensity in time series, and determines the distance based on a phase condition at the time of entrance of light applied to the subject into an imaging element. As illustrated in FIG. 34, the number of sampling in time series increases by varying shutter timing for light receiving upper and lower PDs (PD1 and PD2), thereby increasing the accuracy while maintaining the resolution. Moreover, increase in the number of sampling contributes determination of a dynamic subject.

The advantage of accuracy increase is similarly provided by using other depth determination methods as well as ToF. For example, this method is applicable to a distance detection system which projects infrared light as disclosed in US Patent "US 2010/0118123 A1". More specifically, lights are individually received by using a plurality of photo diodes provided for the same pixel while reducing effect of external light by using a light source emitting a larger number of wavelength types. In this case, even when a noise source is produced by the external light in one of the wavelength bands, positions can be measured in the other bands. Moreover, the present technology which includes a transfer gate and a wiring layer for each photo diode is allows shutter timing to be individually varied. Accordingly, the present technology is also appropriate for a dynamic subject, as a technology capable of handling a dynamic subject while maintaining the resolution by shifting sampling timing and obtaining plural sets of information on timing for one pixel.

Example 8

Figure 35:
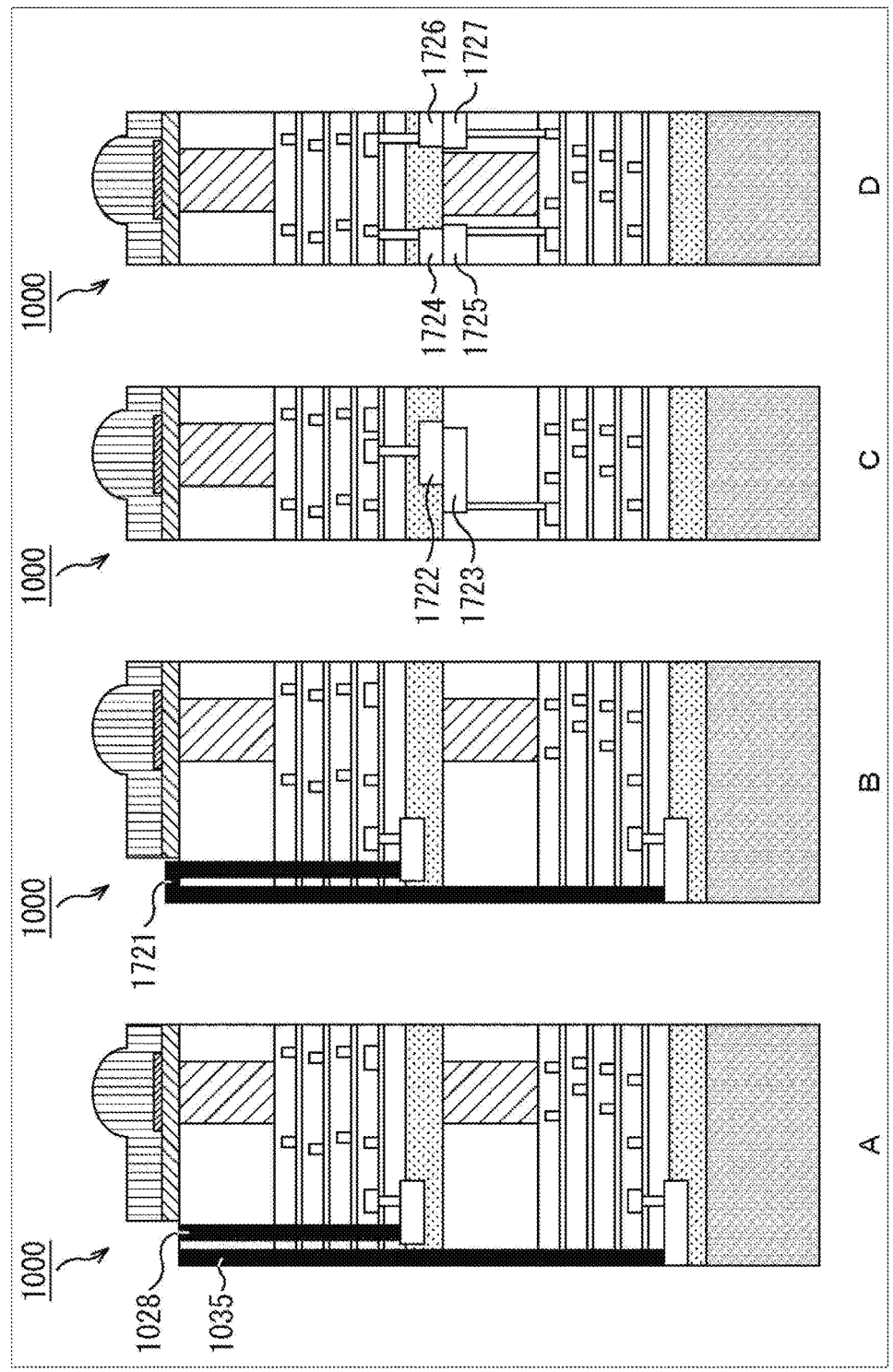
FIG. 35 is a figure illustrating a configuration example of electrode connection.

The upper surface photo diode and the lower surface photo diode may include different wiring layers as illustrated in A in FIG. 35. However, the wiring layer for driving may be shared with each other. For example, the wiring layer of the support substrate may be used for driving the upper surface photo diode. This is a method disclosed in Japanese Patent Laid-Open No. 2011-204915, for example. This method reduces the thickness of the wiring layer between the upper surface photo diode and the lower surface photo diode, and allows entrance of light into the lower surface photo diode with smaller optical losses.

The wire connection method may be a method disclosed in Japanese Patent Application Laid-Open No. 2011-204915 as illustrated in B in FIG. 35, for example. Alternatively, blue color may be used as a connecting electrode extraction portion (C in FIG. 35, for example) based on the fact that the sensitivity of the lower surface photo diode below the blue color filter is not expected as discussed above. Sharing electrodes within the pixel area can reduce the chip size. Moreover, as illustrated in D in FIG. 35, for example, an element division area may be used as an electrode extraction portion. In this case, a contact and an electrode are disposed around the optical path of the pixels. Accordingly, this configuration produces barrier for color mixture with adjacent pixels, thereby contributing to color mixture improvement.

Example 9

The color filter 1026 included in the structure of the CMOS image sensor 1000 illustrated in FIG. 12 may be replaced with an organic photoelectric conversion film, for example. A green component, for example, is extracted by photoelectric conversion using the organic photoelectric conversion film. The light transmitted from the organic photoelectric conversion film contains blue and red components. The wavelength bands of blue and red are separated; therefore, blue and red are easily separated into individual components by the upper surface diode and the lower surface diode. Accordingly, excellent color reproducibility is realized by easy separation of spectra for each color. In addition, a reading electrode or the like is not disposed beside the photo diode as described in Japanese Patent Application Laid-Open No. 2011-29453. In this case, the area of the photo diode increases; therefore, the number of saturated electrons and sensitivity improve. Furthermore, the necessity for excavating silicon is eliminated in positioning the gate electrode. Accordingly, dark current, white spots and the like are not generated by damages given to an Si substrate caused by etching.

An example as an electronic device is now described.

Example 10

The use of wavelengths including near infrared wavelength is also started in the medical field as wavelength regions expected to improve analysis accuracy and the like. However, problems such as low infrared sensitivity are arising as discussed above. Moreover, one wavelength is analyzed for by pixel in conventional methods; therefore, irradiation of light of a plurality of wavelengths, or use of a plurality of near infrared pixels is required in a method for analyzing hemoglobin based on information about a plurality of wavelengths (method described in Japanese Patent No. 2932644, for example). In this case, miniaturization of imaging elements and imaging devices becomes difficult.

When the present technology is applied to medical equipment illustrated in FIG. 28 (such as healthcare device, capsule endoscope, and DNA chip), output of plural wavelength components for a single pixel is obtained from single light. In other words, this method allows a simultaneous acquisition of wavelength dependency while maintaining high resolution. The obtained wavelength dependency may be used for healthcare and pathology analysis such as hemoglobin analysis discussed above.

Moreover, according to the present technology capable of providing a plurality of optical characteristics for one pixel, optical characteristics are more securely obtained even in optical characteristics analysis for molecules and DNA where the molecule size is contained in a single pixel. (Plural spectra for the same molecule are obtained by the same pixel.)

Example 11

Figure 36:
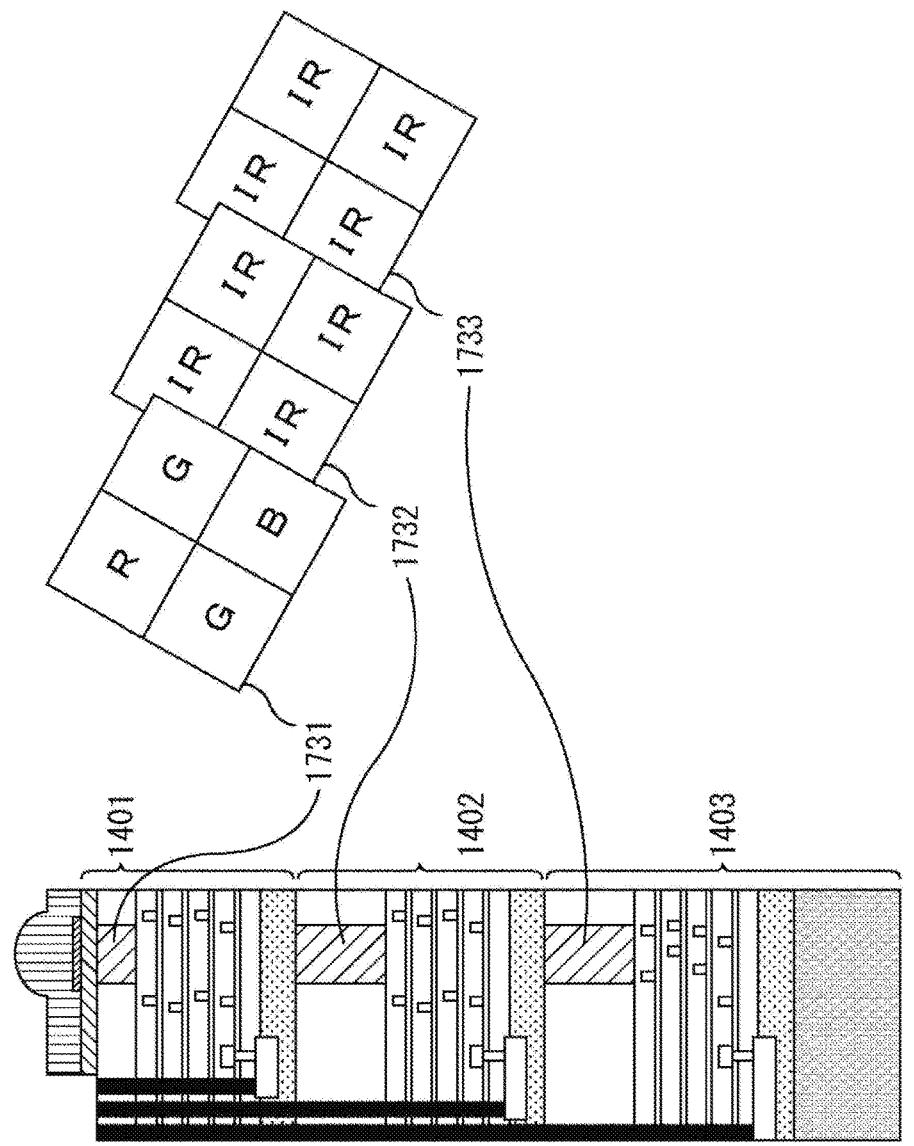
FIG. 36 is a figure illustrating a still further example of the pixel arrangement.
Figure 37:
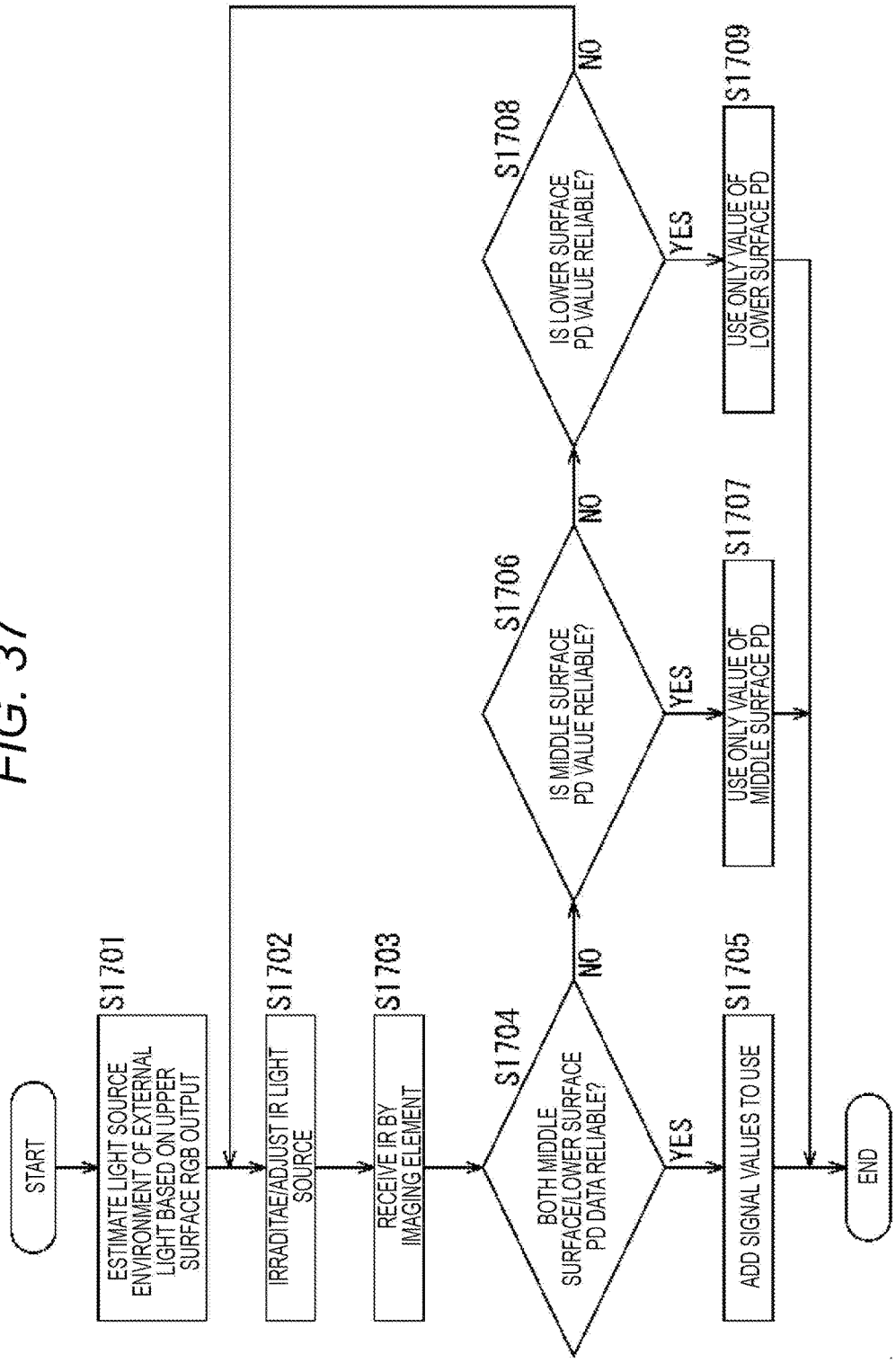
FIG. 37 is a flowchart showing a flow example of a control process.

FIG. 36 illustrates an example of color arrangement of the CMOS image sensor 1400 having triple-layer photo diode structure illustrated in FIG. 21. This imaging element may be incorporated into the structure illustrated in B in FIG. 30 where insertion or non-insertion of the IR cut filter is selectable. According to the arrangement example illustrated in FIG. 36, an upper surface PD 1731 is designed to receive RGB light as a conventional structure, and a middle surface PD 1732 and a lower surface PD 1733 are designed to receive IR light. The CMOS image sensor 1400 thus constructed is applicable to the imaging element 1702 of the imaging device 1700 illustrated in FIG. 33. In this case, the memory unit 1705 stores respective data of output from the upper surface PD 1731, output from the middle surface PD 1732, and output from the lower surface PD 1733. The upper surface/lower surface synthesizing unit 1707 synthesizes the respective data of the output from the upper surface PD 1731, the output from the middle surface PD 1732, and the lower surface PD 1733. The upper surface/lower surface synthesizing unit 1707 also controls processes required for the synthesis and executed by other processing units. When depth information is desired by using infrared light in the imaging device 1700 (FIG. 33) thus constructed, for example, processes are executed in accordance with a signal processing flow example shown in FIG. 37.

After the start of the process, the upper surface/lower surface synthesizing unit 1707 obtains output of RGB from the upper surface PD 1731 of the imaging element 1072 (CMOS image sensor 1400), and estimates external light under which a subject (detection target) is placed in step S1701.

In step S1702, the upper surface/lower surface synthesizing unit 1707 determines IR light applied from a not-shown IR light irradiating unit to the subject based on the estimation result obtained in step S1701. The IR light to be applied herein is applied from the electronic device 1650 illustrated in FIG. 29 to the subject. For example, the intensity of the IR light is raised when the external light is intensive. Alternatively, the ratios of the respective infrared lights illustrated in FIG. 29 are varied in accordance with the color temperature of the surrounding light source.

In step S1703, the imaging element 1702 images the subject using the optimum IR light applied in step S1703, and receives the IR light by the middle surface PD 1732 and the lower surface PD 1733.

In step S1704, the upper surface/lower surface synthesizing unit 1707 individually reads the intensities of lights received by the middle surface PD 1732 and the lower surface PD 1733 from the memory unit 1705, and determines whether or not the respective values are reliable values (for example, determines whether these values contain much noise produced by external light). When it is determined that both the output from the middle surface PD 1732 and the output from the lower surface PD 1733 are reliable, the process proceeds to step S1705.

In step S1705, the upper surface/lower surface synthesizing unit 1707 synthesizes the output from the middle surface PD 1732 and the output from the lower surface PD 1733.

When it is determined that it is difficult to rely on both the output from the middle surface PD 1732 and the output from the lower surface PD 1733 in step S1704, the process proceeds to step S1706.

In step S1706, the upper surface/lower surface synthesizing unit 1707 determines whether or not the value of the middle surface PD 1732 is reliable. When it is determined that this value is reliable, the process proceeds to step S1707. In step S1707, the upper surface/lower surface synthesizing unit 1707 reads only the pixel value of the middle surface PD 1732 from the memory unit 1705, and outputs this pixel value.

When it is determined that it is difficult to rely on the output from the middle surface PD 1732 in step S1706, the process proceeds to step S1708.

In step S1708, the upper surface/lower surface synthesizing unit 1707 determines whether or not the value of the lower surface PD 1733 is reliable. When it is determined that this value is reliable, the process proceeds to step S1709. In step S1709, the upper surface/lower surface synthesizing nit 1707 reads only the pixel value of the lower surface PD 1733 from the memory unit 1705, and outputs this pixel value.

When it is determined that it is difficult to rely on the output from the lower surface PD 1733 in step S1708, the process returns to step S1702.

Obviously, there are a lot of possible use examples such as addition reading as well as the foregoing method. By incorporating the imaging element thus constructed into an electronic device, the accuracy in obtaining depth information increases. Needless to say, this method may be used for obtaining the foregoing advantages such as color reproducibility and dynamic range as well as depth information.

Figure 38:
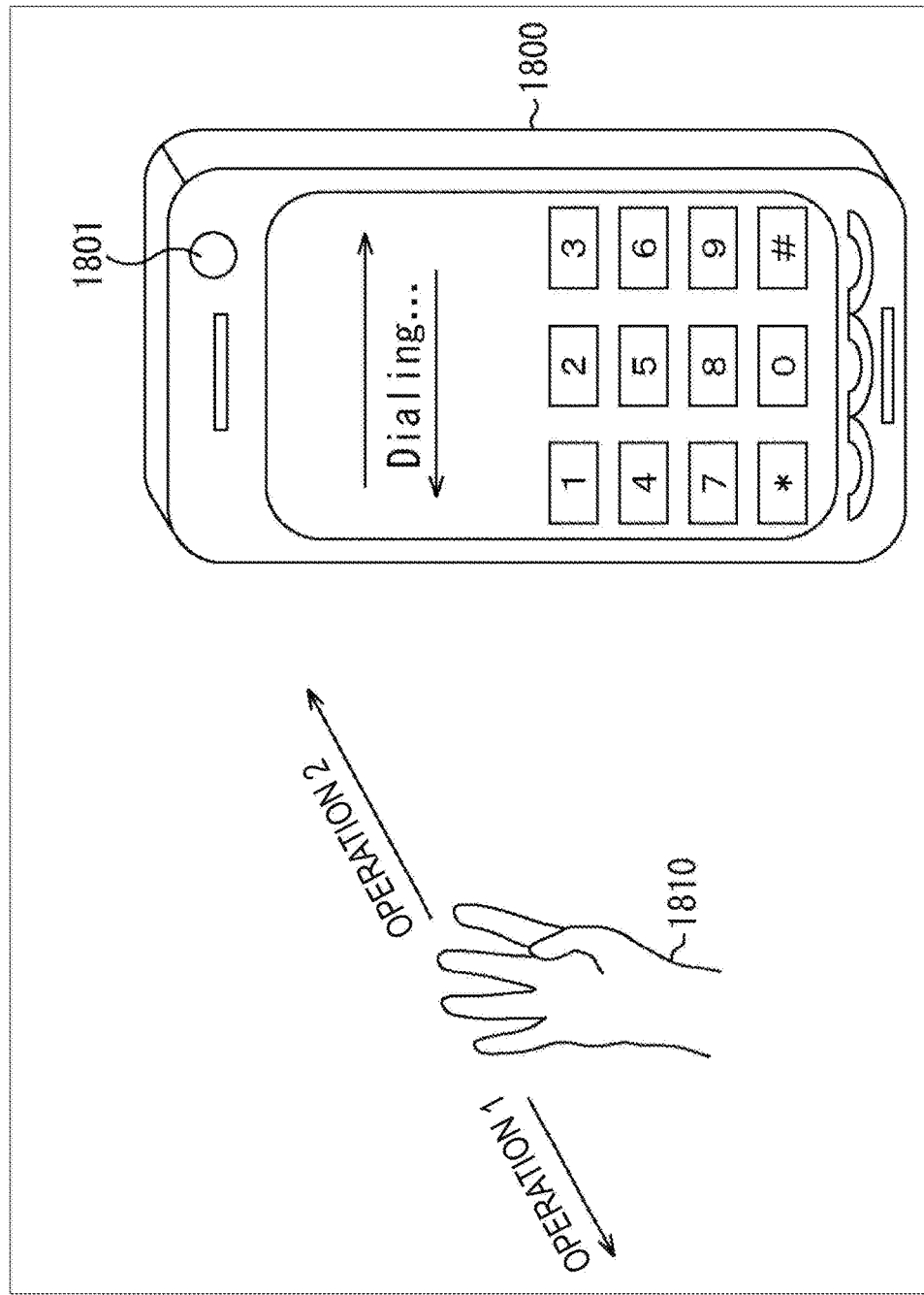
FIG. 38 is a figure illustrating an example of application to a portable communication terminal.
Figure 39:
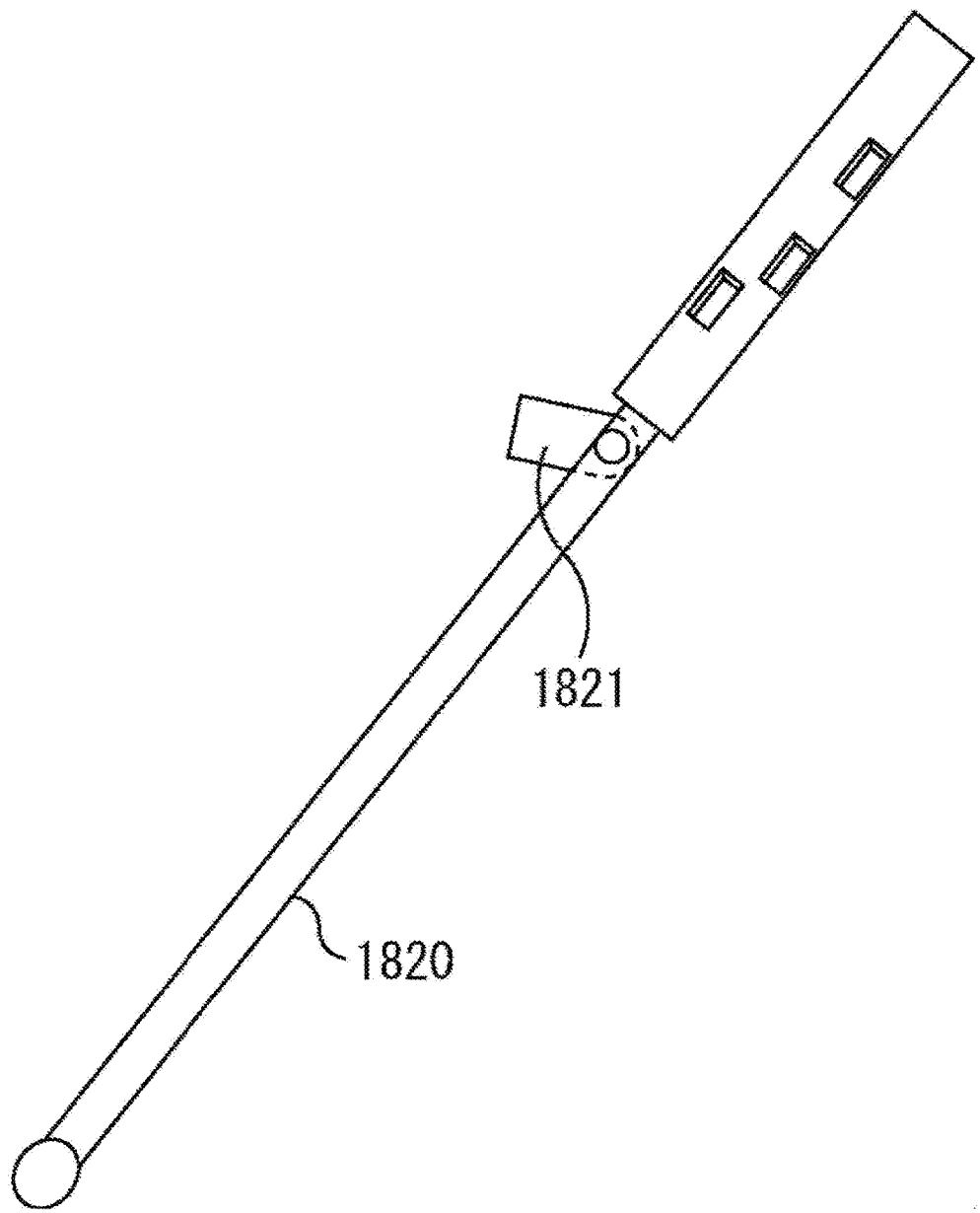
FIG. 39 is a figure illustrating an example of application to an electronic device.
Figure 40:
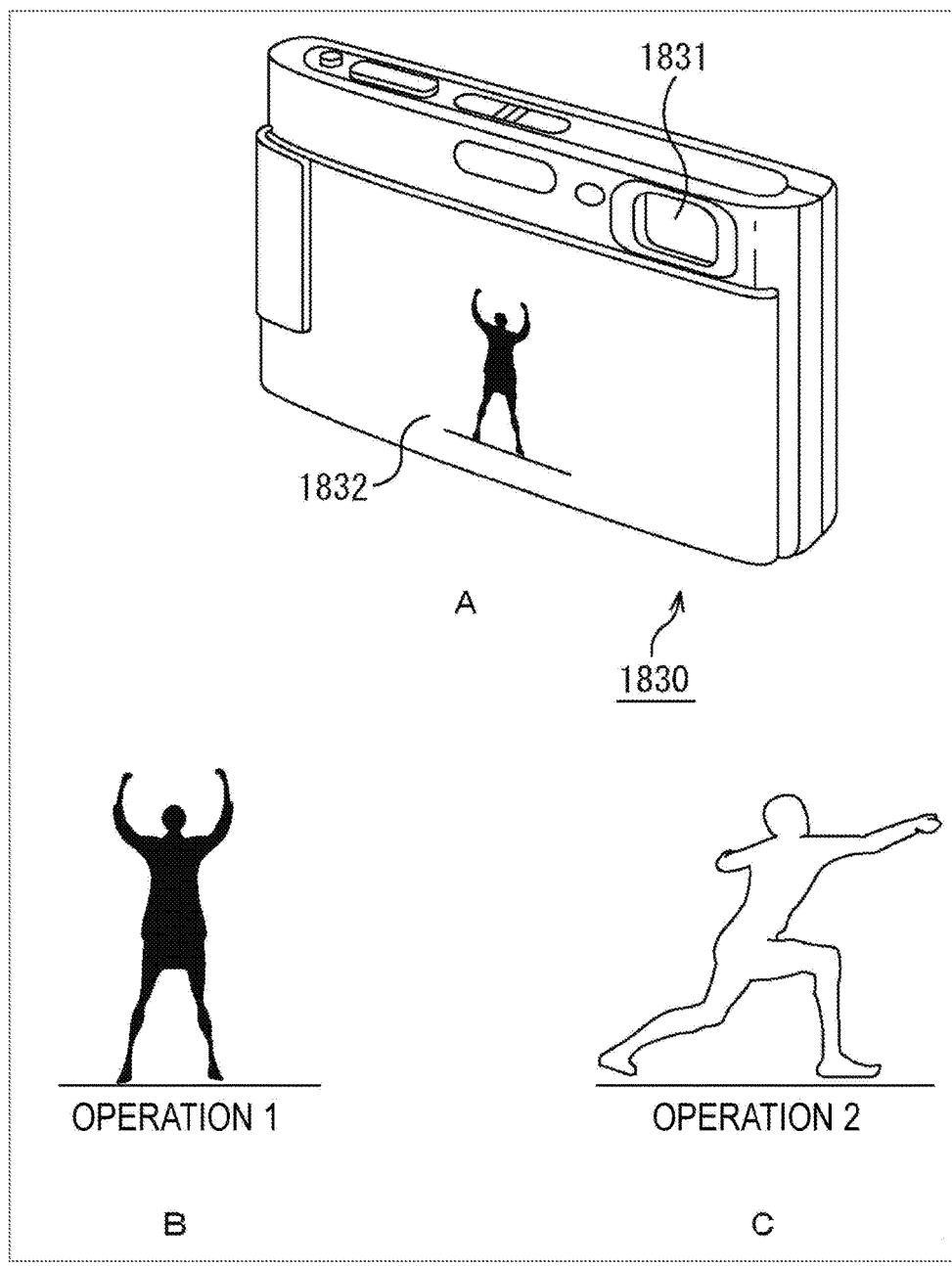
FIG. 40 is a figure illustrating an example of application to an imaging device.
Figure 41:
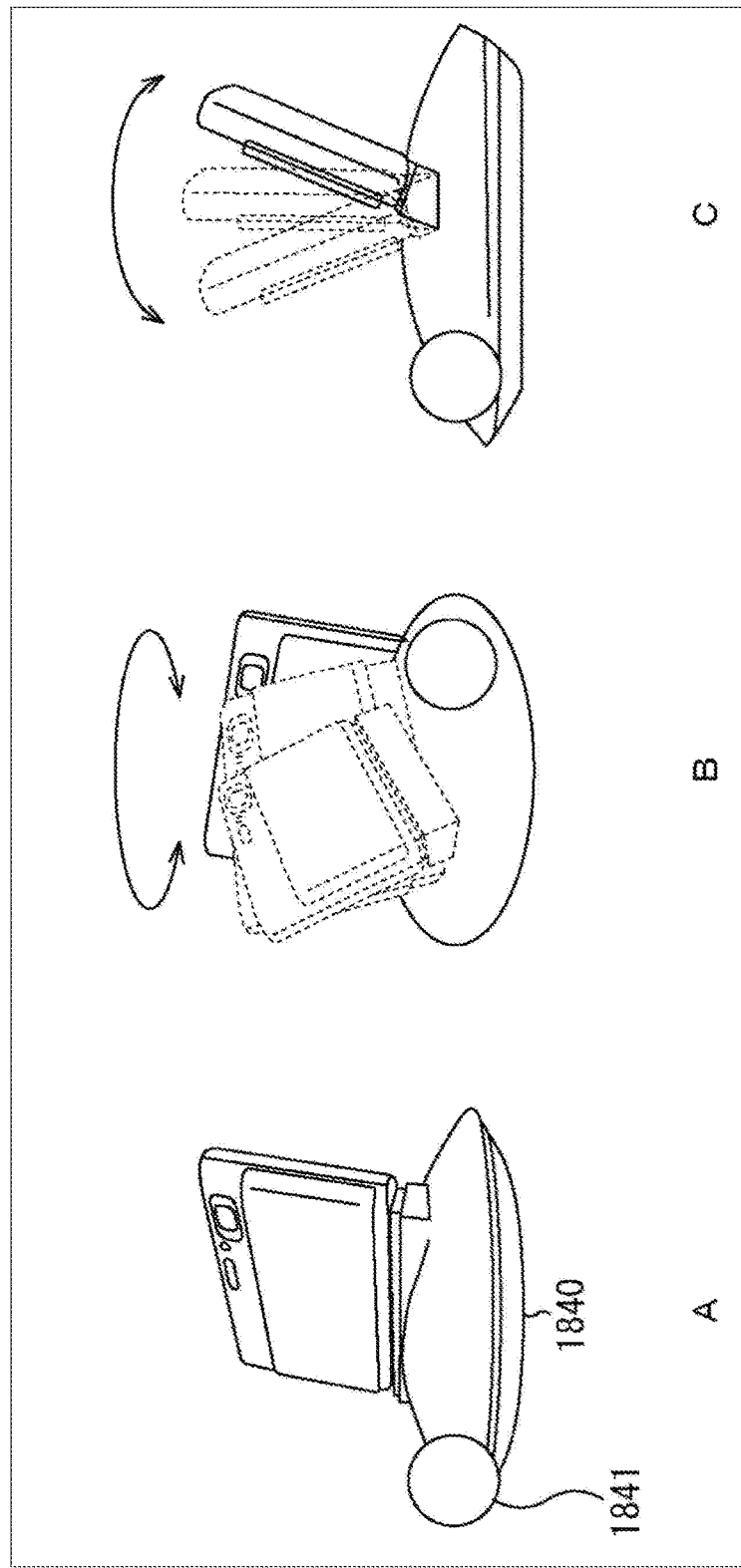
FIG. 41 is a figure illustrating an example of application to an electronic device.

Possible application examples of electronic devices include the foregoing medical equipment, a portable communication terminal (smart phone) 1800 illustrated in FIG. 38, a white cane 1820 illustrated in FIG. 39, a camera 1830 illustrated in FIG. 40, a camera mounting table 1840 illustrated in FIG. 41, a system unit 1860 illustrated in FIG. 28, and other many examples.

Example 12

As discussed above, the imaging element according to the present technology is applicable to the portable communication terminal 1800 illustrated in FIG. 38. For example, a subject is determined by an upper surface RGB based on colors and shades using the structure illustrated in FIG. 36 (for example, whether it is a hand), and depth information is obtained by IR light receiving units of a middle surface and a lower surface of an imaging element 1801. This configuration allows the portable communication terminal 1800 to incorporate individual operation contents performed in accordance with actions, such as raising call volume (during use of phone) when a human body 1810 (such as hand) comes closer, and lowering of call volume when the human body 1810 (such as hand) goes away. In this case, accurate determination can be made by applying IR light appropriate for external light as discussed in Example 11.

Example 13

The imaging element according to the present technology may be incorporated into the white cane 1820 illustrated in FIG. 39 as described in Japanese Patent Application Laid-Open No. 2010-158472 (imaging device 1821). Individual determination of color and depth information based on a captured image obtained from the imaging device 1821 allows instantaneous determination of an object at the foot, and danger by vibration or sound of the cane 1820 can be notified, for example. In this case, accurate determination can be made by applying IR light appropriate for external light as discussed in Example 11. In addition, the imaging element according to the present technology may receive particular infrared wavelength light emitted from braille blocks. In this case, conventional concave-convex type braille blocks may be eliminated.

Example 14

The imaging element according to the present technology may be incorporated into the camera 1830 (electronic device) illustrated in FIG. 40 as discussed above. The camera 1830 in this example includes an imaging unit 1831 and a front display 1832 on the font side with respect to a subject. A display may be provided on the rear side as well.

A self-picture may be taken from a position away from the camera 1830 while checking a self-image displayed on the front display 1832. In this case, zoom-in and zoom-out, for example, may be executed in response to a self-action (or other actions) by incorporating the imaging element according to the present technology. Similarly, as illustrated in A in FIG. 41, the imaging element according to the present technology may be incorporated into a mounting table 1840 connected with the camera 1830. In this case, an action of a subject is similarly detected by an imaging element 1841 provided on the mounting table 1840, and instructions of zoom-in and zoom-out are issued to the camera. Moreover, in addition to instructions to the camera 1830, a movable unit of the mounting table 1840 may be moved in accordance with actions of the subject. For example, the direction of the camera 1830 in the horizontal direction and the vertical direction may be varied in accordance with movement of the movable unit of the mounting table 1840. For example, the camera 1830 may rotate in accordance with movement of the movable unit of the mounting table 1840 as illustrated in B in FIG. 41. Alternatively, the camera 1830 may face up or face down in accordance with movement of the movable unit of the mounting table 1840 as illustrated in C in FIG. 41, for example.

Figure 42:
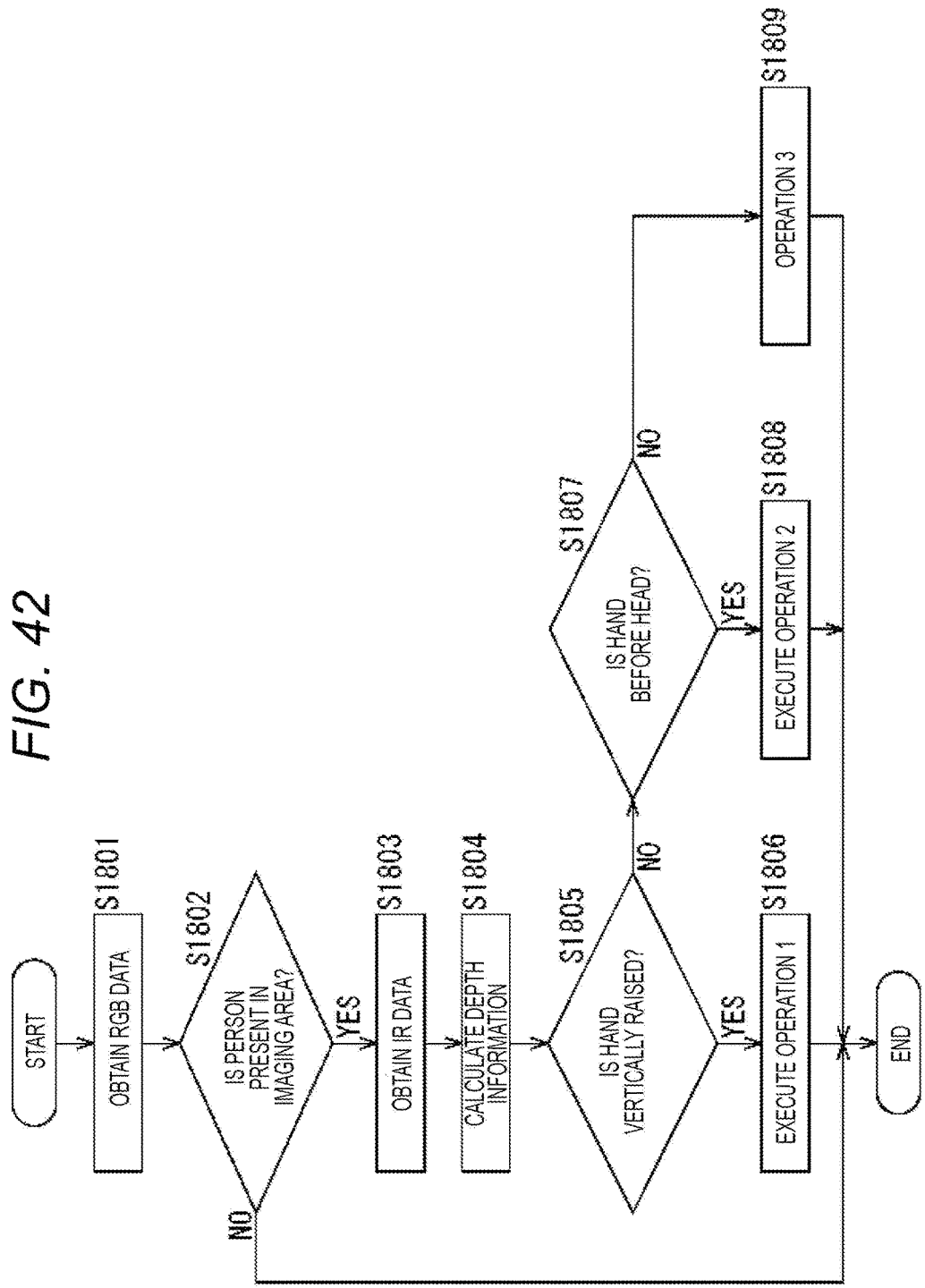
FIG. 42 is a flowchart showing a flow example of a control process.

FIG. 42 shows a flow example of signal processing executed for realizing these. This flow is now described in conjunction with the example shown in FIG. 40.

After the start of the process, the imaging unit 1831 obtains RGB data in step S1801. In step S1802, the imaging unit 1831 determines whether or not a person is present within an imaging area. When a person is present, the process proceeds to step S1803.

In step S1803, the imaging unit 1831 issues an instruction for obtaining IR data (or IR may be simultaneously emitted). In step S1804, the imaging unit 1831 calculates depth information.

In step S1805, the imaging unit 1831 determines whether or not the hand of the person is vertically raised. When it is determined that the hand is vertically raised, the process proceeds to step S1806.

In step S1806, the camera 1830 executes Operation 1 corresponding to the action of vertically rise of the hand.

When it is determined that the hand is not vertically raised, the process proceeds to step S1807.

In step S1807, the imaging unit 1831 determines whether or not the hand is before the face. When it is determined that the hand is positioned before the face, the process proceeds to step S1808.

In step S1808, the camera 1830 executes Operation 2 corresponding to the action of positioning of the hand before the face.

When it is determined that the hand is not positioned before the face, the process proceeds to step S1809.

In step S1809, the camera 1830 executes Operation 3 corresponding to the action of positioning of the hand not before the face.

Operations 1 to 3 are operations such as zoom operation and shutter driving.

Figure 43:
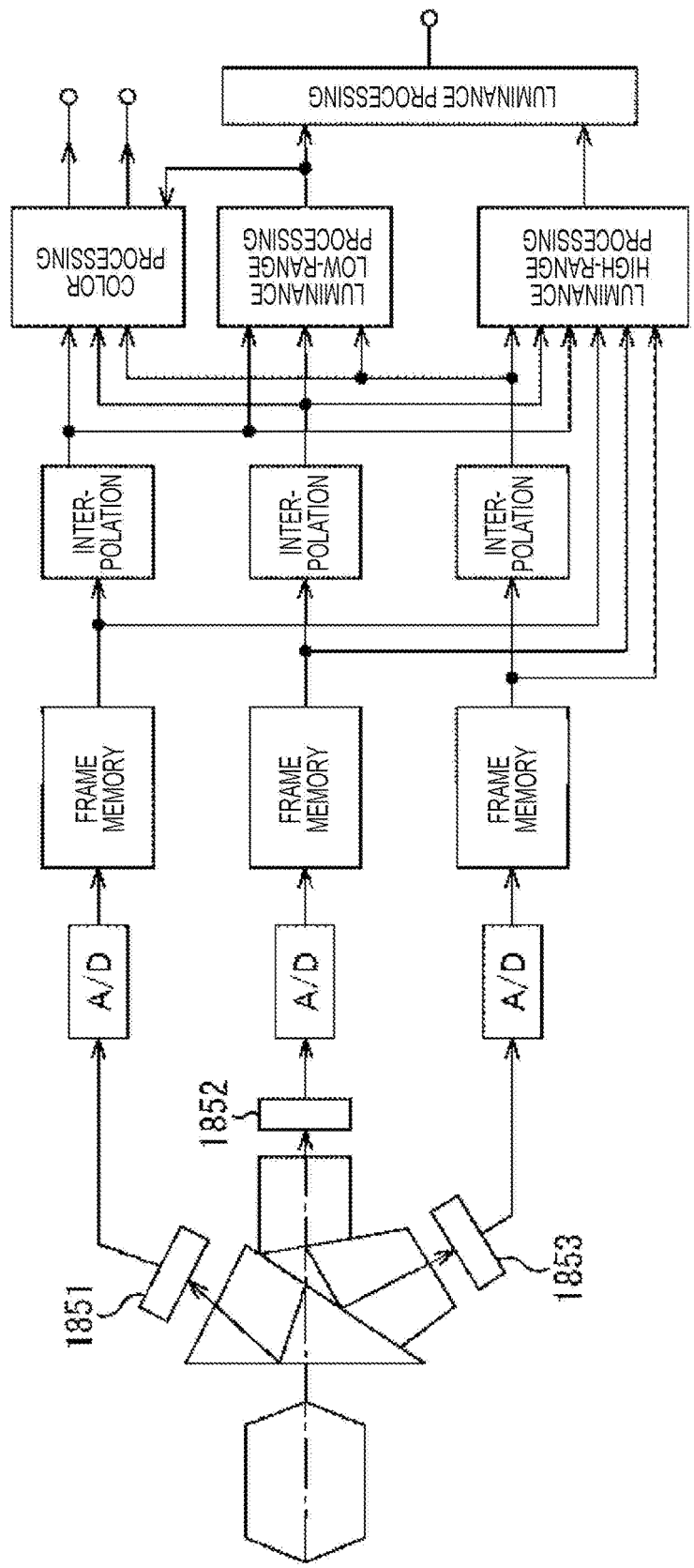
FIG. 43 is a figure illustrating an example of application to an imaging device.

In case of the example illustrated in FIG. 30, the IR cut filter 1683 is inserted at the time of release of a shutter during the foregoing operation. A photodiode on an uppermost surface of the present technology obtains high sensitivity characteristics equivalent to those of rear surface irradiation; therefore, high-quality still images and dynamic pictures are obtained. Obviously, this method may be used for the purpose of HDR, high color reproducibility, and light source estimation accuracy improvement discussed above, for example. In addition, the camera may be of plural-board type such as three-board type illustrated in FIG. 43. In other words, the imaging device illustrated in FIG. 43 includes imaging element 1851 to imaging element 1853 to which the present technology is applied. In this case, light enters the imaging elements after split into R, G, and B in the previous stage; therefore, the color filter is not required for the imaging element 1851 to the imaging element 1853. This method may be used for the purpose of HDR, high color reproducibility, and light source estimation accuracy improvement, for example, as in the above example.

Example 15

Figure 44:
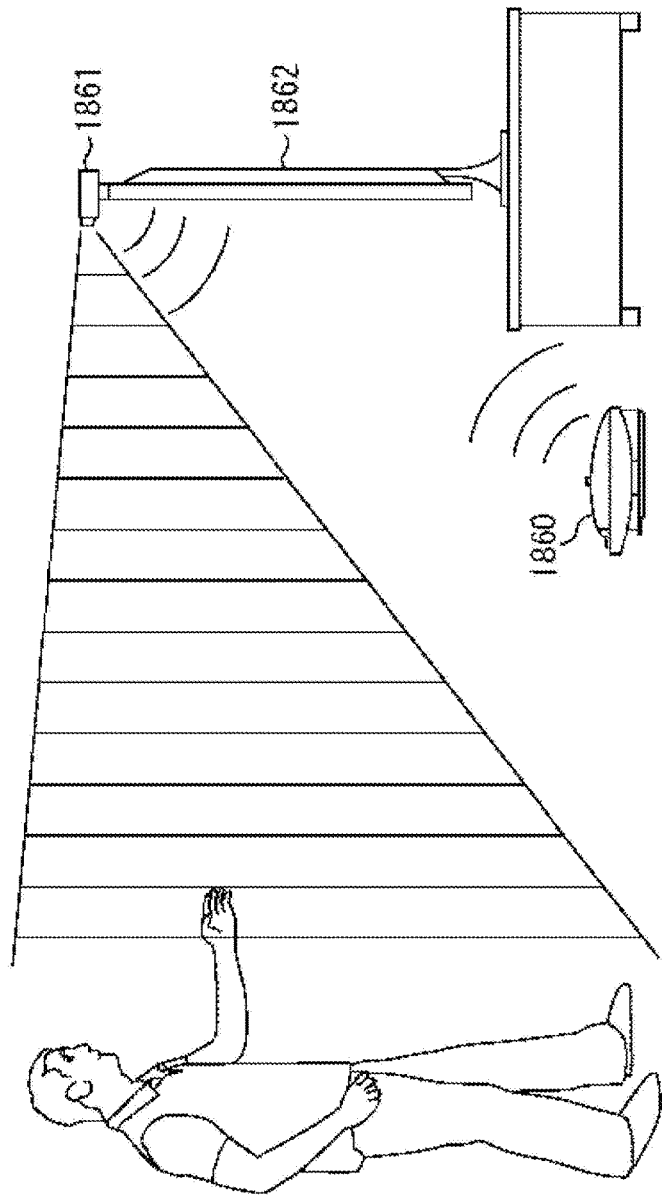
FIG. 44 is a figure illustrating an example of application to an input interface.

The imaging element according to the present technology is applicable to the system unit 1860 (or TV receiver 1862) corresponding to a game console described in JP 2011-507129 W illustrated in FIG. 44 as discussed above. For example, the system unit 1860 receives a particular action as an instruction by determining object, shape, and action of a subject based on an image obtained by a camera 1861, executes processing in correspondence with the instruction, and displays a picture on a display (such as TV receiver 1862) in accordance with the processing result.

By using the imaging element according to the present technology, more accurate depth information is obtained as discussed above. Moreover, data obtaining timing is allowed to increase to substantially double by varying the shutter timing for the upper and lower PDs as discussed in conjunction with FIG. 34. Accordingly, this method is suited for a dynamic subject, and therefore appropriate for a game requiring large motions. Needless to say, data may be read at the same timing, and added values may be used as output. In addition, as discussed in conjunction with the flow in FIG. 37, IR light may be determined based on estimation of the light source environment under which the subject is placed, and which value of the PDs of the upper surface (or middle surface) and the lower surface is to be used may be determined based on obtained data. Highly accurate detection is achievable by these methods.

Figure 45:
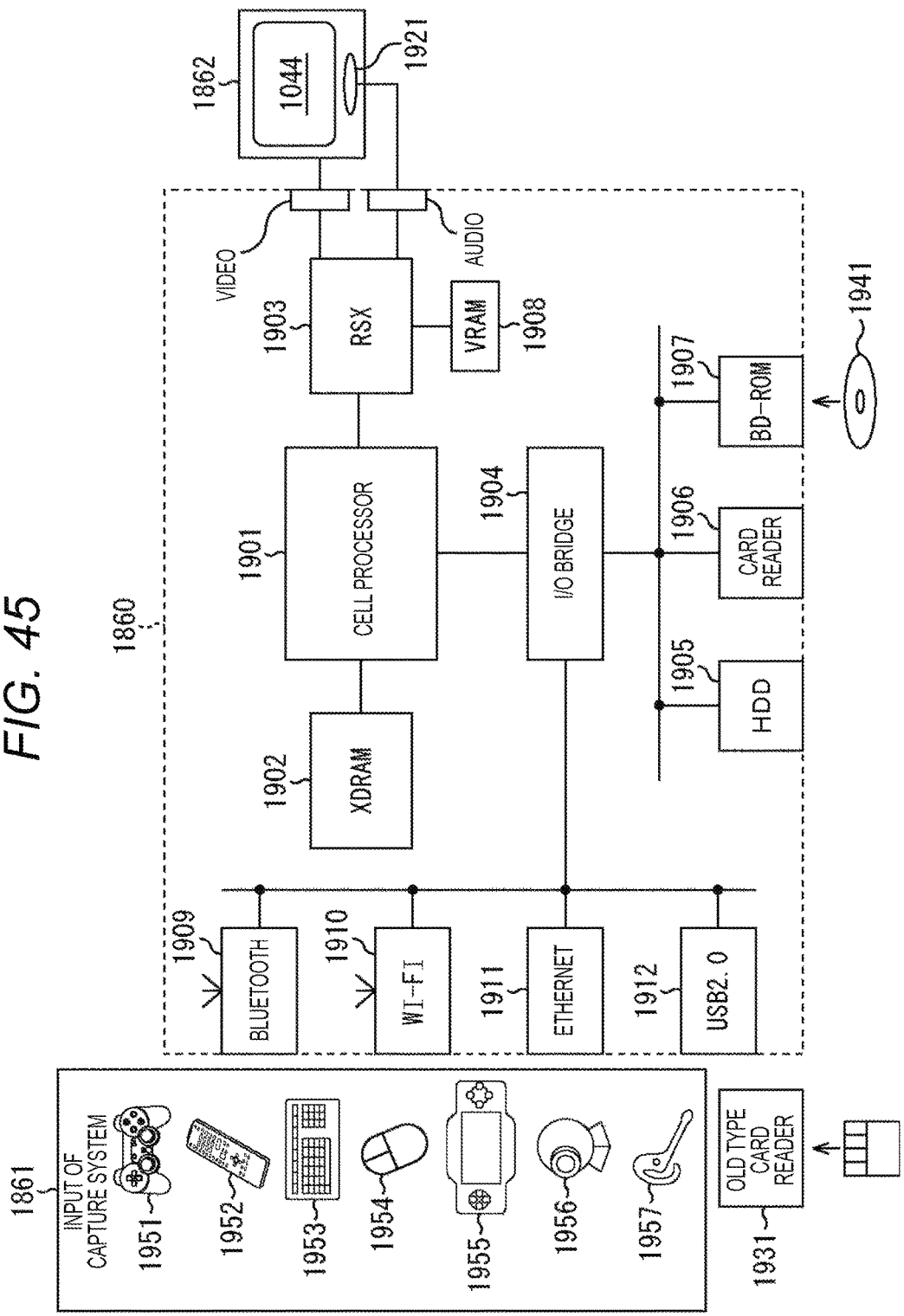
FIG. 45 is a block diagram illustrating an example of application to an electronic device.

FIG. 45 illustrates an example of a block diagram of this type of electronic device.

FIG. 45 schematically illustrates a general system architecture of Sony (registered trademark) PlayStation (registered trademark) 3 entertainment device, as a computer system which allows the use of dynamic three-dimensional object mapping for creating user definition controller according to an example of the present technology. A system unit 1860 is a game console body such as Sony (registered trademark) PlayStation (registered trademark) 3 entertainment device. Various peripheral devices connectable to the system unit 1860 are provided. The system unit 1860 includes a Cell processor 1901, a Rambus (registered trademark) dynamic random access memory (XDRAM) unit 1902, a Reality Synthesizer graphic unit (RSX) 1903 provided with a dedicated video random access memory (VRAM) unit 1908, and an I/O bridge 1904. The system unit 1860 further includes a Blu-ray (registered trademark) disk BD-ROM (registered trademark) optical disk reader 1907 accessible via the I/O bridge 1904 and provided for reading from a disk 1941 and a detachable slot-in hard disk drive (HDD) 1905. The system unit 1860 may further include as an arbitrarily selected component a memory card reader 1906 similarly accessible via the I/O bridge 1904 and provided for reading from a compact flash (registered trademark) memory card, a memory stick (registered trademark) memory card and the like.

The I/O bridge 1904 further connects with six universal serial bus (USB) 2.0 ports 1912, a Gigabit Ethernet (registered trademark) port 1911, IEEE 802.11b/g wireless network (Wi-Fi) port 1910, and a Bluetooth (registered trademark) wireless link port 1909 supporting seven Bluetooth connections at the maximum.

In operation, the I/O bridge 1904 processes data from all the wireless, USB, and Ethernet (registered trademark) including data from one or more game controllers 1951. For example, the I/O bridge 1904 receives data from the game controller 1951 via the Bluetooth link while a user is playing the game, and transfers the received data to the Cell processor 1901 to update the current state of the game as necessary.

In addition, other peripheral devices 1961 may be connected via the respective ports of the wireless, USB, and Ethernet (registered trademark) as well as the game controller 1951. The peripheral devices 1961 include a remote controller 1952, a keyboard 1953, a mouse 1954, a portable entertainment device 1955 such as Sony PlayStation portable (registered trademark) entertainment device, a video camera (unit to which the imaging element of the present technology is applied) such as EyeToy (registered trademark) video camera 1956 (for example, camera 1861 illustrated in FIG. 44), and a microphone head set 1957, for example. Accordingly, these peripheral devices may be connected with the system unit 1860 by wireless communication in principle. For example, the portable entertainment device 1955 may communicate via Wi-Fi ad hoc connection, while the microphone head set 1957 may communicate via Bluetooth link.

By providing these interfaces, the PlayStation 3 device may be compatible with digital video recorder (DVR), set top box, digital camera, portable media player, VoIP telephone, cellular phone, printer, scanner, and other peripheral devices depending on situations.

Furthermore, an old type memory card reader 1931 is connectable with the system unit via the USB port 1912. Thus, a memory card of the type used by PlayStation (registered trademark) device or PlayStation 2 (registered trademark) is allowed to be read.

According to this example, the game controller 1951 is operable for wireless communication with the system unit 1860 via Bluetooth link. Instead, the game controller 1951 may be connected with a USB port so that power for charging a battery of the game controller 1951 is supplied by this connection. The game controller includes at least one analog joystick and conventional control button, and detects shifts of 6 degrees of freedom corresponding to translational motions and rotations in respective axes. Accordingly, a gesture or a shift of a user in addition to a conventional button or joystick, or in place of the conventional button or joystick, may be converted into input to the game. Other peripheral devices supporting wireless communication such as a PlayStation portable device may be used as a controller as an arbitrary selection. In case of the PlayStation portable device, additional game information or control information (such as control instructions or number of lives) may be presented on a screen of the corresponding device. An alternative or auxiliary control device may be used, such as dance mat (not shown), light gun, handle and pedal (not shown), and custom-made controller containing one or plural large buttons for quick answer game (also not shown).

The remote controller 1952 is also operable for wireless communication with the system unit 1860 via Bluetooth link. The remote controller 1952 is equipped with control suited for operation of Blu-ray disk BDROM reader 1907, and for browsing contents of a disk.

The Blu-ray disk BD-Rom reader 1907 is so operable as to read conventional recorded CD, recordable CD, and so-called super audio CD, and further CD-ROM compatible with PlayStation device and PlayStation 2 device. Moreover, the reader 1907 is so operable as to read conventional recorded DVD and recordable DVD, and further DVD-ROM compatible with PlayStation 2 device and PlayStation 3 device. Furthermore, the reader 1907 is so operable as to read conventional recorded Blu-ray disk and recordable Blu-ray disk, and further BD-ROM compatible with PlayStation 3 device.

The system unit 1860 is operable in such a manner as to supply audio and video created or decoded by a PlayStation 3 device via the Reality Synthesizer graphic unit 1903 to an audio output device 1862 (monitor or TV receiver) provided with a display 1921 and one or more speakers 1922 via an audio connector and a video connector. The audio connector contains conventional analog output and digital output, while the video connector may contain outputs of component video, S-video, composite video, and one or more high-quality multimedia interface (HDMI (registered trademark)), and other various components. Accordingly, the format of video output may be PAL or NTSC, or high resolution such as 720p, 1080i, and 1080p, for example.

Audio processing (creation, decoding or the like) is executed by the Cell processor 1901. The operating system of a PlayStation 3 device supports decoding of Dolby (registered trademark) 5.1 surround sound, Dolby (registered trademark) theater surround (DTS), and 7.1 surround sound from a Blu-ray disk.

According to this example, the video camera 1956 includes one imaging element (present technology), an LED indicator, and a hardware-based real time data compressing and encoding device. This configuration allows transmission of compressed video data in a format appropriate for intra-image-based MPEG (motion picture expert group) standards or the like for decoding by the system unit 1860. The LED indicator of the camera is so disposed as to emit light when receiving control data showing disadvantageous illumination conditions from the system unit 1860, for example. An example of the video camera 1956 is connectable with the system unit 1860 via USB, Bluetooth, or Wi-Fi communication port by using various methods.

An example of the video camera includes one or more associated microphones, and thus can transmit audio data. The imaging element (present technology) contained in an example of the video camera may have resolving power appropriate for video capture with high resolution. During use, an image captured by the video camera may be taken into the game, or interpreted as control input for the game.

This block diagram shows the display device 1921 and the system unit 1860 as separate devices. However, a part or all of these functions may be incorporated in the display device. In this case, the size of the display device may be a portable size such as the size of a portable terminal.

As described above, the present technology provides photo diodes capable of providing a plurality of spectra for one pixel, and thus providing output of plural color components. Moreover, the lamination structure may be constituted by three or more layers as well as two layers, in which structure infrared light is receivable highly effectively. Furthermore, the processes for a rear surface irradiation type image sensor are utilized, and therefore the photo diode on the on-chip side (upper surface) is highly sensitive. Also, the photo diodes are separated only by the film thickness of the wiring layer, and, thus, the lower surface photo diode may also be made highly sensitive.

Moreover, formation of an arbitrary substance between the photo diodes is facilitated. For example, a substance having a higher refractive index than that of a peripheral wiring part may be provided to function as a waveguide, thereby realizing high sensitivity of the lower surface photo diode. On the other hand, when control of the wavelength components or the incident light amount is desired, a film absorbing or reflecting a particular wavelength or all wavelengths may be formed. This configuration controls spectrum characteristics of the lower surface photo diode. Needless to say, the spectrum shape may be controlled by adjusting the positions of the photo diodes. Improvement of controllability in these manners can be utilized at the time of individual reading described in the following 3. Furthermore, the upper surface and the lower surface may be added for use in a high sensitivity mode, and, thus, various types of operations for one electronic device are allowed by switching the mode.

The upper surface and the lower surface photo diodes, and the wiring layers and transistors for the photo diodes are individually manufactured until the upper side and the lower side are joined. Accordingly, processes may be optimized for the respective sides. In addition, individual driving is facilitated, and therefore signals may be individually extracted from the upper surface and lower surface photo diodes. Moreover, shutter timing and electrode accumulation time may be individually varied. Accordingly, such advantages are offered, while maintaining high resolution, which achieve improvement of color reproducibility, HDR, light source estimation accuracy improvement, depth information obtaining accuracy improvement, healthcare, pathological diagnosis and the like based on analysis of hemoglobin and others. These technologies are incorporated in electronic devices or medical equipment provided with an imaging element such as camera module, camera, camera for smart phone, endoscope, and capsule endoscope for miniaturization of these devices, or accuracy increase of these devices, or for both.

The present technology offers advantages in case of the conventional structure which generates signals only by the upper surface PD as well as the advantages discussed above. According to a conventional rear surface irradiation type image sensor illustrated in A in FIG. 46, light having passed through the photo diode may reach the wiring layer, and, thus, the light reflected on the wiring layer causes color mixture with the adjoining photo diode. However, the configuration according to the present technology illustrated in B in FIG. 46 guides light to a deeper layer, thereby reducing entrance of light reflected by the upper surface photo diode. Accordingly, this secondary advantage can be offered even when the lower surface photo diode is not driven.

Obviously, the respective devices discussed herein may include configurations other than the aforementioned configurations. In addition, each of the devices may be constituted not only by one device, but also by a system including a plurality of devices.

For allowing execution of a series of the processes discussed herein by software, programs constituting the software are installed via a network or a recording medium.

This recording medium is constituted by a removable medium provided separately from the device body to record programs distributed to deliver the programs to a user. Examples of the removable medium include magnetic disk (including flexible disk), and optical disk (including CD-ROM and DVD). The examples of the removable medium further include magneto-optical disk (including MD (Mini Disc)), semiconductor memory and the like. The recording medium may be constituted not only by the removable medium, but also by a ROM of a control unit, or a hard disk contained in a storing unit, as a unit where programs are recorded, and as a unit distributed to a user while incorporated in the device body in advance.

Programs executed by a computer may be programs where processes are executed in time series in the order described in the present description, or programs where processes are executed in parallel, or at the time of necessity such as at the time of call.

In the present description, the steps for describing programs recorded in the recording medium include, needless to say, processes executed in time series in the order described herein, and further include processes executed in parallel or individually regardless of time series.

In the present description, the system refers to the whole apparatus constituted by a plurality of devices (units).

In the description herein, a configuration discussed as one device (or processing unit) may be constituted by a plurality of devices (or processing units). Conversely, a constitution discussed as plural deices (or processing units) may be collected as one device (or processing unit). Needless to say, configurations other than the configurations discussed herein may be added to the respective devices (or respective processing units). A part of the configuration of a certain device (or processing unit) may be contained in another device (or another processing unit) as long as the configurations and actions of the whole system are substantially equivalent. Accordingly, the examples of the present disclosure are not limited to the examples described herein. Various changes may be made without departing from the subject matters of the present disclosure.

The present technology may include the following configurations.

(1) An imaging element including:
a photoelectric conversion element layer containing a photoelectric conversion element that photoelectrically converts incident light;
a wiring layer formed in the photoelectric conversion element layer on the side opposite to a light entering plane of the incident light, and containing a wire for reading charges from the photoelectric conversion element; and
a support substrate laminated on the photoelectric conversion element layer and the wiring layer, and containing another photoelectric conversion element.

(2) The imaging element according to (1) described above, wherein the photoelectric conversion element of the photoelectric conversion element layer, and the photoelectric conversion element of the support substrate photoelectrically convert components in different wavelength regions of the incident light.

(3) The imaging element according to (2) described above, wherein
the photoelectric conversion element of the photoelectric conversion element layer photoelectrically converts components in a visible light wavelength region, and
the photoelectric conversion element of the support substrate photoelectrically converts components in a near infrared light wavelength region.

(4) The imaging element according to any of (1) to (3) described above, wherein the thickness of the photoelectric conversion element of the photoelectric conversion element layer is different from the thickness of the photoelectric conversion element of the support substrate.

(5) The imaging element according any of (1) to (4) described above, wherein the photoelectric conversion element of the photoelectric conversion element layer and the photoelectric conversion element of the support substrate output charges accumulated by photoelectric conversion of the incident light at the same timing.

(6) The imaging element according to any of (1) to (5) described above, wherein the photoelectric conversion element of the photoelectric conversion element layer and the photoelectric conversion element of the support substrate output charges accumulated by photoelectric conversion of the incident light at different timing.

(7) The imaging element according any of (1) to (6) described above, wherein the photoelectric conversion element of the photoelectric conversion element layer and the photoelectric conversion element of the support substrate output a synthesis image produced by synthesizing an image obtained in the photoelectric conversion element layer and an image obtained in the support substrate by outputting charges accumulated by photoelectric conversion of the incident light.

(8) The imaging element according any of (1) to (7) described above, wherein the charge accumulation time of the photoelectric conversion element of the photoelectric conversion element layer for accumulating charges produced by photoelectric conversion of the incident light is different from the corresponding charge accumulation time of the photoelectric conversion element of the support substrate.

(9) The imaging element according any of (1) to (8) described above, wherein the wire of the wiring layer is disposed in such a position as to secure an optical path of incident light transmitted from one of the sides of the wiring layer to the other side.

(10) The imaging element according to (9) described above, wherein a waveguide formed by material having a larger refractive index than the refractive index of the surroundings is provided on the optical path of the wiring layer.

(11) The imaging element according to (9) or (10) described above, wherein a light absorber is provided on the optical path of the wiring layer.

(12) The imaging element according to any of (1) to (11) described above, wherein the support substrate further includes a wire formed on the side of the photoelectric conversion element of the support substrate opposite to the light entering plane of the incident light for reading charges from the photoelectric conversion element of the support substrate, and an external terminal of the wire of the wiring layer and an external terminal of the wire of the support substrate are connected with each other by a through via.

(13) The imaging element according to any of (1) to (12) described above, wherein, when charges read from the photoelectric conversion element of the photoelectric conversion element layer exceed a predetermined threshold, charges are read from the photoelectric conversion element of the support substrate.

(14) The imaging element according to any of (1) to (13) described above, wherein each of the photoelectric conversion elements includes an organic photoelectric conversion film.

(15) The imaging element according to any of (1) to (14) described above further includes:
a white color filter,
wherein
the photoelectric conversion element of the photoelectric conversion element layer photoelectrically converts a white component of the incident light having passed through the white color filter, and
the photoelectric conversion element of the support substrate photoelectrically converts other color components.

(16) The imaging element according to any of (1) to (15) described above, wherein depth information showing a depth to a target is obtained using infrared light photoelectrically converted by the photoelectric conversion elements.

(17) The imaging element according to any of (1) to (16) described above, wherein it is controlled whether data on the incident light photoelectrically converted by the photoelectric conversion element of the photoelectric conversion element layer and the photoelectric conversion element of the support substrate is individually output or output after addition of the data.

(18) The imaging element according to any of (1) to (17) described above, wherein the support substrate includes:
a photoelectric conversion element layer containing the photoelectric conversion element of the support substrate,
a wiring layer formed in the photoelectric conversion element layer of the support substrate on the side opposite to a light entering plane of the incident light, and containing a wire for reading charges from the photoelectric conversion element of the support substrate, and
a support substrate laminated on the photoelectric conversion element layer and the wiring layer, and containing another photoelectric conversion element.

(19) An electronic device including:
an imaging element that images a subject and includes
a photoelectric conversion element layer containing a photoelectric conversion element that photoelectrically converts incident light,
a wiring layer formed in the photoelectric conversion element layer on the side opposite to a light entering plane of the incident light, and containing a wire for reading charges from the photoelectric conversion element, and
a support substrate laminated on the photoelectric conversion element layer and the wiring layer, and containing another photoelectric conversion element; and
an image processing unit that executes image processing using signals generated by the photoelectric conversion elements of the imaging element.

(20) An information processing device including:
an imaging element that includes:
a photoelectric conversion element layer containing a photoelectric conversion element that photoelectrically converts incident light,
a wiring layer formed in the photoelectric conversion element layer on the side opposite to a light entering plane of the incident light, and containing a wire for reading charges from the photoelectric conversion element, and
a support substrate laminated on the photoelectric conversion element layer and the wiring layer, and containing another photoelectric conversion element; and
a signal processing unit that executes analysis using signals in a plurality of wavelength bands generated by the photoelectric conversion elements of the imaging element.

REFERENCE SIGNS LIST

100 CMOS image sensor
111 Condensing lens
112 Color filter
113 Insulation film
114 Semiconductor substrate
115 Photo diode
116 Wiring layer
117 Wire
118 Wire inlayer film
119 Passivation film
120 Wiring layer
121 Wire
122 Wire inlayer film
123 Semiconductor substrate
124 Photo diode
125 Support substrate
131 TSV
200 Manufacturing device
201 Control unit
202 Rear surface irradiation type image sensor manufacturing unit
203 Front surface irradiation type image sensor manufacturing unit
204 Assembling unit
251 Waveguide
351 Photo diode
360 Semiconductor substrate
361 Photo diode
400 CMOS image sensor
411 Semiconductor substrate
412 Photo diode
413 Wiring layer
600 Imaging device, CMOS image sensor
1002 Support substrate
1021 Photo diode
1031 Photo diode
1200 Manufacturing device
1300 Manufacturing device
1400 CMOS image sensor
1600 Imaging device
1700 Imaging device

The invention claimed is:

1. An image sensor, comprising:
a first semiconductor substrate, wherein the first semiconductor substrate has a first surface and a second surface;
a first photoelectric conversion element formed in the first semiconductor substrate;
a first wiring layer adjacent the second surface of the first semiconductor substrate;
a second semiconductor substrate, wherein the second semiconductor substrate has a first surface and a second surface, wherein the first surface of the second semiconductor substrate is adjacent the first wiring layer, and wherein the first wiring layer is between the first semiconductor substrate and the second semiconductor substrate;
a second photoelectric conversion element formed in the second semiconductor substrate.

2. The image sensor of claim 1, wherein the first photoelectric conversion element is sensitive to light within a first wavelength region, and wherein the second photoelectric conversion element is sensitive to light within a second wavelength region.

3. The image sensor of claim 2, wherein the first wavelength region includes light having a wavelength that is shorter than light within the second wavelength region.

4. The image sensor of claim 2, wherein the first wavelength region is a visible light wavelength region, and wherein the second wavelength region is a near infrared light region.

5. The image sensor of claim 2, wherein the first wavelength region is a visible light short wavelength region, and wherein the second wavelength region is a visible light long wavelength region.

6. The image sensor of claim 2, further comprising:
a second wiring layer, wherein the second semiconductor substrate is between the first wiring layer and the second wiring layer.

7. The image sensor of claim 6, wherein the first semiconductor substrate and the first wiring layer form a first rear surface irradiation type complementary metal-oxide semiconductor (CMOS) image sensor, and wherein the second semiconductor substrate and the second wiring layer form a second rear surface irradiation type CMOS image sensor.

8. The image sensor of claim 7, wherein the first rear surface irradiation type CMOS image sensor is overlapped with the second rear surface irradiation type CMOS image sensor.

9. The image sensor of claim 8, further comprising a passivation film, wherein the passivation film is between the first wiring layer and the second semiconductor substrate.

10. The image sensor of claim 6, further comprising:
a plurality of first photoelectric conversion elements; and
a plurality of second photoelectric conversion elements, wherein each photoelectric conversion element in the plurality of second photoelectric conversion elements is overlapped by a corresponding one of the photoelectric conversion elements in the plurality of first photoelectric conversion elements.

11. The image sensor of claim 10, further comprising:
a plurality of color filters adjacent the first surface of the first semiconductor substrate.

12. The image sensor of claim 11, wherein each photoelectric conversion element in the plurality of first photoelectric conversion elements is associated with a corresponding one of the color filters.

13. The image sensor of claim 12, further comprising:
a plurality of condensing lenses.

14. The image sensor of claim 13, wherein each color filter in the plurality of color filters is associated with a corresponding one of the condensing lenses.

15. The image sensor of claim 6, further comprising:
a pad in the second wiring layer, wherein the pad in the second wiring layer corresponds to an external terminal in an area out of an effective pixel area.

16. The image sensor of claim 15, further comprising:
a pad in the first wiring layer, wherein the pad in the first wiring layer is electrically connected to the pad in the second layer via a through silicon via.

17. The image sensor of claim 6, wherein the first wiring layer contains a plurality of wire layers.

18. The image sensor of claim 17, wherein the second wiring layer contains a plurality of wire layers.

19. The image sensor of claim 6, wherein the first photoelectric conversion element and the second photoelectric conversion element output a synthesis image.

20. An electronic device, comprising:
an image sensor, including:
a first semiconductor substrate, wherein the first semiconductor substrate has a first surface and a second surface;
a first photoelectric conversion element formed in the first semiconductor substrate;
a first wiring layer adjacent the second surface of the first semiconductor substrate;
a second semiconductor substrate, wherein the second semiconductor substrate has a first surface and a second surface, wherein the first surface of the second semiconductor substrate is adjacent the first wiring layer, and wherein the first wiring layer is between the first semiconductor substrate and the second semiconductor substrate;
a second photoelectric conversion element formed in the second semiconductor substrate;
an image processing unit that executes image processing using signals generated by the first and second photoelectric conversion elements.

* * * * *